(12) United States Patent
Watanabe et al.

(10) Patent No.: US 7,391,095 B2
(45) Date of Patent: Jun. 24, 2008

(54) SEMICONDUCTOR DEVICE

(75) Inventors: Tetsuya Watanabe, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/555,923

(22) Filed: Nov. 2, 2006

(65) Prior Publication Data

US 2007/0111409 A1    May 17, 2007

(30) Foreign Application Priority Data

Nov. 15, 2005    (JP) .............................. 2005-329789

(51) Int. Cl.
*H01L 29/06* (2006.01)
*H01L 27/12* (2006.01)

(52) U.S. Cl. .................. 257/506; 257/347; 257/547; 257/E29.02; 257/501; 257/E27.112; 257/E29.018

(58) Field of Classification Search ................ 257/506, 257/347, 547, E29.02, E27.112, E29.018, 257/501
See application file for complete search history.

(56) References Cited

U.S. PATENT DOCUMENTS

| | | | | |
|---|---|---|---|---|
| 6,624,021 B2 * | 9/2003 | Noble | ......................... | 438/253 |
| 6,858,504 B2 * | 2/2005 | Noble | ......................... | 438/300 |
| 7,190,050 B2 * | 3/2007 | King et al. | ................... | 257/622 |
| 7,247,887 B2 * | 7/2007 | King et al. | ................... | 257/139 |
| 7,265,008 B2 * | 9/2007 | King et al. | ................... | 438/197 |
| 2004/0238919 A1 * | 12/2004 | Brintzinger et al. | ......... | 257/530 |

OTHER PUBLICATIONS

Yuuichi Hirano, et al., "Bulk-Layout-Compatible 0.18-μm SOI-CMOS Technology Using Body-Tied Partial—Trench-Isolation (PTI)", IEEE Transactions on Electron Devices, vol. 48, No. 12, Dec. 2001, pp. 2816-2822.
Kerry Bernstein, et al., "SOI Circuit Design Concepts", Kluwer Academic Publishers, cover page and pp. 22-23.

* cited by examiner

*Primary Examiner*—Evan Pert
*Assistant Examiner*—Victor A. Mandala, Jr.
(74) *Attorney, Agent, or Firm*—Oblon, Spivak, McClelland, Maier & Neustadt, P.C.

(57) ABSTRACT

In a PMOS transistor, the source-drain region is divided into four parts along the gate width and has an arrangement of four independent source regions and an arrangement of four independent drain regions. A partial trench isolation insulating film is arranged in contact with the whole of the opposed surfaces between the four source regions in such a manner that the channel region formed under the gate electrode is divided across the channel length. A body-tied region containing N-type impurities relatively high in concentration is arranged in contact with the side surface of the source region opposite to the gate electrode, and the potential of the body region is fixed through the well region from the body-tied region.

19 Claims, 99 Drawing Sheets

F I G . 2
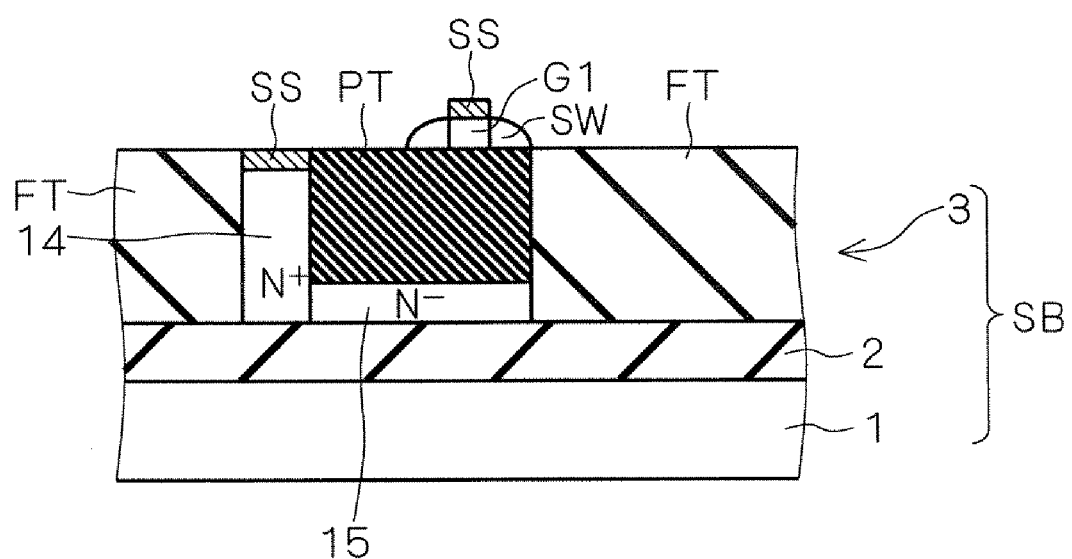

F I G . 5
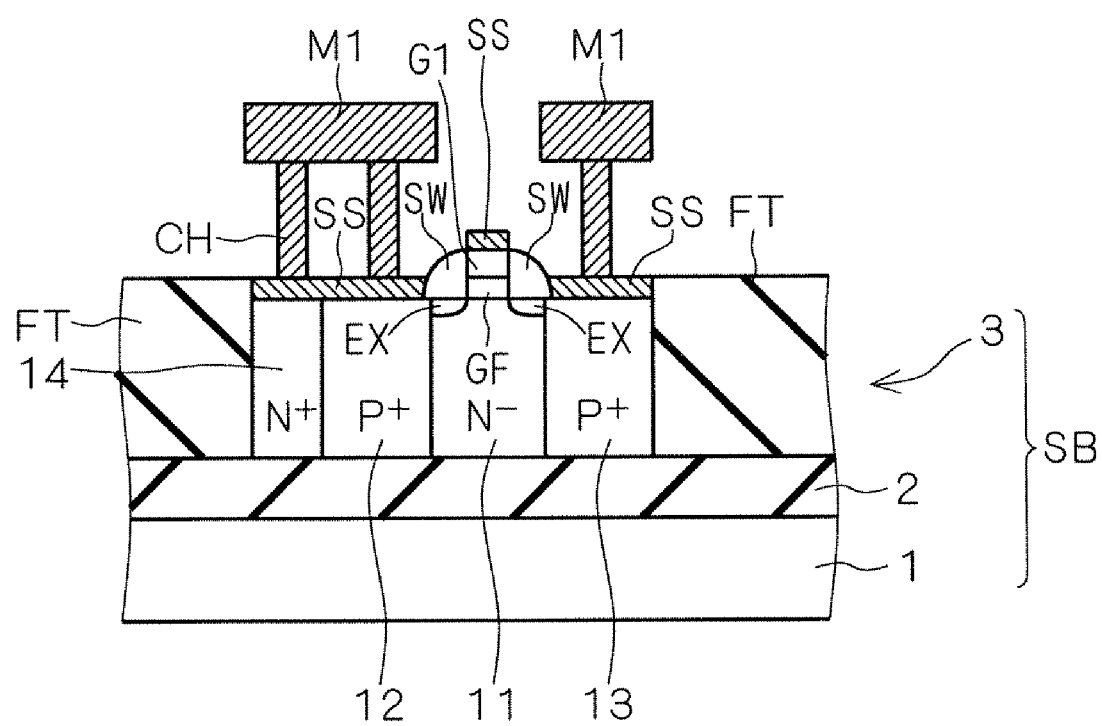

FIG. 38
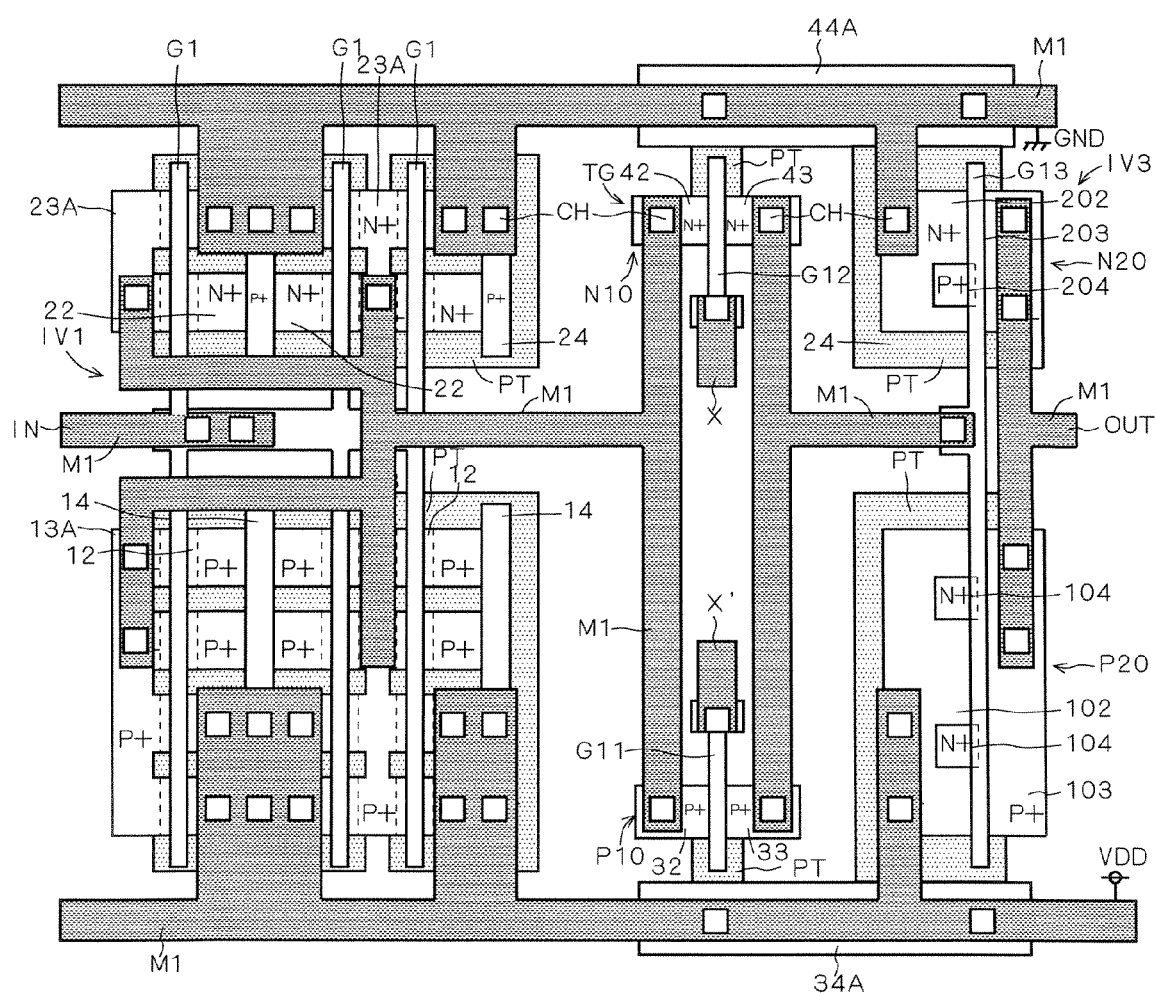
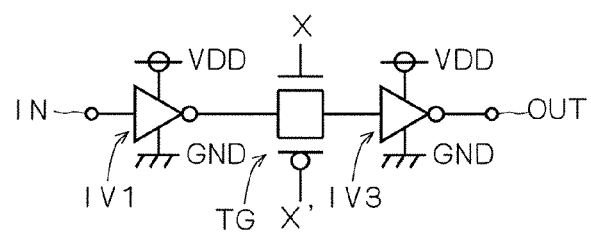

F I G . 6 9
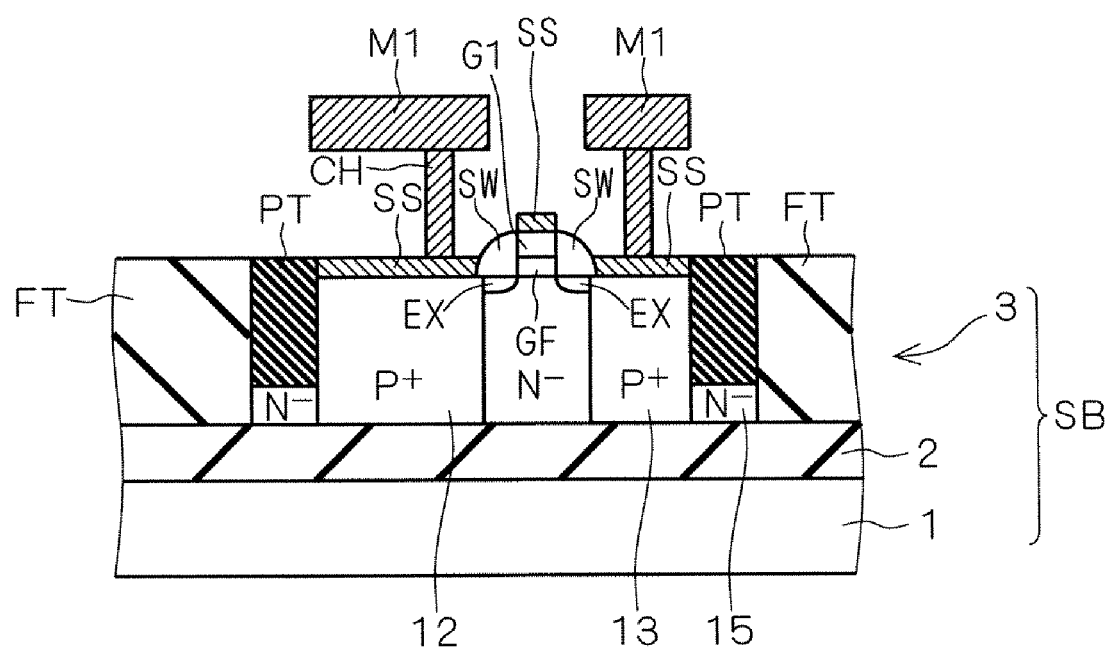

F I G . 9 1
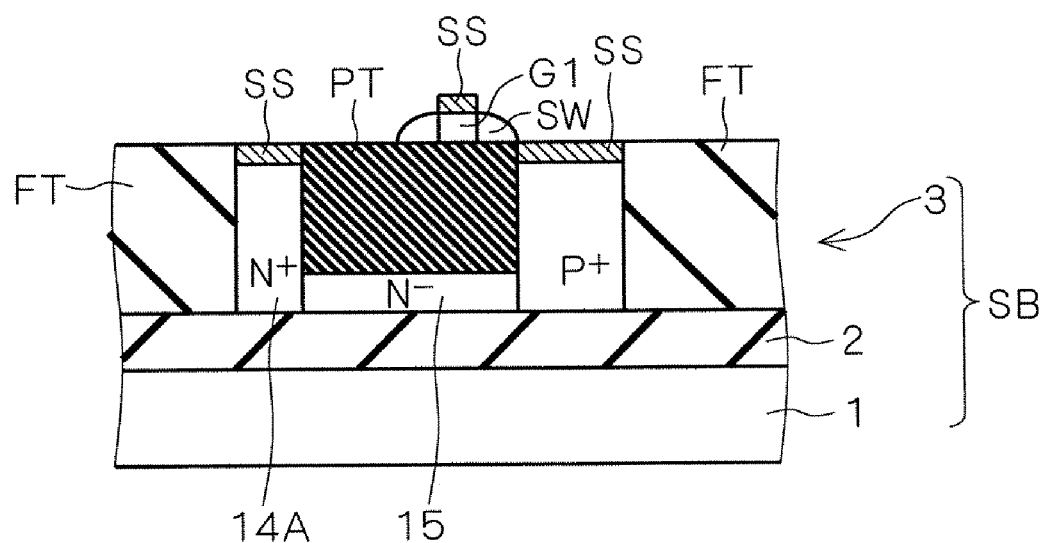

SEMICONDUCTOR DEVICE

BACKGROUND OF THE INVENTION

1. Field of the Invention

This invention relates to a semiconductor device, or in particular to a semiconductor device having a partial trench isolation structure.

2. Description of the Background Art

A semiconductor device of a SOI (silicon on insulator) structure (hereinafter referred to as the SOI device) in which a buried oxide film and a SOI layer are formed on a silicon substrate finds applications as portable devices due to the feature that the parasitic capacitance can be reduced and the operation is fast and stable with a low power consumption.

An example of the SOI device has a full trench isolation (FTI) structure in which a trench reaching a buried oxide film is formed in the surface of a SOI layer and an insulating material is buried in the trench. The full trench isolation insulating film thus formed is used to isolate elements electrically.

Various problems are caused, however, by the substrate floating effect in which carriers (holes for NMOS) generated by the impact ionization stay in the body region including the channel forming region, with the result that a kink is generated, the operation withstanding voltage is reduced or the unstable potential of the body region causes the frequency dependence of the delay time.

In view of this, the partial trench isolation (PTI) structure has been conceived, as disclosed in Yuuichi Hirano et al., "Bulk-Layout-Compatible 0.18-μm SOI-CMOS Technology Using Body-Tied Partial-Trench-Isolation (PTI)", "IEEE TRANSACTION ON ELECTRON DEVICES. vol. 48, No. 12, DECEMBER 2001, pp. 2816-2822": Non-Patent Document 1), in which a trench is formed in the surface of the SOI layer in such a manner as to leave a SOI layer of a predetermined thickness between the trench bottom portion and the buried oxide film, and which has a partial trench isolation insulating film formed by burying an insulating material in the trench.

By employing the PTI structure, carriers can be moved through the well region under the partial trench isolation insulating film, the carriers are prevented from staying in the body region, and the potential of the body region can be fixed through the well region. Thus, the various problems which otherwise might be caused by the substrate floating effect are not posed.

In the case where the PTI structure is employed, a high-concentration impurities region of the same conduction type as the body region is formed as a body-tied region in the surface of the SOI layer outside the ends of the gate electrode along the gate width, and this body-tied region is electrically connected to an overlying wiring layer thereby to fix the potential of the body region.

In the semiconductor device not using the PTI structure, on the other hand, the use of the T-shaped gate electrode or the source-tied gate electrode as shown in Kerry Bernstein and Norman J. Rohrer, "SOI CIRCUIT DESIGN CONCEPTS", Kluwer Academic Publishers, pp. 22-23 (Non-Patent Document 2)" has been proposed to fix the potential of the body region.

Specifically, FIG. 2.8(a) of Non-Patent Document 2 shows a configuration in which the gate electrode is in the shape of T and the portion corresponding to the leg of T functions substantially as a gate while the portion corresponding to the head of T extends to completely cover the short sides of the source region and the drain region with a body contact region formed outside the head of T. The body contact region contains high-concentration impurities of the same conduction type as the body region.

Also, FIG. 2.8(b) of Non-Patent Document 2 shows the gate electrode of what is called the source-tied type in which a protrusion is formed toward the source region from the neighborhood of the central portion along the gate width of the gate electrode, and a high-concentration impurities region having a different conduction type from the source region is formed in the surface of the source region under the protrusion.

With the size reduction of the semiconductor device, the gate length is also shortened. In the T-shaped gate electrode, however, the potential is fixed at one end of the gate electrode, and therefore, the gate length is shortened. In the case where the gate width is very large, in contrast, the resistance value of the body region is increased and the potential of the body region cannot be sufficiently fixed, thereby giving rise to the likelihood of generating a kink or reducing the operation withstanding voltage.

Also, in the case of the T-shaped gate electrode, the lower part of the head of T constitutes the same impurities region as the body region. Since a gate insulating film exists between the impurities region and the head of T, however, the unrequired capacitance component exists there and may affect the operation of the transistor.

In the source-tied gate electrode having a very long gate width as compared with the gate length, on the other hand, an increased number of protrusions toward the source region is equivalent to the division of the gate electrode into a plurality of parts, thereby making it possible to fix the potential of the body region for each of the short gate electrodes.

In forming a high-concentration impurities region in the surface of the source region under the protrusion, however, impurities are introduced by ion implantation. Due to the displacement attributable to the precision of the implantation mask, therefore, the position of the high-concentration impurities region under the protrusion and the potential fixed position are varied, thereby substantially resulting in the variation of the length of each of a plurality of divided gate electrodes. This may cause the variation of the operation characteristics of the transistor.

As explained above, the gate length is shortened with the size reduction of the semiconductor device, and in the case where the gate width is very large as compared with the gate length, the potential of the body region fails to be sufficiently fixed, resulting in the likelihood of a kink or reduction in the operation withstanding voltage. This problem cannot be obviated by the T-shaped gate electrode or the source-tied electrode.

SUMMARY OF THE INVENTION

These and other objects, features, aspects and advantages of the present invention will become more apparent from the following detailed description of the present invention when taken in conjunction with the accompanying drawings.

According to the present invention, there is provided a semiconductor device comprising a MOS transistor formed on a SOI layer of a SOI substrate, wherein the MOS transistor includes:

a gate electrode formed on the SOI film through a gate insulating film; first and second semiconductor regions formed in a surface of the SOI layer outside each of the side surfaces of the gate electrode along the gate length; a first partial trench isolation insulating film for dividing the first semiconductor region into a plurality of parts along the gate width by crossing, along a gate length, a channel region formed in the surface of the SOI layer under the gate electrode while at the same time crossing the first semiconductor region along the gate length; and a third semiconductor region formed in contact with a side surface of the first partial trench isolation insulating film opposite to the gate electrode to reach a buried oxide film from the surface of the SOI layer in the first semiconductor region; wherein the first partial trench isolation insulating film has a well region as an underlying layer containing the impurities of the conduction type opposite to that of the first semiconductor region, and wherein the third semiconductor region is of the same conduction type as and in contact with the well region.

As described above, the first semiconductor region is divided into a plurality of parts along the gate width across the gate length by the first partial trench isolation insulating film. Therefore, the gate electrode of the MOS transistor is substantially divided into a plurality of parts. Each of the gate electrode divisions has a third semiconductor region arranged in contact with the side surface of the first partial trench isolation insulating film far from the gate electrode and reaching the buried oxide film from the surface of the SOI layer in the first semiconductor region. Thus, the potential of the body region underlying the gate electrode is fixed through the well region under the first partial trench isolation insulating film from the third semiconductor region formed in the first semiconductor region. As a result, the potential of the body region of the MOS transistor can be positively fixed and the generation of a kink can be suppressed. Also, since the gate electrode of the MOS transistor is substantially divided, the operation withstanding voltage can be improved. Further, since a mask high in machining precision is used to form the partial trench isolation insulating film, the gate electrode can be accurately divided based on the design value, so that the gate width is prevented from being varied and so is the operation characteristics of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 5 are sectional views for explaining a configuration of a semiconductor device according to the first embodiment of the invention.

FIG. 38 is a plan view for explaining the configuration of a third application of the semiconductor device according to the fourth embodiment of the invention.

FIGS. 66 to 69 are sectional views for explaining the configuration of the first modification of the semiconductor device according to the sixth embodiment of the invention.

FIGS. 91 to 94 are sectional views for explaining the configuration of the second modification of the semiconductor device according to the seventh embodiment of the invention.

DESCRIPTION OF THE PREFERRED EMBODIMENTS

A. First Embodiment

A-1. Device Configuration

The configuration of a semiconductor device 100 according to a first embodiment of the invention is explained with reference to FIGS. 1 to 5.

Figure 1:
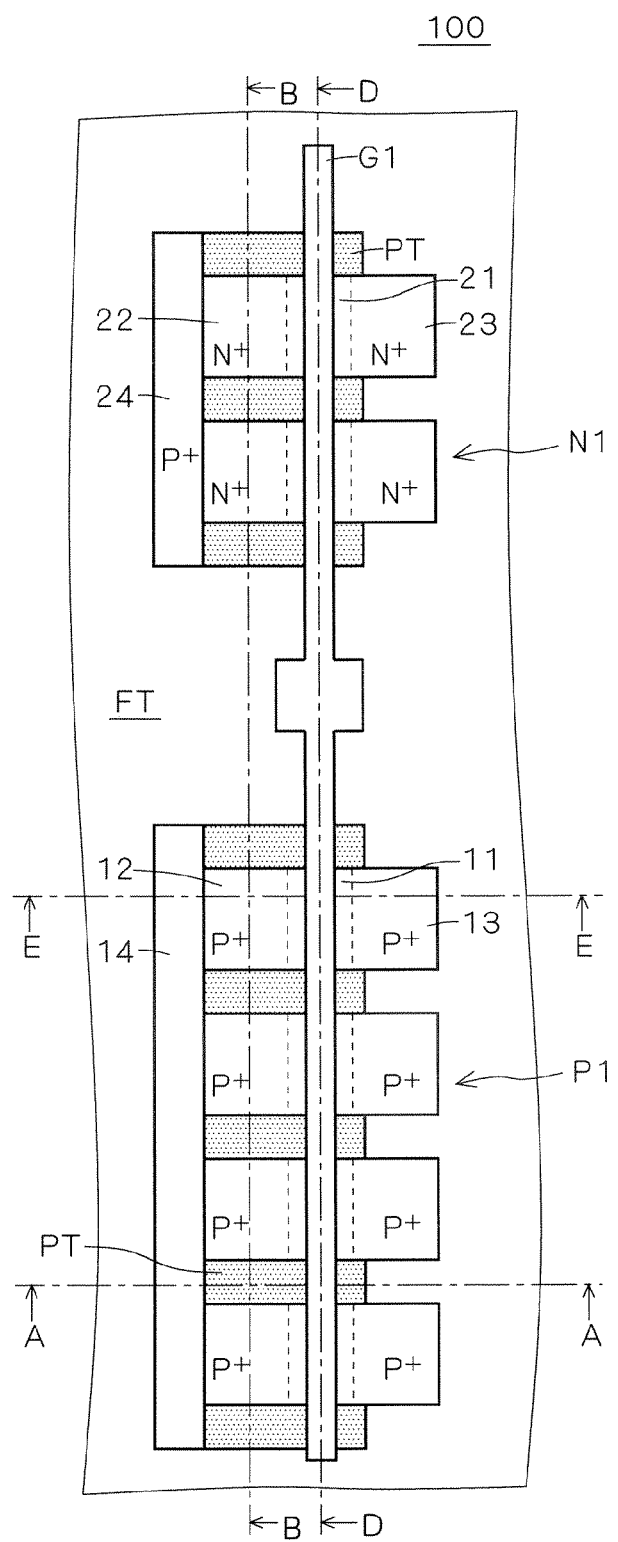
FIG. 1 is a plan view for explaining a configuration of a semiconductor device according to a first embodiment of the invention.

FIG. 1 is a plan view showing the configuration of the semiconductor device 100. The sectional views taken in lines A-A, B-B, D-D and E-E in FIG. 1 are shown in FIGS. 2, 3, 4 and 5, respectively.

As shown in FIG. 1, the semiconductor device 100 includes a P-channel MOS transistor (PMOS transistor) P1 and an N-channel MOS transistor (NMOS transistor) N1, which are connected to a common gate electrode G1.

In the PMOS transistor P1, the source-drain region is divided into four parts along the gate width including an arrangement of four independent source regions 12 and an arrangement of four independent drain regions 13.

A partial trench isolation insulating film PT is formed in contact with the whole of the opposed side surfaces between each adjacent ones of the four source regions 12, and a partial trench isolation insulating film PT is also formed outside the source region 12 provided at each end of the arrangement. The partial trench isolation insulating films (first partial trench isolation insulating films) PT are arranged in such a manner as to divide the channel region under the gate G1 into parts across the channel length. The partial trench isolation insulating film for dividing the source region, the drain region and the channel region from each other is sometimes referred to as the dividing partial trench isolation insulating film.

A body-tied region (third semiconductor region) 14 containing N-type impurities relatively high in concentration ($N^+$) is formed in contact with the side surfaces of the source regions 12 opposite to the gate electrode G1. This body-tied region 14, extending in parallel to the gate electrode G1, is in contact with the side surfaces of the four source regions and the side surfaces of the partial trench isolation insulating films PT opposite to the gate electrode G1.

The partial trench isolation insulating films PT across the channel region formed along the lower part of the gate electrode G1 each reaches the drain region 13. The partial trench isolation insulating film PT, though formed between each adjacent ones of the four drain regions 13, is not in contact with the whole of the opposed side surfaces of the drain region 13, but projected by a predetermined length from the gate electrode G1. This is also the case with the partial trench isolation insulating films PT outside the drain regions 13 provided on both sides of the arrangement.

In this case, the projected length of the partial trench isolation insulating film PT is set based on the overlay accuracy with which the partial trench isolation insulating film PT, the gate electrode and the semiconductor region are superposed one on another. By projecting the partial trench isolation insulating films PT in this way, connection with the body region under the gate electrode is positively established.

The partial trench isolation insulating films formed outside the source region and the drain region provided at the ends of the arrangement of the source regions and the drain regions are each sometimes called the outer peripheral trench isolation insulating film.

The NMOS transistor N1, in which the source-drain region is divided into two parts along the gate width, is configured of an arrangement of two independent source regions and an arrangement of two independent drain regions 23.

A partial trench isolation insulating film PT is formed in contact with the whole of the opposed side surfaces between two source regions 22, and also outside the source region 22 provided at each end of the arrangement.

A body-tied region (third semiconductor region) 24 containing P-type impurities relatively high in concentration ($P^+$) is formed in contact with the side surfaces of the source regions 22 opposite to the gate electrode G1. The body-tied region 24, in contact with the side surfaces of the two source regions 22 and the side surface of the partial trench isolation insulating film PT opposite to the gate electrode G1, is extended in parallel to the gate electrode G1.

The body-tied regions 14, 24 are configured to extend in parallel to the gate electrode G1, so that even in the case where the body-tied regions 14, 24 are somewhat displaced from the direction in which the source regions are formed, the contact with the partial trench isolation insulating film PT is not completely cut off, and the operation failure of the MOS transistor is prevented.

The partial trench isolation insulating film PT is formed also between each two adjacent drain regions in a manner not in contact with the whole of the opposed side surfaces of the drain regions 23 but in a form projected by a predetermined length from the gate electrode G1. This is also the case with the partial trench isolation insulating films PT outside the drain regions 23 provided at the ends of the arrangement.

In this case, the length by which each partial trench isolation insulating film PT is projected is set based on the overlay accuracy between the partial trench isolation insulating film, the gate electrode and the semiconductor region. By projecting the partial trench isolation insulating films this way, the body region under the gate electrode can be positively connected.

Figure 3:
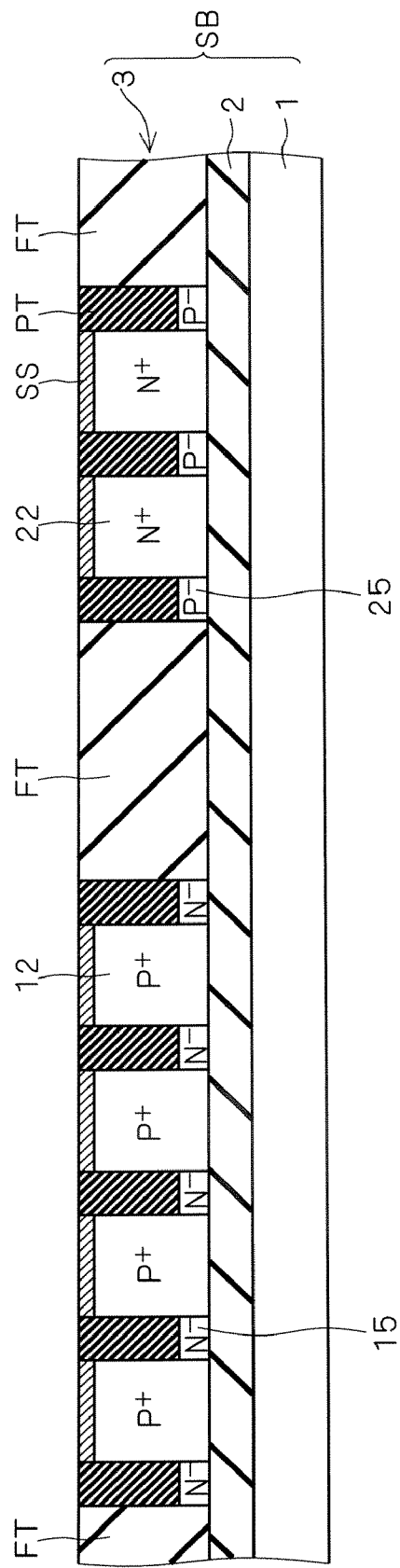

As shown in FIGS. 2 to 5, the semiconductor device 100 is formed on a SOI substrate SB configured of a silicon substrate 1, a buried oxide film 2 formed on the silicon substrate 1 and a SOI layer 3 formed on the buried oxide film 2. The PMOS transistor P1 and the NMOS transistor N1 are completely surrounded by the full trench isolation insulting film FT, and as shown in FIG. 3, the active layer of the PMOS transistor P1 and the active layer of the NMOS transistor N1 are electrically isolated from each other.

Also, as shown in FIG. 2, the body-tied region 14 of the PMOS transistor P1 is formed to reach the buried oxide film 2 from the surface of the SOI layer 3 into contact with the well region 15 containing N-type impurities relatively low in concentration ($N^-$) existing under the partial trench isolation insulating film PT. The upper surface of the body-tied region 14 is covered with a silicide film SS.

Figure 4:
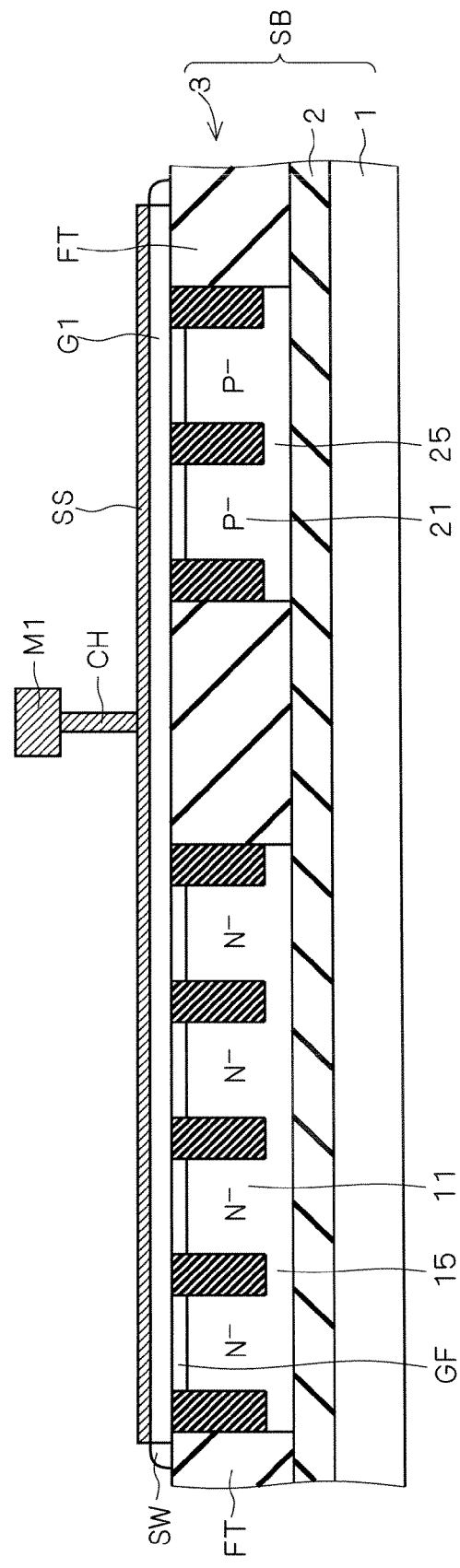

As shown in FIG. 4, the well region 15 is connected to the body region 11, so that carriers can move between the body-tied region 14 and the body region 11 through the well region 15. The configuration is also the case with the body-tied region 24 of the NMOS transistor N1 and the body region 21 and the well region 25 containing P-type impurities relatively low in concentration ($P^-$) existing under the partial trench isolation insulating film PT.

Also, as shown in FIG. 5, a gate electrode G1 is formed through a gate insulating film GF above the body region 11 of the PMOS transistor P1, and a side wall insulating film SW is formed on each side surface of the gate electrode G1.

An extension layer EX is formed in the surface of the body region 11 outside each of the side surfaces of the gate electrode along the gate length, and in contact with the source regions 12 and the drain regions 13.

The extension layer is an impurities layer, formed as a junction shallower than and having the same conduction type as the source-drain region, functions as a source-drain region and therefore should be referred to as the source-drain extension layer. For the convenience's sake, however, it is referred to as the extension layer. A channel region, though not shown, is formed along the gate electrode G1 in the body region 11 between the extension layers EX. This is also the case with the NMOS transistor N1.

As shown in FIG. 5, the source region 12 and the drain region 13 are formed to reach the buried oxide film 2 from the surface of the SOI layer 3. The upper surface of the source region 12 and the drain region 13 is covered with the silicide film SS, and so is the upper surface of the gate electrode G1.

The NMOS transistor N1 has a gate structure similar to the one described above, and the upper surface of the source region 22 and the drain region 23 is covered with the silicide film SS. In FIG. 1, the silicide film SS is not shown for the sake of convenience.

Though not shown in FIG. 1, the gate electrode G1, as shown in FIG. 4, is electrically connected to an overlying wiring layer M1 through a contact hole CH. In similar fashion, as shown in FIG. 5, the source region 12, the drain region 13 and the body-tied region 14 are connected to the overlying wiring layers M1 through the contact holes CH. The source region 12 and the body-tied region 14 are electrically connected to each other through the silicide film SS, and as shown in FIG. 5, can of course be connected to a common wiring layer M1.

Since the source region 12 and the body-tied region 14 are electrically connected to each other, the body region 11 of the PMOS transistor P1 is fixed to the potential of the source region 12.

In the NMOS transistor N1, on the other hand, the body region 21 is fixed at the potential of the source region 22.

A-2. Effects

As described above, in the semiconductor device 100, the source-drain region of the PMOS transistor P1 is divided into four parts along the gate width. In this way, the gate electrode G1 of the PMOS transistor P1 is substantially divided into four parts, and the potential of the body region 11 of each of divided gate electrode is fixed through the well region 15 from the body-tied region 14. Also, in the NMOS transistor N1, the source-drain region is divided into two parts along the gate width. Thus, the gate electrode G1 of the NMOS transistor N1 is substantially divided into two parts, and the potential of the body region 21 of each of the divided gate electrodes is fixed through the well region 25 from the body-tied region 24.

In the PMOS transistor P1 and the NMOS transistor N1, therefore, the potential of the body regions 11, 21 can be positively fixed and thus the kink can be suppressed.

Also, in the PMOS transistor P1 and the NMOS transistor N1, the gate electrode G1 is substantially divided and therefore the operation withstanding voltage can be improved.

Specifically, the operation withstanding voltage of the MOS transistor is limited by the channel width, and reduced with the increase in channel width.

This is more conspicuous for the NMOS transistor having a larger driving power, and the channel width of the PMOS transistor can be lengthened as compared with the NMOS transistor.

Any way, the operation withstanding voltage is limited by the channel width. By dividing the channel region under the gate electrode G1 along the gate width by the partial trench isolation insulating film PT, however, the channel width is substantially shortened so that the voltage applicable per channel region can be increased for an improved operation withstanding voltage of the transistor as a whole.

Also, the gate electrode G1 is substantially divided along the gate width by dividing the source-drain region by the partial trench isolation insulating film PT and the full trench isolation insulating film FT. A mask high in machinability is used to form the trench isolation insulating film. Thus, the gate electrode G1 can be divided accurately according to the design value, and a semiconductor device free of the variation of the gate width and hence the variation in the operation characteristics can be obtained.

The greater part of the side surfaces of the drain region 13 of the PMOS transistor P1 and the drain region 23 of the NMOS transistor N1 are in contact with the full trench isolation insulating film FT but only a part thereof is in contact with the partial trench isolation insulating film PT.

By employing this configuration, the greater part of the drain regions 13, 23 is surrounded by the full trench isolation insulating film FT and the PN junction area is correspondingly reduced. Thus, the parasitic junction capacitance of the drain regions 13, 23 can be reduced for a shorter time consumed for charge/discharge, thereby preventing the operation speed of the MOS transistor from being reduced.

The side surface of the source region 12 of the PMOS transistor PL is in contact with the partial trench isolation insulating film PT and the body-tied region 14, and the side surface of the source region 22 of the NMOS transistor N1 is in contact with the partial trench isolation insulating film PT and the body-tied region 24. Therefore, the PN junction area in the source regions 12, 22 is increased for a larger parasitic junction capacitance. Since the increased junction capacitance of the source region contributes to stable current supply, the power supply can be stabilized.

A wiring layer M1 is formed above the semiconductor device 100. The parasitic capacitance of the wiring layer M1 above the partial trench isolation insulating film PT is larger than the parasitic capacitance of the wiring layer M1 above the full trench isolation insulating film FT.

In the drain regions 13, 23, therefore, the region formed with the partial trench isolation insulating film PT is minimized thereby to suppress the parasitic capacitance of the wiring layer M1 and thus to prevent the reduction in the operating speed of the MOS transistor.

A-3. Applications

Figure 6:
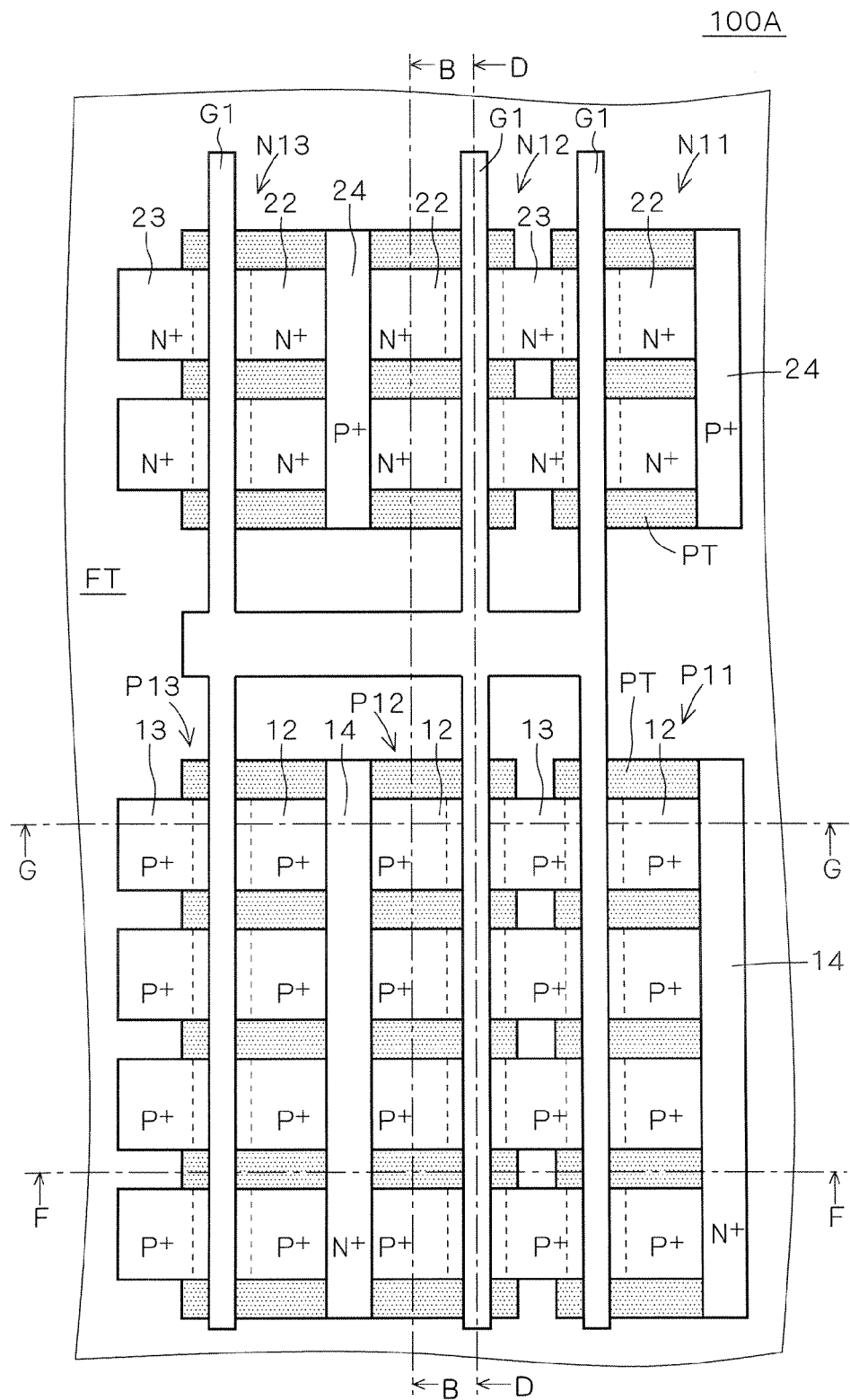
FIG. 6 is a plan view for explaining the configuration of an application of the semiconductor device according to the first embodiment of the invention.

The semiconductor device 100 described above has an illustrated arrangement of the PMOS transistor P1 and the NMOS transistor N1 sharing the gate electrode G1. FIG. 6 shows the configuration of the semiconductor device 100A, in which the arrangement of the PMOS transistor P11 and the NMOS transistor N11 (first set), the arrangement of the PMOS transistor P12 and the NMOS transistor N12 (second set) and the arrangement of the PMOS transistor P13 and the NMOS transistor N13 (third set), each set being connected to a common gate electrode G1.

Figure 7:
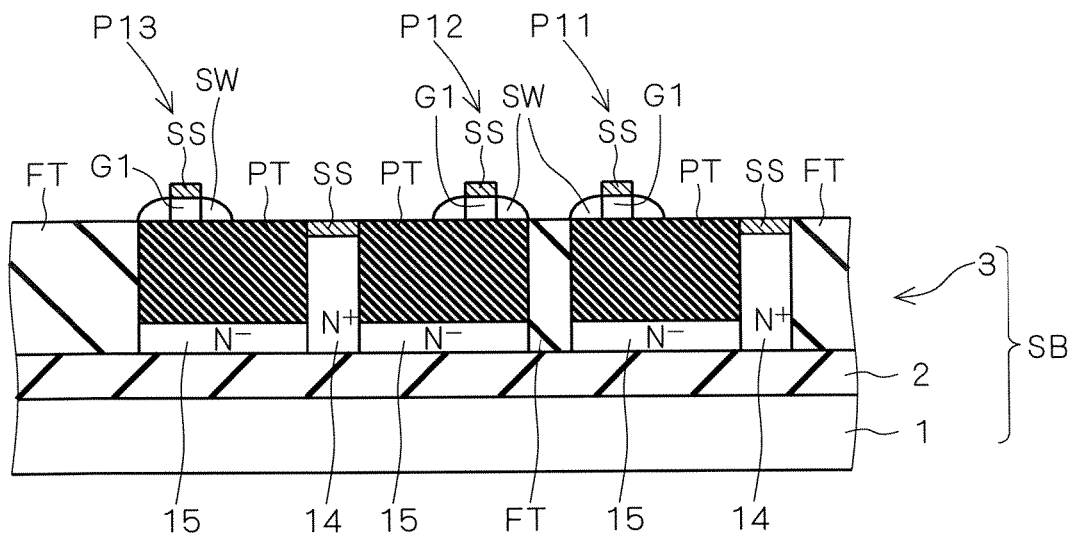
FIGS. 7 and 8 are sectional views for explaining the configuration of an application of the semiconductor device according to the first embodiment of the invention.
Figure 8:
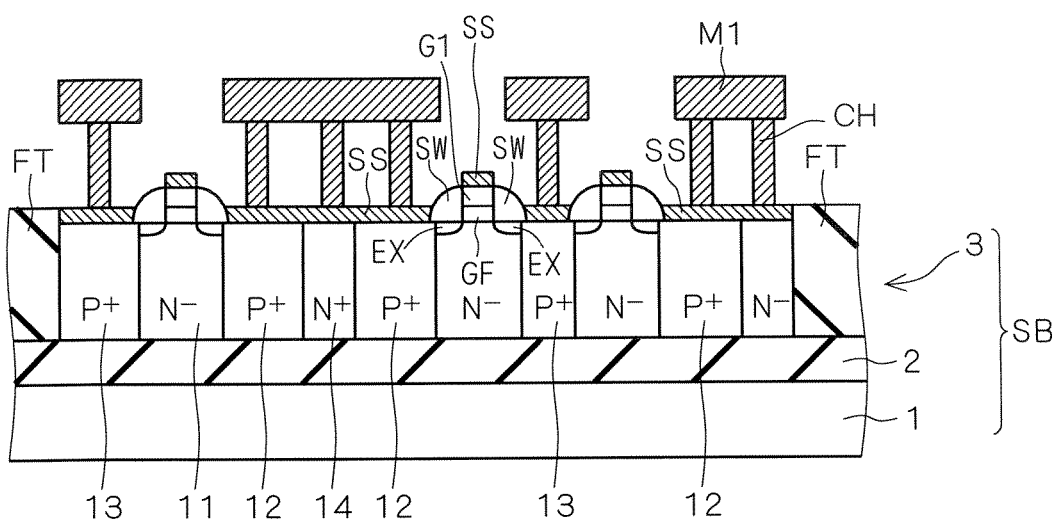

In the semiconductor device 100A shown in FIG. 6, the same component parts as those of the semiconductor 100 shown in FIG. 1 are designated by the same reference numerals, respectively, and not explained again. Also, the sectional views taken in lines F-F and G-G in FIG. 6 are shown in FIGS. 7 and 8, respectively. The sectional structure along the lines B-B and D-D are the same as the structure shown in FIGS. 3 and 4, respectively.

As shown in FIG. 6, the first and second sets share the drain regions 13, 23, while the second and third sets share the body-tied regions 14, 24.

Also, as shown in FIG. 7, the drain regions 13 of the PMOS transistors P11 and P12 are electrically isolated from each other by the full trench isolation insulating film FT. For electrical connection between the drain regions 13, therefore, as shown in FIG. 8, the drain regions 13 are connected to the overlying wiring layer M1 through the contact hole CH.

By employing this configuration, a configuration in which the PMOS transistors P11 to P13 of the first to third sets are connected in parallel to each other and the NMOS transistors N11 to N13 are connected in parallel to each other can be obtained with a minimum layout area.

Figure 9:
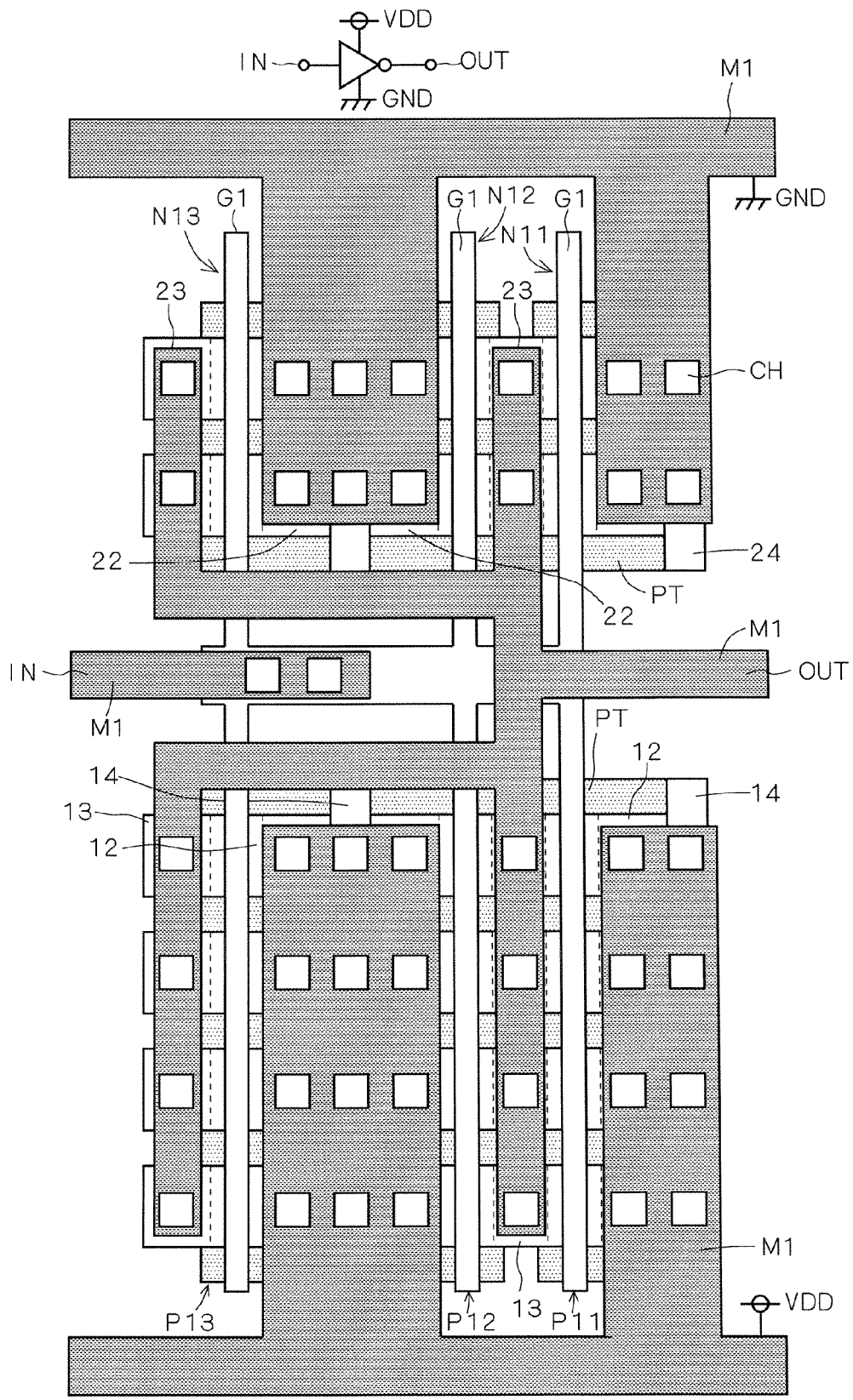
FIGS. 9 and 10 are plan views showing a layout pattern of the wiring layer in an application of the semiconductor device according to the first embodiment of the invention.

An example of the layout pattern of the wiring layer M1 as an overlying layer of the semiconductor device 100A is shown in FIG. 9.

As shown in FIG. 9, a plurality of the drain regions 13 of the PMOS transistors P11 to P13 and a plurality of the drain regions 23 of the NMOS transistors N11 to N13 are connected to the wiring layer M1 through the contact holes CH, and the wiring layer M1 is connected to the output terminal OUT.

A plurality of the source regions 12 of the PMOS transistors P11 to P13 and the body-tied regions 14, on the other hand, are each connected to the wiring layer M1 through the contact hole CH, and the wiring layer M1 is connected to a source potential VDD. A plurality of the source regions 22 of the NMOS transistors N11 to N13 and the body-tied area 24 are each connected to the wiring layer M1 through the contact hole CH, and the wiring layer M1 is connected to the grounding potential GND.

A plurality of the gate electrodes G1 are connected to a common wiring layer M1, which in turn is connected to an input terminal IN.

With this wiring, the semiconductor device 100A functions as an inverter. In FIG. 9, the inverter is also designated by a circuit symbol.

Figure 10:
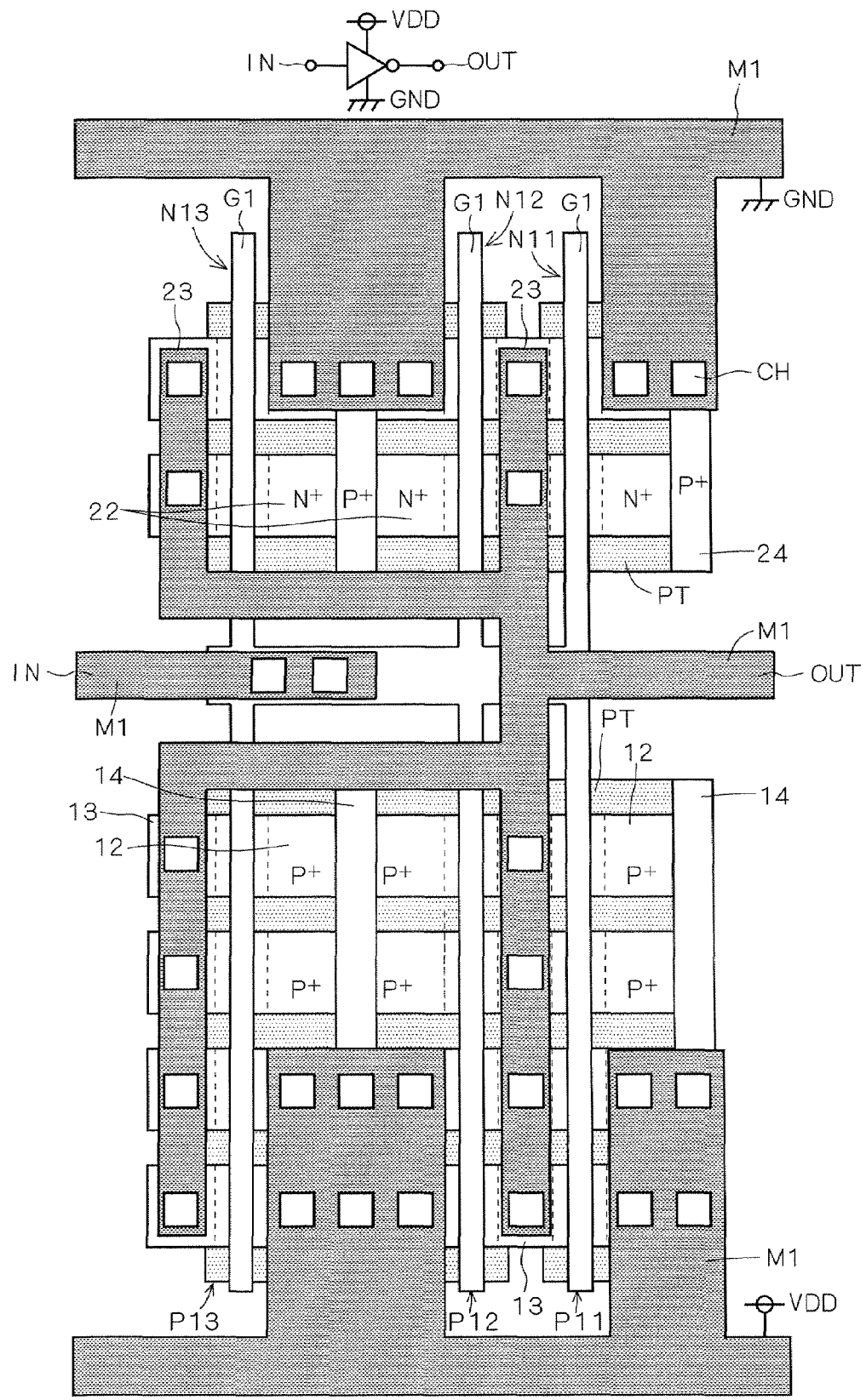

FIG. 10 shows another example of the layout pattern of the wiring layer M1 formed as an upper layer of the semiconductor device 100A.

The wiring pattern shown in FIG. 10 is basically the same as the layout pattern of the wiring layer M1 shown in FIG. 9, and the semiconductor device 100A is used as an inverter with this wiring. Only a part of each of the plurality of the source regions 12 of the PMOS transistors P11 to P13 and the plurality of the source regions 22 of the NMOS transistors N11 to N13 is connected to the wiring layer M1 through the contact hole CH, while the remaining source regions 12, 22 are not connected to the wiring layer M1.

All the source regions 12, 22 of each transistor are covered with a common silicide SS and electrically connected to each other as shown in FIG. 8. In the case where a part of the source regions 12, 22 is electrically connected to the wiring layer M1, therefore, the source regions of all the transistors are electrically connected to the wiring layer M1.

B. Second Embodiment

B-1. Device Configuration

The configuration of the semiconductor device 200 according to a second embodiment of the invention is explained below with reference to FIGS. 11 to 15.

Figure 11:
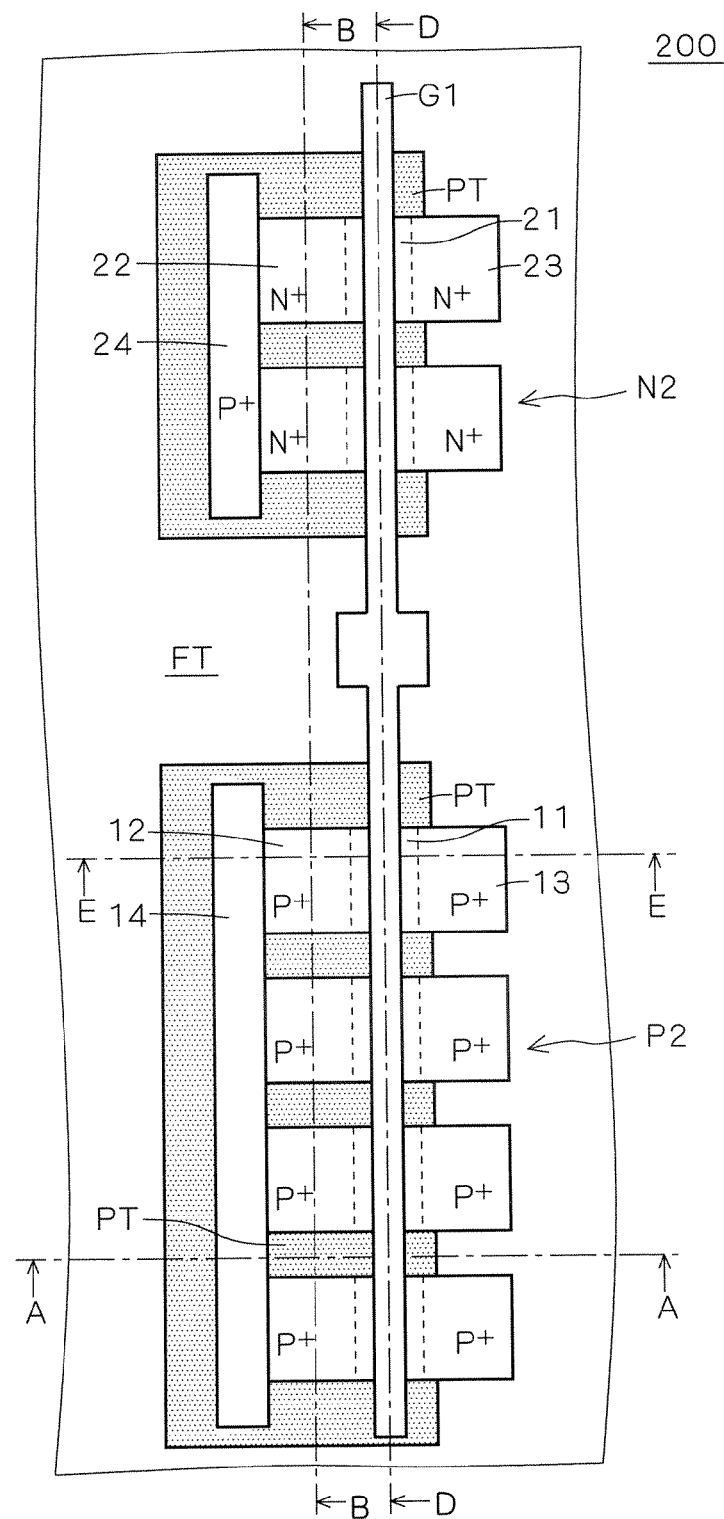
FIG. 11 is a plan view for explaining a configuration of a semiconductor device according to a second embodiment of the invention.

FIG. 11 is a plan view showing the configuration of the semiconductor device 200. The sectional views taken in lines A-A, B-B, D-D and E-E in FIG. 11 are shown in FIGS. 12, 13, 14 and 15, respectively. The same component parts as those of the semiconductor device 100 shown in FIGS. 1 to 5 are designated by the same reference numerals, respectively, and not described again.

In the semiconductor device 200 shown in FIG. 11, a body-tied region 14 containing N-type impurities relatively high in concentration ($N^+$) is formed in contact with that side surface of the source regions 12 of the PMOS transistor P2 which is opposite to the gate electrode G1. This body-tied region 14 is in contact with the side surfaces of the four source regions 12 and the side surface of the partial trench isolation insulating film PT opposite to the gate electrode G1. The body-tied region 14 thus extends in parallel to the gate electrode G1.

The partial trench isolation insulating film PT is formed in contact with the whole of the opposed side surfaces between each adjacent ones of the four source regions 12. The partial trench isolation insulating film PT is formed also outside the source regions 12 provided at the ends of the arrangement. This partial trench isolation insulating film PT is formed also in contact with each of the longitudinal end surfaces of the body-tied region 14.

The partial trench isolation insulating film PT (second partial trench isolation insulating film) is formed in contact with the side surface of the body-tied region 14 opposite to the gate electrode G1 (FIG. 12), and the body-tied region 14 is surrounded by the partial trench isolation insulating film PT. The partial trench isolation insulating film PT formed in contact with the side surfaces of the body-tied region is sometimes called the outer peripheral partial trench isolation insulating film.

Figure 12:
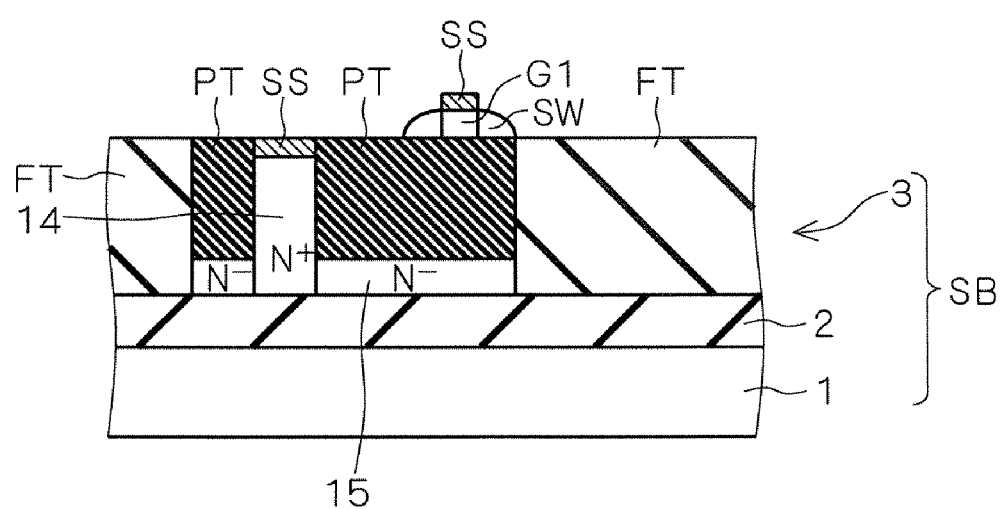
FIGS. 12 to 15 are sectional views for explaining a configuration of a semiconductor device according to the second embodiment of the invention.
Figure 13:
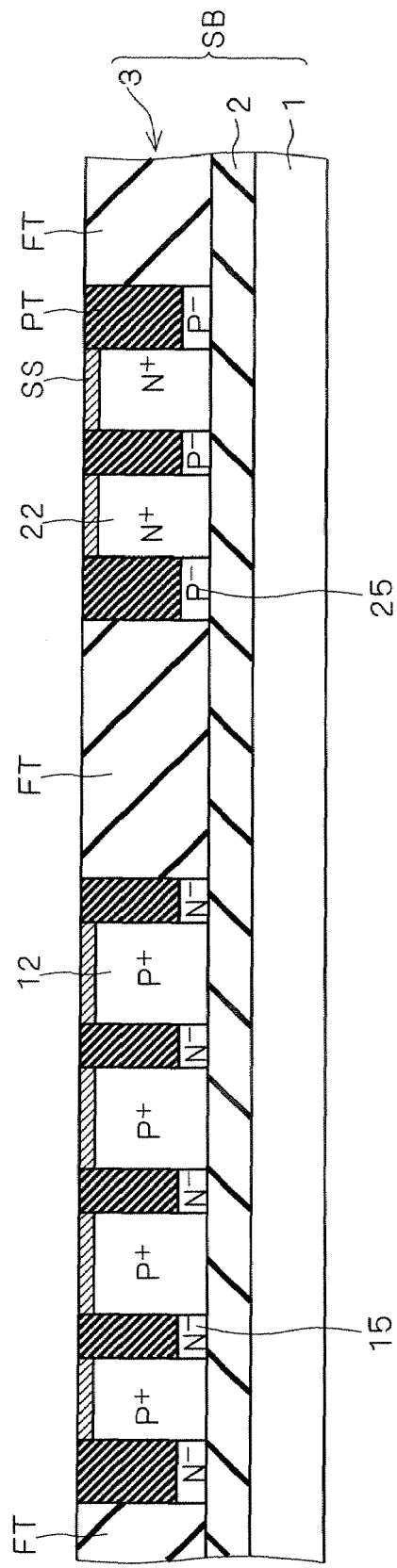
Figure 14:
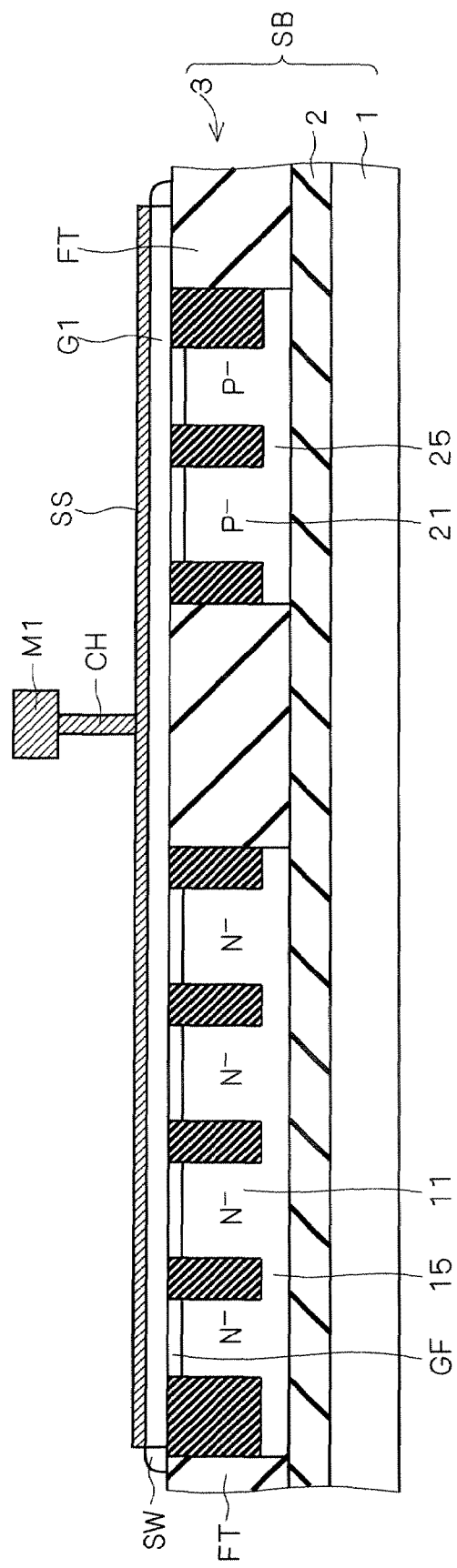
Figure 15:
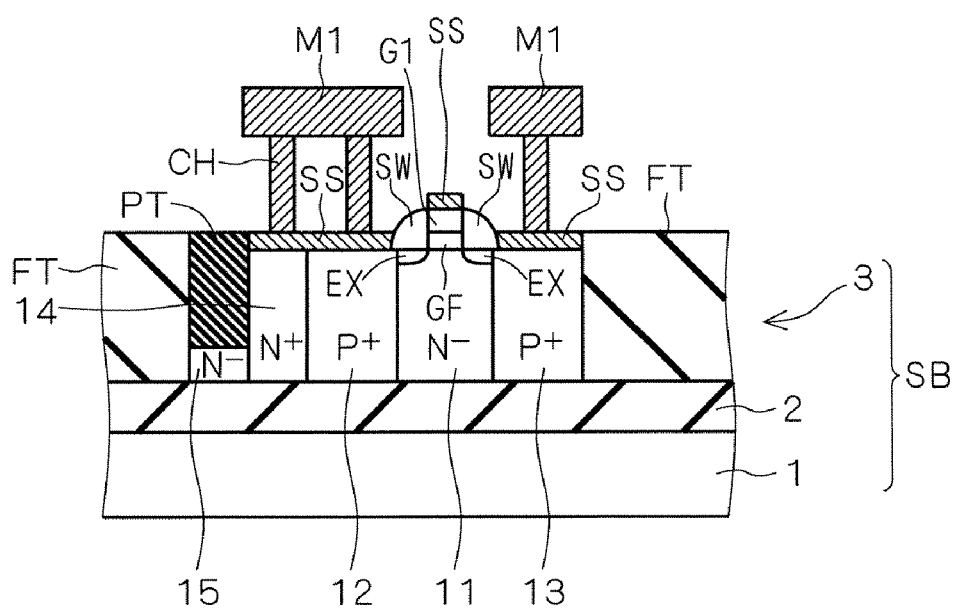

In the PMOS transistor region, a well region 15 containing N-type impurities relatively low in concentration (N$^-$) exists under each partial trench isolation insulating film PT, and as shown in FIGS. 12, 15, the body-tied region 14 and the well region 15 are in contact with each other.

In the NMOS transistor N2, the body-tied region 24 containing P-type impurities relatively high in concentration (P$^+$) is formed in contact with the side surface of each source region 22 opposite to the gate electrode G1. The body-tied region 24 is in contact with the side surfaces of the two source regions 22 and also with the side surface of the partial trench isolation insulating film PT far from the gate electrode G1. Thus, the body-tied region 24 extends in parallel to the gate electrode G1.

The partial trench isolation insulating film PT is formed in contact with the whole of the opposed side surfaces between each adjacent two source regions 22. Also, the partial trench isolation insulating film PT is formed outside the source region 22 provided at each end of the arrangement. The partial trench isolation insulating film PT is formed also in contact with the side surface of each longitudinal end of the body-tied region 24.

The partial trench isolation insulating film PT is formed in contact with each side surface of the body-tied region 24 opposite to the gate electrode G1, and the body-tied region 24 is surrounded by the partial trench isolation insulating film PT. In the NMOS transistor region, a well region 25 containing P-type impurities relatively low in concentration (P$^-$) exists under the partial trench isolation insulating film PT. Though not shown, the body-tied region 24 and the well region 25 are in contact with each other.

The other component parts are identical with those of the semiconductor device 100 shown in FIGS. 1 to 5 and therefore not described again.

B-2. Effects

In the semiconductor device 200 described above, the source-drain region of the MOS transistor is divided along the gate width. Like in the semiconductor device 100 described with reference to FIGS. 1 to 5, therefore, the potential of the body regions 11, 21 can be fixed positively for both the PMOS transistor P2 and the NMOS transistor N2. Thus, the kink can be suppressed while at the same time improving the operation withstanding voltage.

Also, the source-drain region is divided by the partial trench isolation insulating film PT and the full trench isolation insulating film FT thereby to divide the gate electrode G1 substantially along the gate width. In view of the fact that a mask high machining precision is used to form the trench isolation insulating film, however, the gate electrode G1 can be accurately divided according to the design value. Thus, a semiconductor device free of variation in both the gate width and the operation characteristics is obtained.

Also, since the configuration is employed in which the greater part of the drain regions 13, 23 are surrounded by the full trench isolation insulating film FT, the area of the PN junction is correspondingly reduced. Thus, the parasitic joint capacitance in the drain regions 13, 23 is reduced, and the reduction in the operation speed of the MOS transistor can be prevented.

The side surface of each source region 12 of the PMOS transistor P2 is in contact with the partial trench isolation insulating film PT and the body-tied region 14. Also, the side surface of each source region 22 of the NMOS transistor N2 is in contact with the partial trench isolation insulating film PT and the body-tied region 24. Thus, the area of the PN junction of the source regions 12, 22 is increased, thereby increasing the parasitic junction capacitance while at the same time stabilizing the power supply.

Further, the partial trench isolation insulating film PT is formed in contact with the side surface of the body-tied region 14 opposite to the gate electrode G1, and the body-tied region 14 is surrounded by the partial trench isolation insulating film PT. In the case where the wiring layer M1 is formed on the partial trench isolation insulating film PT, therefore, the parasitic capacitance of the wiring layer M1 can be further increased, thereby stabilizing the power supply.

In the drain regions 13, 23, the region where the partial trench isolation insulating films PT are formed is minimized. Thus, the parasitic capacitance of the wiring layer M1 is suppressed, thereby making it possible to prevent the reduction in the operation speed of the MOS transistor.

B-3. Applications

Figure 16:
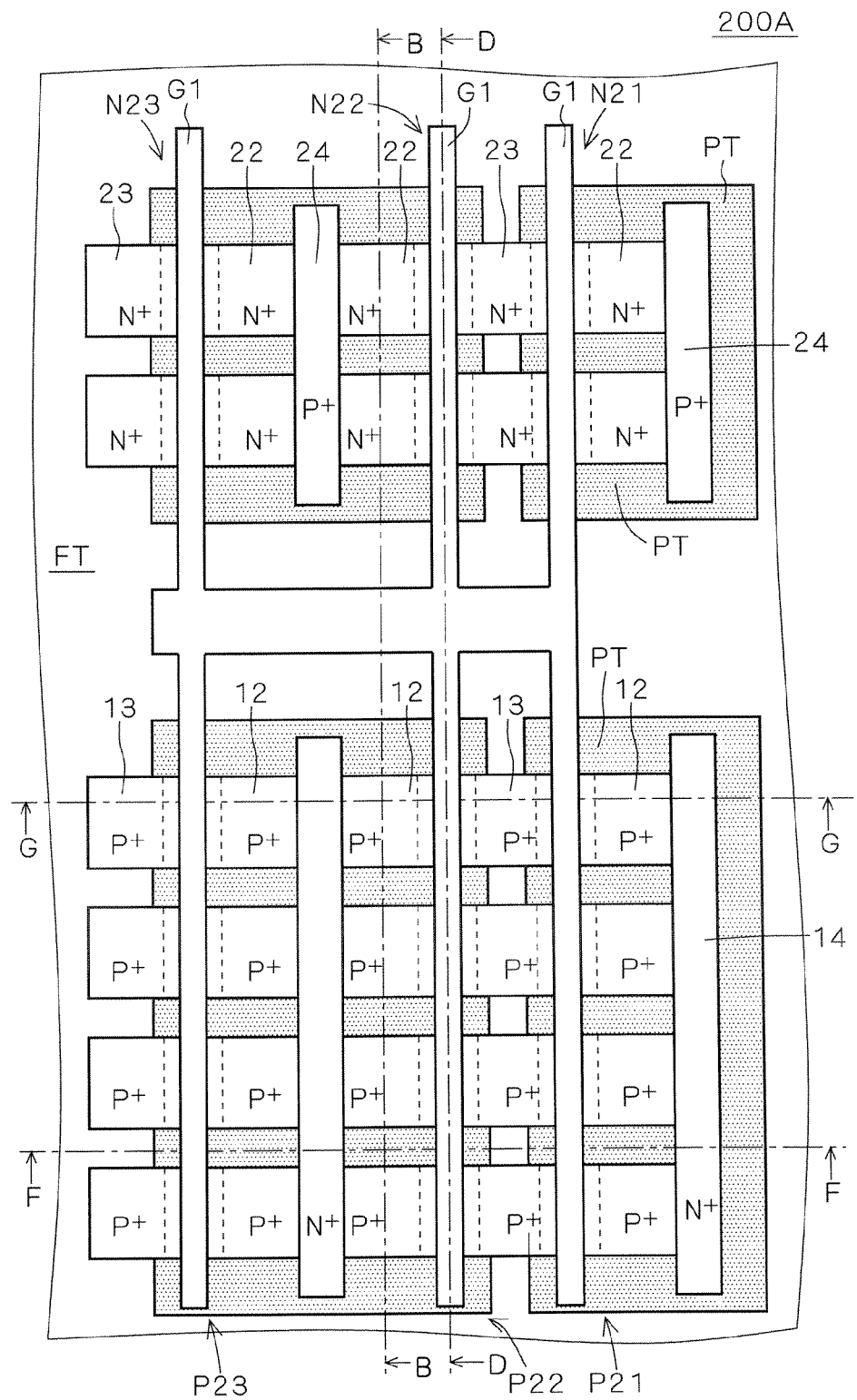
FIG. 16 is a plan view for explaining the configuration of an application of the semiconductor device according to the second embodiment of the invention.

The semiconductor device 200 described above has an arrangement of the PMOS transistors P2 and the NMOS transistors N2 connected to the common gate electrode G1. FIG. 16 shows the configuration of the semiconductor device 200A having three sets of transistor arrangements including the arrangement of the PMOS transistor P21 and the NMOS transistor N21 (first set), the arrangement of the PMOS transistor P22 and the NMOS transistor N22 (second set) and the arrangement of the PMOS transistor P23 and the NMOS transistor N23 (third set), each set being connected to a common gate electrode G1.

Figure 17:
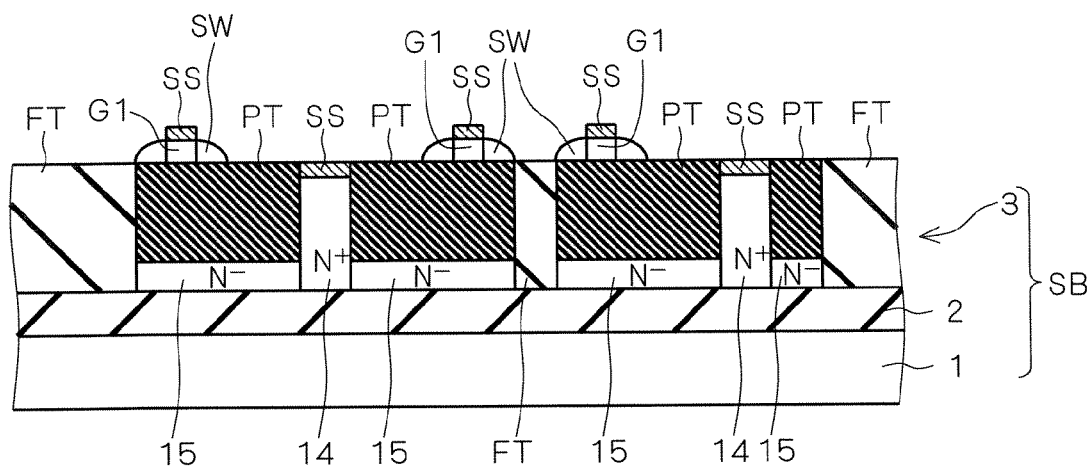
FIGS. 17 and 18 are sectional views for explaining the configuration of an application of the semiconductor device according to the second embodiment of the invention.
Figure 18:
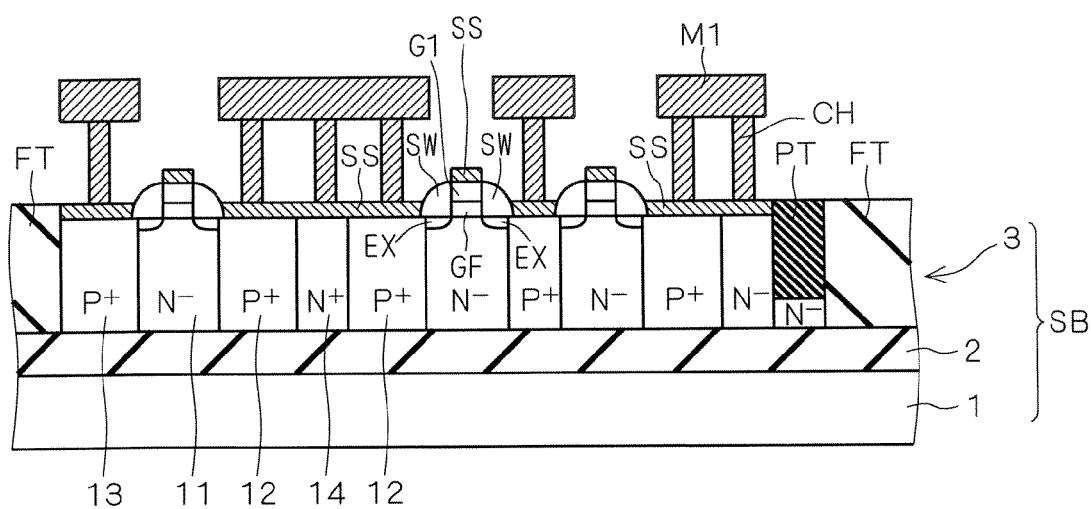

In the semiconductor device 200A shown in FIG. 16, the same component parts as those of the semiconductor device 100A shown in FIG. 6 are designated by the same reference numerals, respectively, and not explained again. Also, the sectional views taken in lines F-F and G-G in FIG. 16 are shown in FIGS. 17 and 18, respectively. The sectional configuration taken in lines B-B and D-D is identical to the configuration shown in FIGS. 13, 14, respectively.

As shown in FIG. 16, the first and second sets share the drain regions 13, 23, while the second and third sets share the body-tied regions 14, 24.

Also, as shown in FIG. 17, the drain regions 13 of the PMOS transistors P21, P22 are electrically separated by the full trench isolation insulating film FT. The drain regions 13, if to be connected to each other, are connected to an overlying common wiring layer M1 through the contact hole CH as shown in FIG. 18. This is also the case with the connection between the drain regions 23 of the NMOS transistors N21, N22.

By employing this configuration, the layout area in the first to third sets can be minimized in which the PMOS transistors P21 to P23 can be connected in parallel to each other and so can the NMOS transistors N21 to N23 in parallel to each other.

Figure 19:
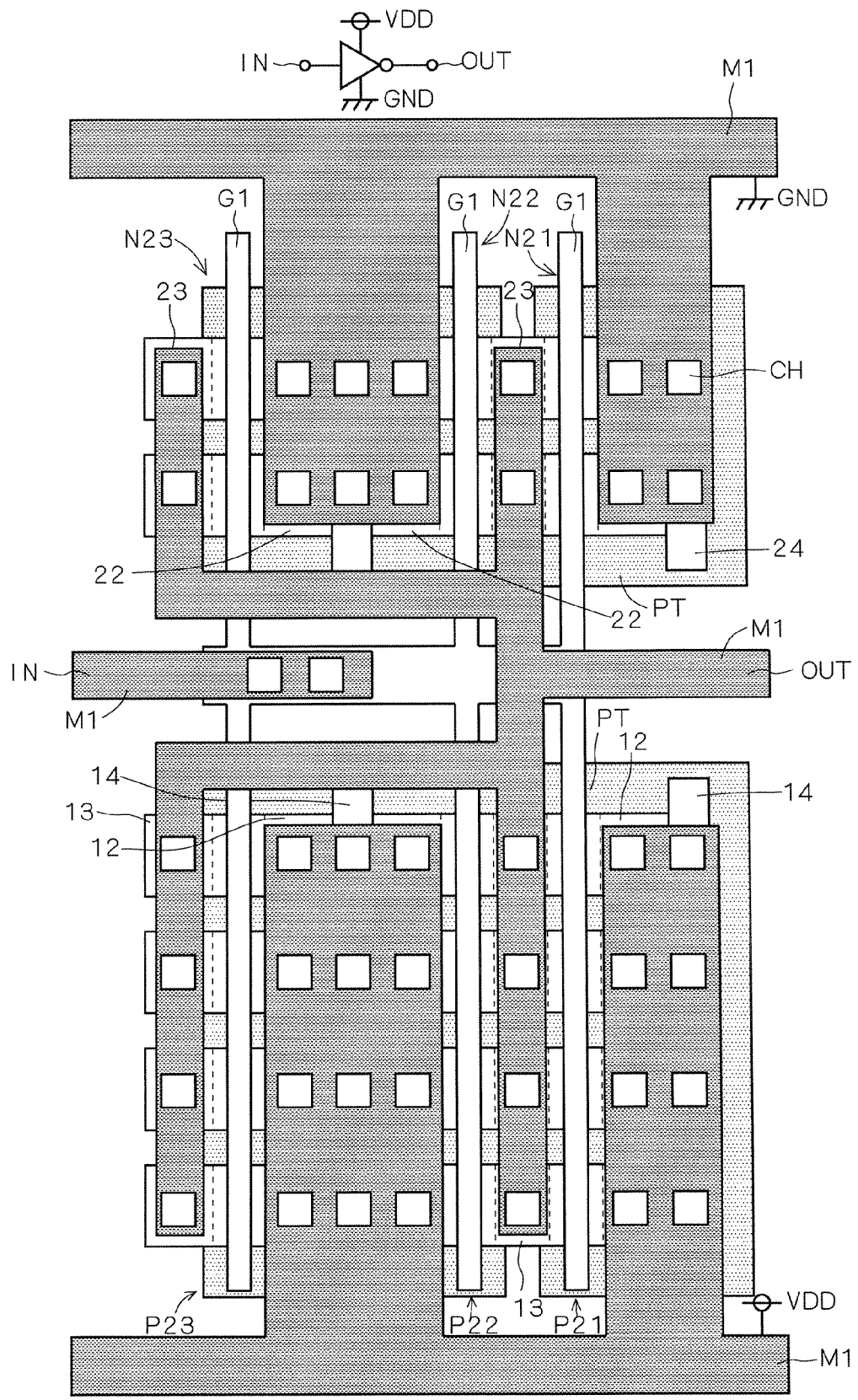
FIGS. 19 and 20 are plan views showing a layout pattern of the wiring layer of an application of the semiconductor device according to the second embodiment of the invention.

An example of the layout pattern of the wiring layer M1 formed as an overlying layer of the semiconductor device 100A is shown in FIG. 19.

As shown in FIG. 19, a plurality of the drain regions 13 of the PMOS transistors P21 to P23 and a plurality of the drain regions 23 of the NMOS transistors N21 to N23 are each connected to the wiring layer M1 through the contact hole CH, and the wiring layer M1 is connected to the output terminal OUT.

Also, a plurality of the source regions 12 of the PMOS transistors P21 to P23 and the body-tied region 14 are each connected to the wiring layer M1 through the contact hole CH, and the wiring layer M1 is connected to the source potential VDD, while a plurality of the source regions 22 of the NMOS transistors N21 to N23 and the body-tied region 24 are connected to the wiring layer M1 through the contact hole CH, and the particular wiring layer M1 is connected to the grounding potential GND.

A plurality of the gate electrodes G1 are connected to a common wiring layer M1, which in turn is connected to the input terminal IN.

Using this wiring pattern, the semiconductor device 200A functions as an inverter. In FIG. 19, the inverter is also designated by a circuit symbol.

Figure 20:
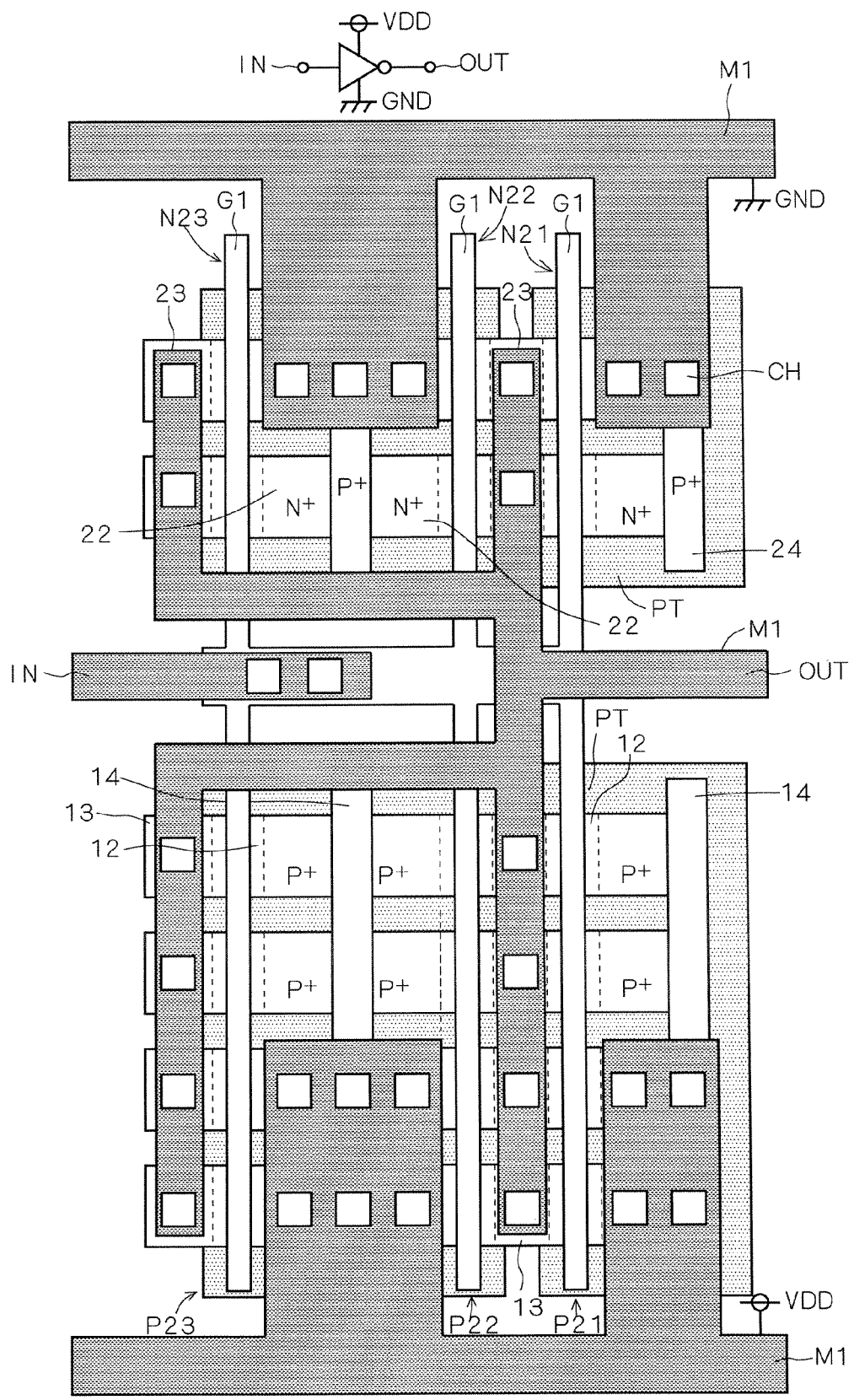

FIG. 20 shows another example of the layout pattern of the wiring layer M1 formed as an overlying layer of the semiconductor device 200A.

The wiring pattern shown in FIG. 20 basically identical with the layout pattern of the wiring layer M1 shown in FIG. 19 and uses the semiconductor device 100A as an inverter. Nevertheless, only a part of the plurality of the source regions 12 of the PMOS transistors P21 to P23 and the plurality of the source regions 22 of the NMOS transistors N21 to N23 are connected to the wiring layer M1 through the contact hole CH, while the remaining source regions 12, 22 are not connected to the wiring layer M1.

All the source regions 12, 22 of the transistors are covered by a common silicide film SS as shown in FIG. 18 and electrically connected. By connecting a part of them electrically to the wiring layer M1, therefore, all the source regions of the transistors can be electrically connected to the wiring layer M1.

C. Third Embodiment

C-1. Device Configuration

With reference to FIGS. 21 to 25, the configuration of the semiconductor device 300 according to a third embodiment of the invention is explained.

Figure 21:
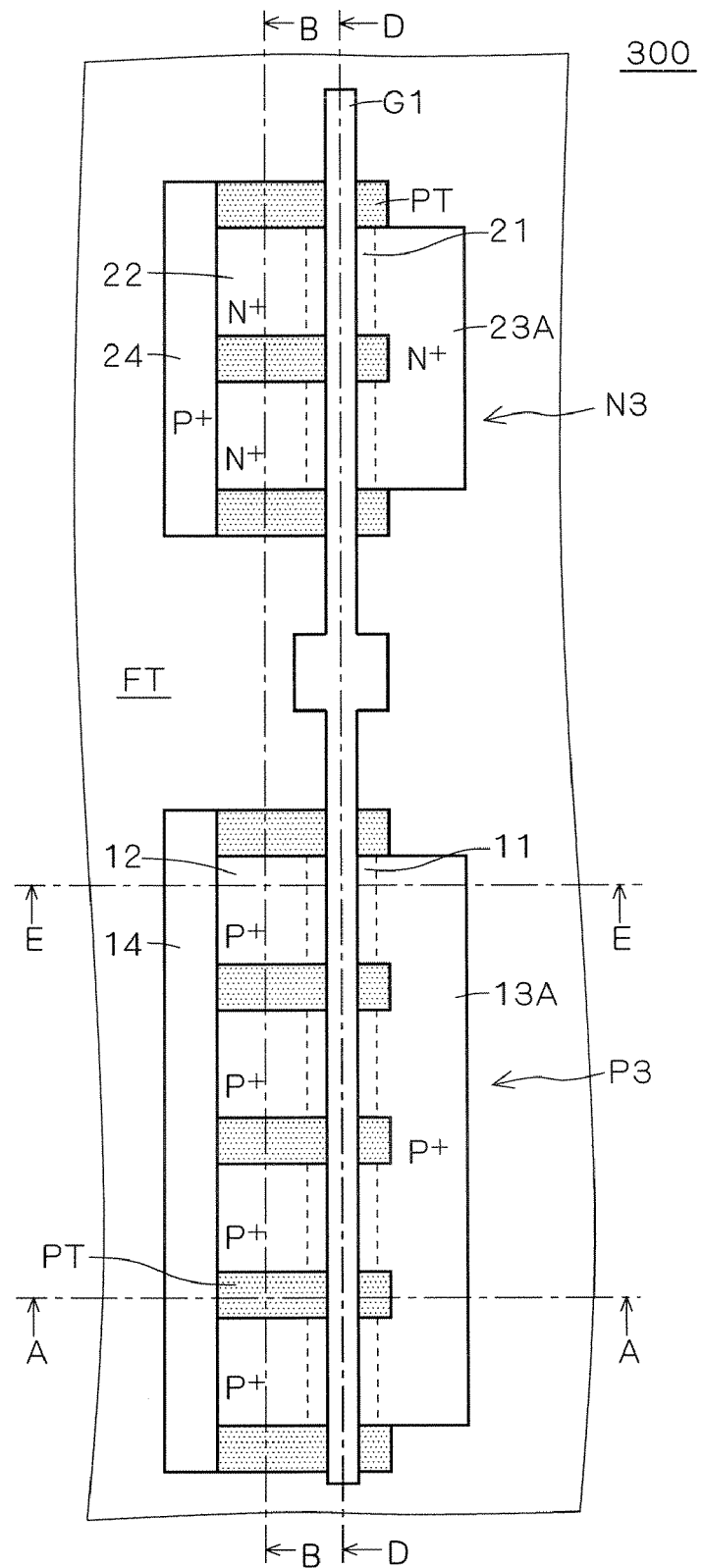
FIG. 21 is a plan view for explaining a configuration of a semiconductor device according to a third embodiment of the invention.
Figure 22:
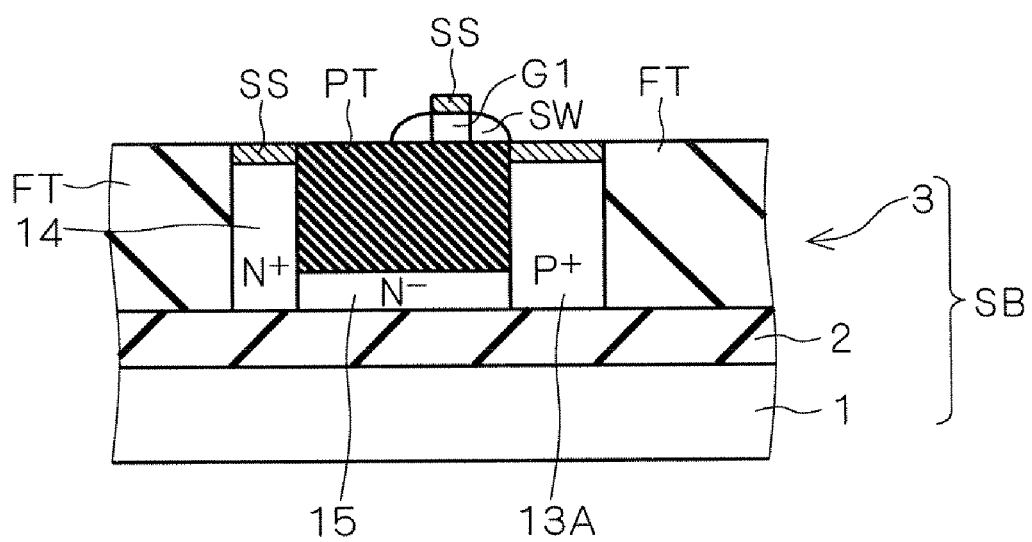
FIGS. 22 to 25 are sectional views for explaining a configuration of a semiconductor device according to the third embodiment of the invention.
Figure 23:
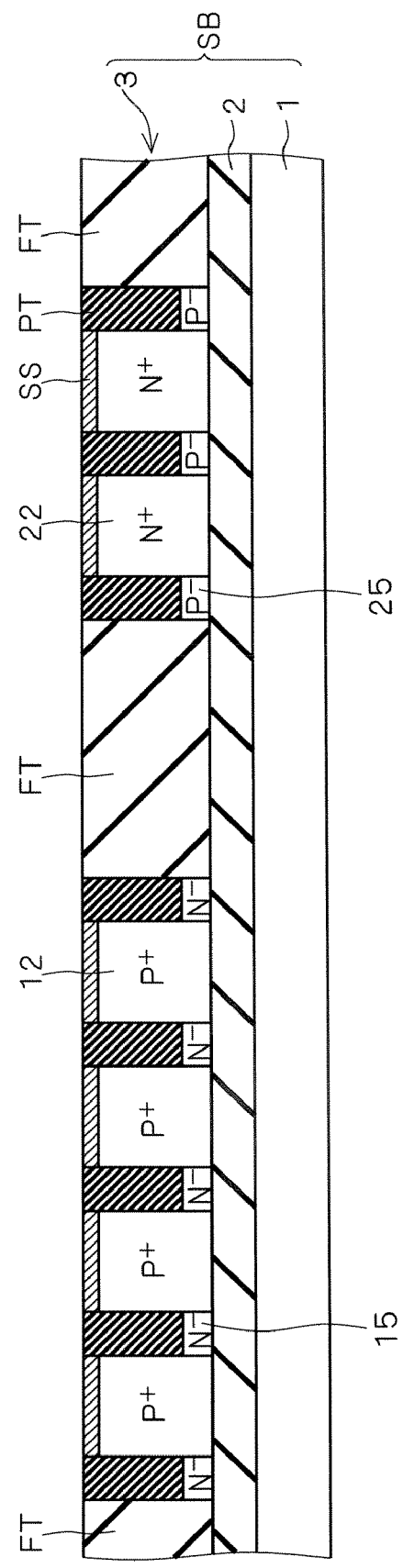
Figure 24:
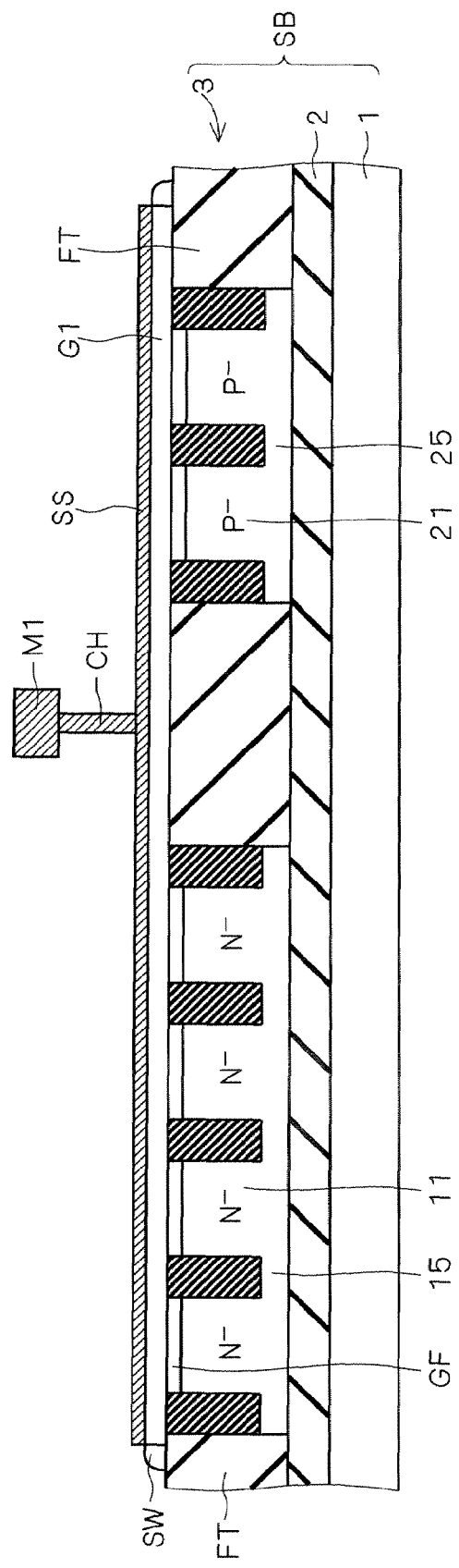
Figure 25:
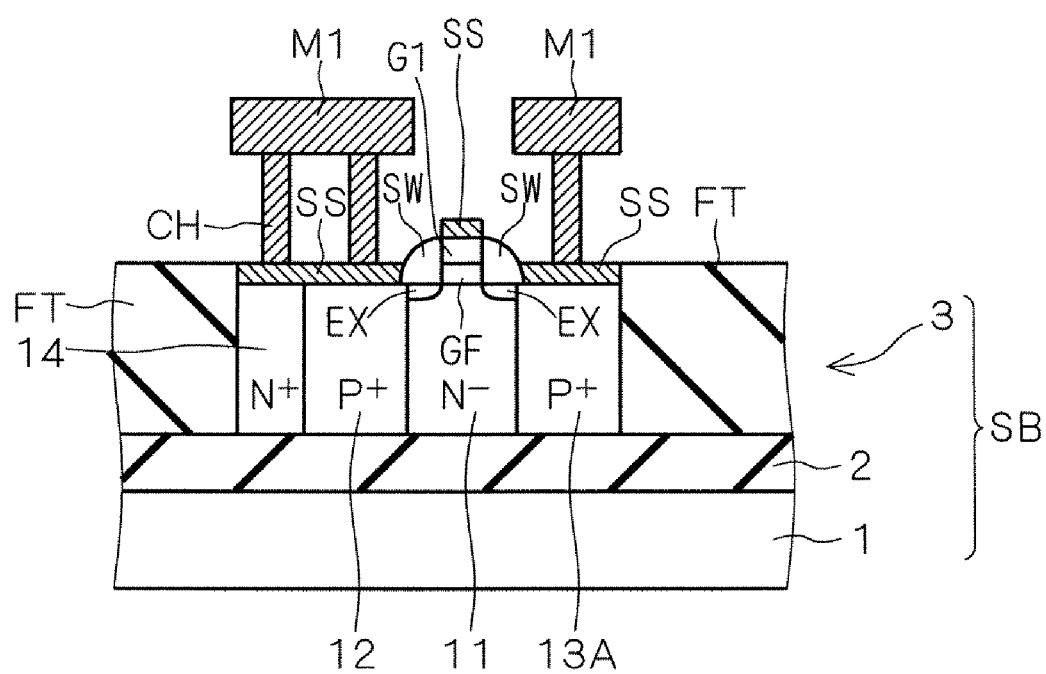

FIG. 21 is a plan view showing a configuration of the semiconductor device 300, and the sectional views taken in lines A-A, B-B, D-D and E-E in FIG. 21 are shown in FIGS. 22, 23, 24 and 25, respectively. The same component parts as those of the semiconductor device 100 shown in FIGS. 1 to 5 are designated by the same reference numerals, respectively, and not explained again.

In the PMOS transistor P3 of the semiconductor device 300 shown in FIG. 21, the source region is divided into four parts along the gate width into an arrangement of four independent source regions 12.

Specifically, the partial trench isolation insulating film PT is formed in contact with the whole of the opposed side surfaces between each adjacent ones of the four source regions 12. Also, the partial trench isolation insulating film PT is formed outside the source region 12 at each end of the arrangement.

In the drain region 13A, on the other hand, the partial trench isolation insulating film PT is projected by a predetermined length from the gate electrode G1. However, the portion of the drain region 13A on the opposite side of the gate electrode G1 is continuously formed and not divided, so that the drain region 13A is configured to surround the projected partial trench isolation insulating film PT.

The NMOS transistor N3 has such a configuration that the source region is divided into two parts along the gate width into an arrangement of two independent source regions 22.

Specifically, the partial trench isolation insulating film PT is formed in contact with the whole of the opposed side surfaces between the two source regions 22. Also, the partial trench isolation insulating film PT is formed outside the source region 22 provided at each end of the arrangement.

In the drain region 23A, on the other hand, the partial trench isolation insulating film PT is projected by a predetermined length from the gate electrode G1. However, the portion of the drain region 23A on the opposite side of the gate electrode G1 is formed continuously and not divided. Thus, the drain region 23A is configured to surround the projected partial trench isolation insulating film PT.

The other component parts are identical with those of the semiconductor device 100 shown in FIGS. 1 to 5, and not described any further.

C-2. Effects

In the semiconductor device 300 described above, the source region of the MOS transistor is divided along the gate width. Like in the semiconductor device 100 explained with reference to FIGS. 1 to 5, therefore, the potential of the body regions 11, 21 can be positively fixed in the PMOS transistor P3 and the NMOS transistor N3. Thus, a kink is suppressed and the operation withstanding voltage can be improved.

Also, the source regions 12, 22 are divided by the partial trench isolation insulating film PT so that the gate electrode G1 is substantially divided along the gate width. In view of the fact that a mask high in machining precision is used to form the trench isolation insulating film, however, the gate electrode G1 can be accurately divided according to the design value. Thus, a semiconductor device is obtained in which the gate width is not varied, nor the operation characteristics of the device.

In view of the fact that the drain regions 13A, 23A are continuously configured, at least one contact hole for fixing the potential is sufficiently connected, and therefore the process of forming the contact hole is simplified.

Also, the configuration in which the greater part of the drain regions 13A, 23A is surrounded by the full trench isolation insulating film FT can correspondingly reduce the junction area of the PN junction. Thus, the parasitic junction capacitance in the drain regions 13A, 23A is reduced and the operation speed of the MOS transistor can be prevented from decreasing.

On the other hand, the side surface of each source region 12 of the PMOS transistor P3 is in contact with the partial trench isolation insulating film PT and the body-tied region 14, while the side surface of each source region 22 of the NMOS transistor N3 is in contact with the partial trench isolation insulating film PT and the body-tied region 24. As a result, the junction area of the PN junction in the source regions 12, 22 is increased. Thus, the parasitic junction capacitance can be increased and the reduction in the operation speed of the MOS transistor can be prevented.

By minimizing the area in which the partial trench isolation insulating film PT is formed in the drain regions 13A, 23A, the parasitic capacitance of the wiring layer M1 can be suppressed thereby to prevent the reduction in the operation speed of the MOS transistor.

D. Fourth Embodiment

D-1. Device Configuration

The configuration of the semiconductor device 400 according to a fourth embodiment of the invention is explained with reference to FIGS. 26 to 30.

Figure 26:
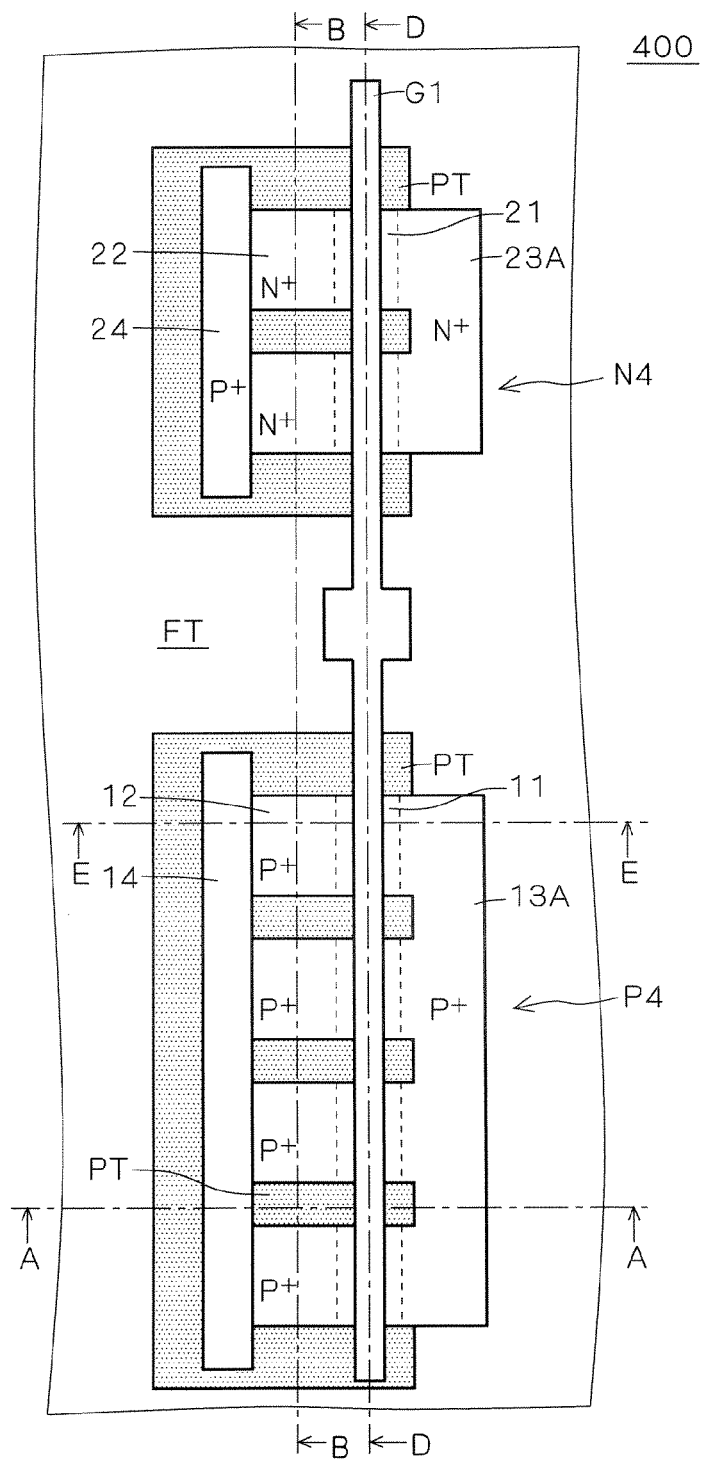
FIG. 26 is a plan view for explaining a configuration of a semiconductor device according to a fourth embodiment of the invention.

FIG. 26 is a plan view showing a configuration of the semiconductor device 400, and the sectional views taken in lines A-A, B-B, D-D and E-E in FIG. 26 are shown in FIGS. 27, 28, 29 and 30, respectively. The same component parts as those of the semiconductor device 100 shown in FIGS. 1 to 5 are designated by the same reference numerals, respectively, and not described again.

In the semiconductor device 400, as shown in FIG. 26, the body-tied region 14 containing N-type impurities relatively high in concentration ($N^+$) is formed in contact with the side surfaces of the source regions 12 of the PMOS transistor P4 opposite to the gate electrode G1. The body-tied region 14 is in contact with the side surfaces of the four source regions 12 and also with the side surface of the partial trench isolation insulating film PT far from the gate electrode G1. The body-tied region 14 thus extends in parallel to the gate electrode G1.

The partial trench isolation insulating film PT is formed in contact with the whole of the opposed side surfaces between the four source regions 12. The partial trench isolation insulating film PT is formed also outside the source region 12 provided at each end of the arrangement. This partial trench isolation insulating film PT is formed also in contact with the side surface of the longitudinal ends of the body-tied region 14.

Figure 27:
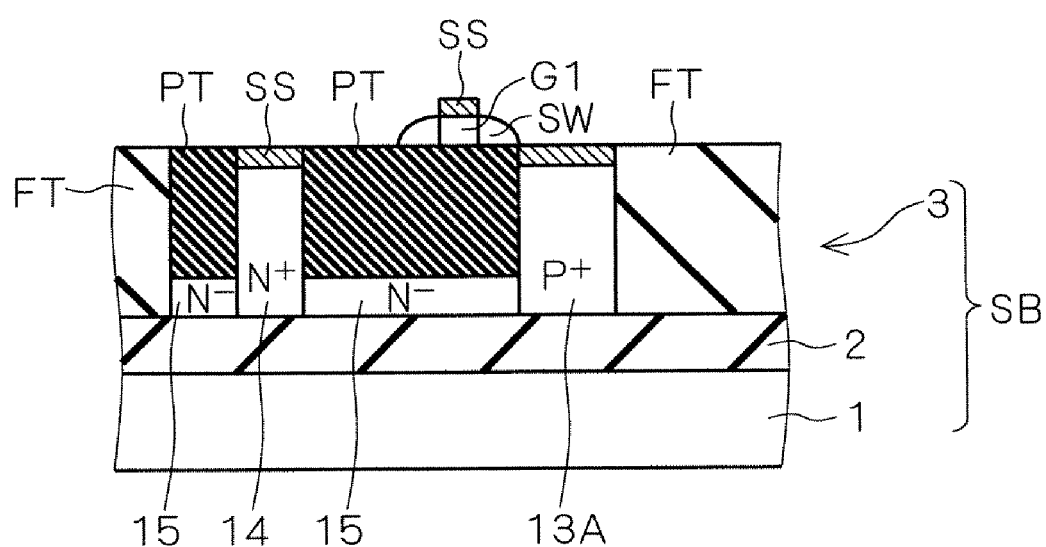
FIGS. 27 to 30 are sectional views for explaining a configuration of a semiconductor device according to the fourth embodiment of the invention.
Figure 28:
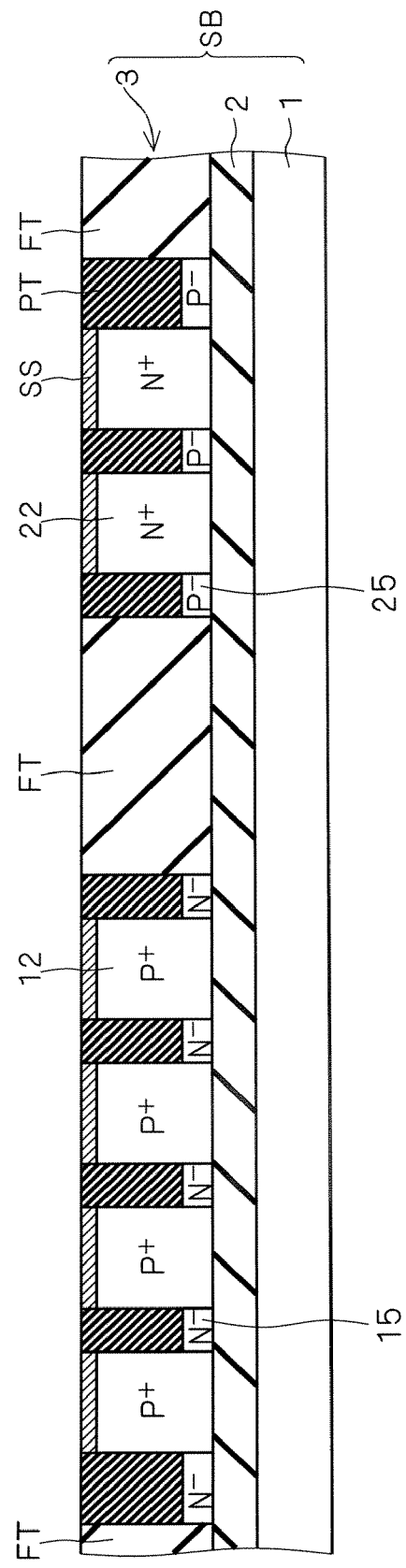
Figure 29:
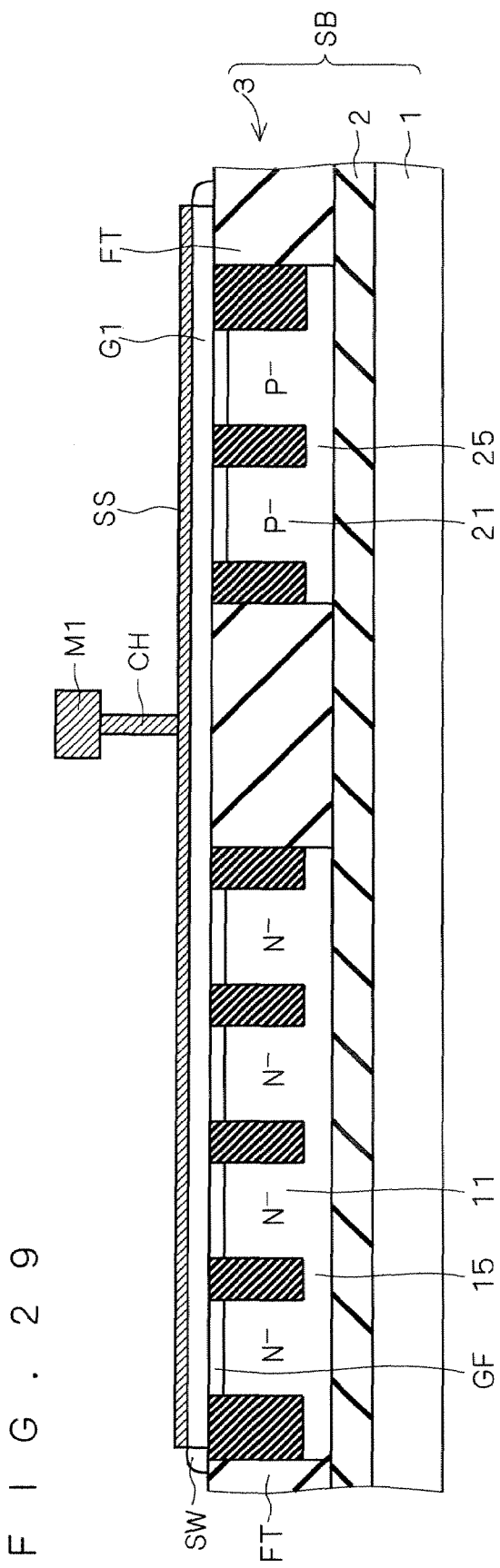
Figure 30:
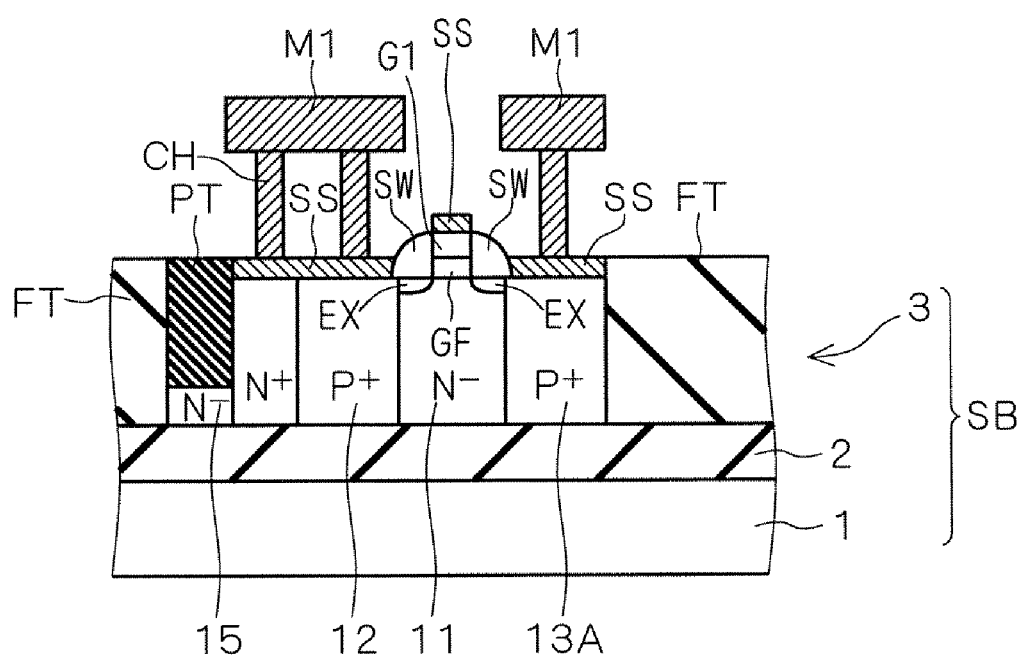

The partial trench isolation insulating film PT is formed (FIG. 27) in contact with the side surface of the body-tied region opposite to the gate electrode G1, and the body-tied region 14 is surrounded by the partial trench isolation insulating film PT. In the PMOS transistor region, a well region 14 containing N-type impurities at a relatively low concentration ($N^-$) exists in the layer under the partial trench isolation insulating film PT, and as shown in FIGS. 27, 30, the body-tied region 14 and the well region 15 are in contact with each other.

The NMOS transistor N4 includes the body-tied region 24 containing P-type impurities relatively high in concentration ($P^+$) in contact with the side surface of each source region 22 opposite to the gate electrode G1. The body-tied region 24 is in contact with the side surfaces of the two source regions 22 and also with the side surface of each partial trench isolation insulating film PT opposite to the gate electrode G1. Thus, the body-tied region 24 extends in parallel to the gate electrode G1.

The partial trench isolation insulating film PT is formed in contact with the whole of the opposed side surfaces between the two source regions 22. The partial trench isolation insulating film PT is also formed outside the source regions 22 provided at the ends of the arrangement. This partial trench isolation insulating film PT is also in contact with the side surfaces at the longitudinal ends of the body-tied region 24.

The partial trench isolation insulating film PT is formed in contact with the side surface of the body-tied region 24 opposite to the gate electrode G1, and the body-tied region 24 is surrounded by the partial trench isolation insulating film PT. In the NMOS transistor region, the well region 25 containing P-type impurities relatively low in concentration ($P^-$) exists in the layer under the partial trench isolation insulating film PT. Though not shown, the body-tied region 24 and the well region 25 are in contact with each other.

As shown in FIG. 26, in the PMOS transistor P4 of the semiconductor device 400, the source region is divided into four parts along the gate width into an arrangement of four independent source regions 12.

In the drain region 13A, on the other hand, each partial trench isolation insulating film PT is projected by a predetermined length from the gate electrode G1. The portion of each partial trench isolation insulating film PT on the opposite side of the gate electrode G1 is continuously formed and not divided.

In the NMOS transistor N4, the source region is divided into two parts along the gate width thereby to form an arrangement of two independent source regions 22.

In the drain region 23A, on the other hand, the partial trench isolation insulating film PT is projected by a predetermined length from the gate electrode G1. The portion of each partial trench isolation insulating film PT on the opposite side of the gate electrode G1, however, is continuously formed and not divided.

The other component parts are identical with those of the semiconductor device 100 shown in FIGS. 1 to 5 and not described again.

D-2. Effects

In the semiconductor device 400 described above, like in the semiconductor device 100 explained above with reference to FIGS. 1 to 5, the source region of the MOS transistor is divided along the gate width. In the PMOS transistor P4 and the NMOS transistor N4, therefore, the potential of the body regions 11, 21 can be positively fixed and a kink is suppressed, while at the same time improving the operation withstanding voltage.

Also, by dividing the source regions 12, 22 by the partial trench isolation insulating films PT, the gate electrode G1 is substantially divided along the gate width. Since a mask high in machining precision is used to form each partial trench isolation insulating film PT, however, the gate electrode G1 can be divided accurately according to the design value. Thus, a semiconductor device is obtained in which the gate width variation and the variation of the operation characteristics are prevented.

By employing the configuration in which the greater part of the drain regions 13A, 23A is surrounded by the full trench isolation insulating film FT, the junction area of the PN junction is correspondingly reduced, and therefore both the parasitic junction capacitance in the drain regions 13A, 23A can be reduced and the reduction in the operation speed of the MOS transistor can be prevented.

On the other hand, the side surface of each source region 12 of the PMOS transistor P4 is in contact with the partial trench isolation insulating film PT and the body-tied region 14. Also, the side surface of each source region 22 of the NMOS transistor N4 is in contact with the partial trench isolation insulating film PT and the body-tied region 24. Therefore, the junction area of the PN junction in the source regions 12, 22 and the parasitic junction capacitance are increased thereby to stabilize the power supply.

Further, the partial trench isolation insulating film PT is formed in contact with the side surface of the body-tied region 14 opposite to the gate electrode G1, and the body-tied region 14 is surrounded by the partial trench isolation insulating film PT. In the case where the wiring layer M1 is formed on the partial trench isolation insulating film PT, therefore, the parasitic capacitance of the wiring layer M1 can be further increased, and the power supply stabilized.

The area in which the partial trench isolation insulating film PT is formed in the drain regions 13A, 23A is minimized, so that the parasitic capacitance of the wiring layer M1 can be suppressed, while at the same time preventing the reduction in the operation speed of the MOS transistor.

D-3. First Application

Figure 31:
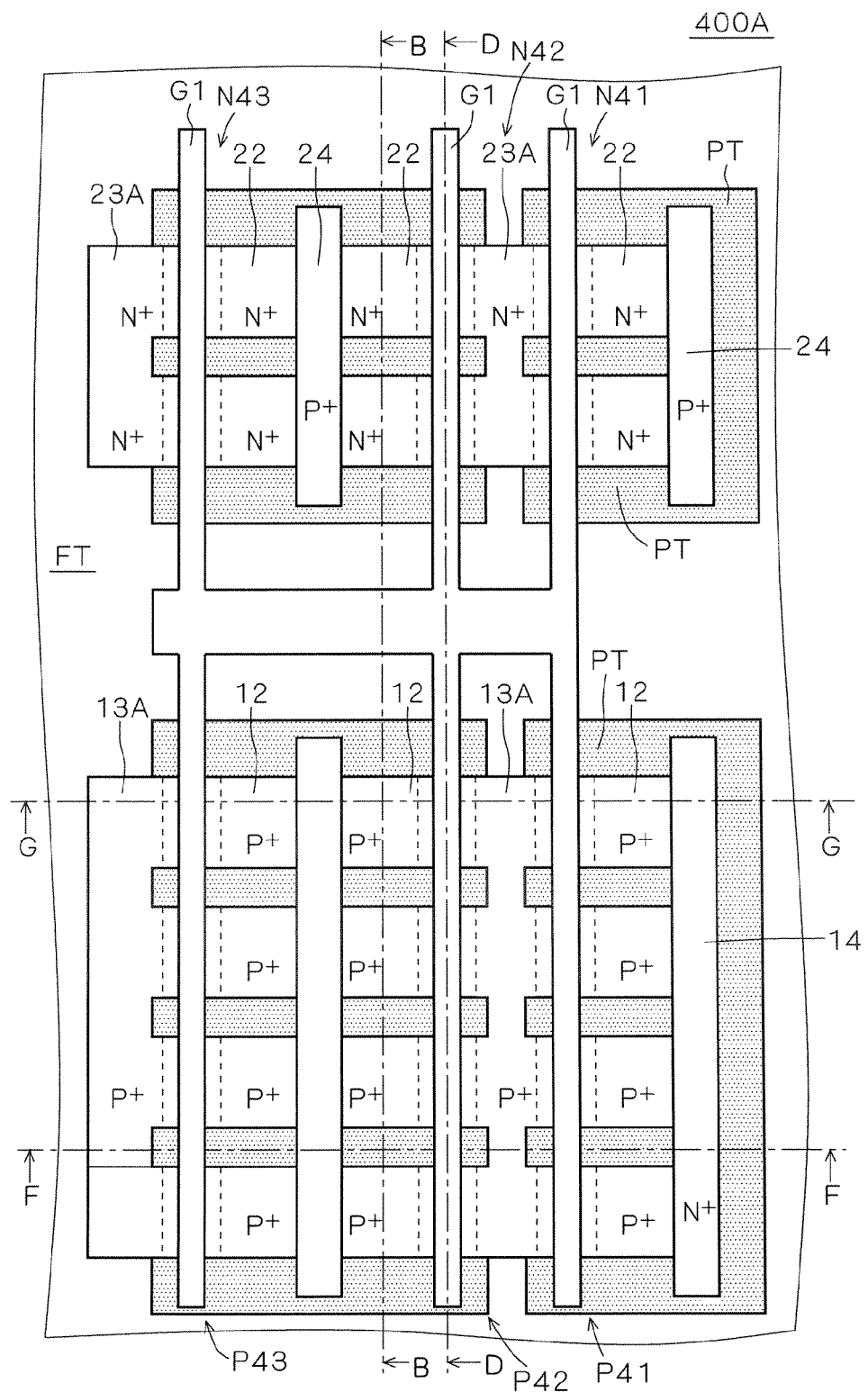
FIG. 31 is a plan view for explaining the configuration of a first application of the semiconductor device according to the fourth embodiment of the invention.

The semiconductor device 400 described above has an arrangement of the PMOS transistor P4 and the NMOS transistor N4 connected to a common gate electrode G1. FIG. 31 shows, as a first application, the configuration of the semiconductor device 400A having three arrangements of transistor sets including an arrangement having the PMOS transistor P41 and the NMOS transistor N41 (first set), an arrangement having the PMOS transistor P42 and the NMOS transistor N42 (second set) and an arrangement having the PMOS transistor P43 and the NMOS transistor N43 (third set), each set being connected to a common gate electrode G1.

Figure 32:
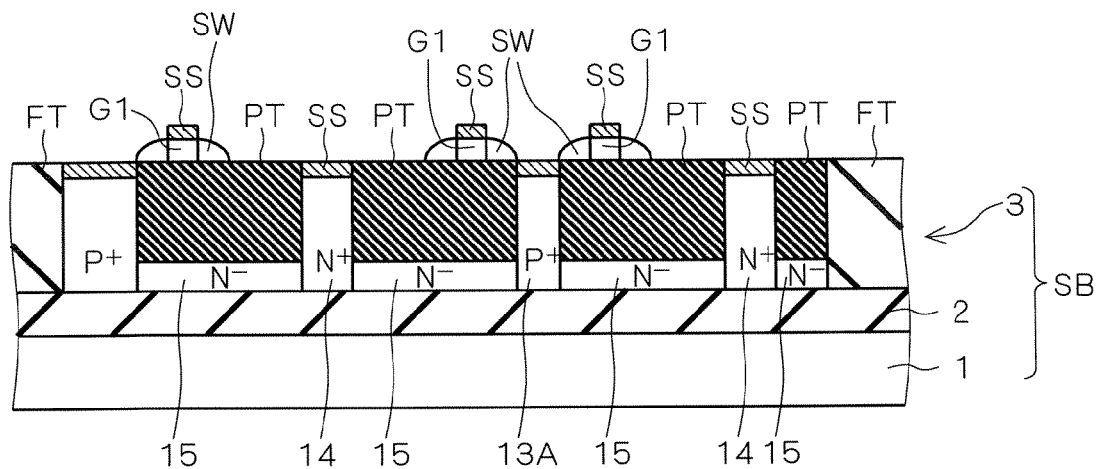
FIGS. 32 and 33 are sectional views for explaining the configuration of the first application of the semiconductor device according to the fourth embodiment of the invention.
Figure 33:
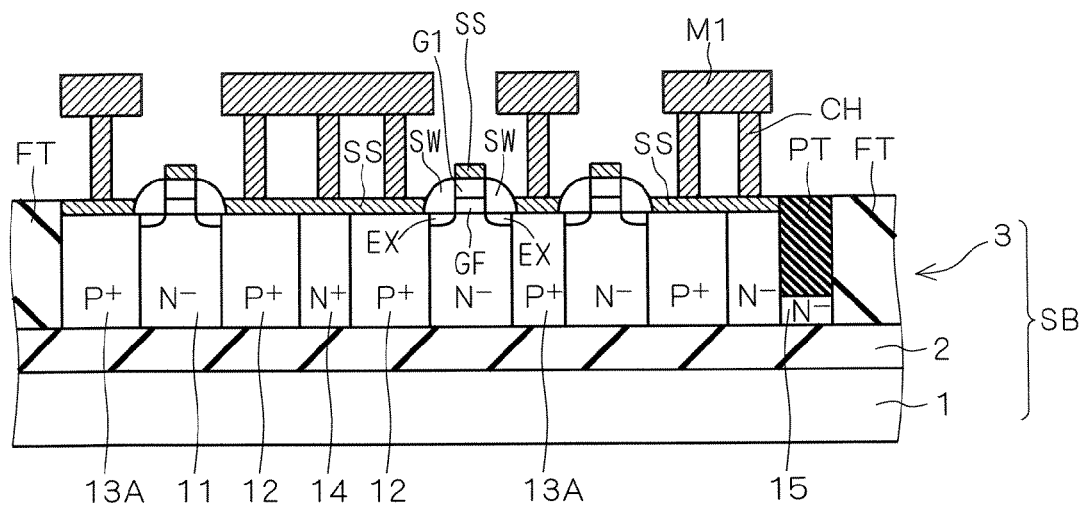

In the semiconductor device 400A shown in FIG. 31, the same component parts as those of the semiconductor device 10OA in FIG. 6 are designated by the same reference numerals, respectively, and not explained again. Also, the sectional views taken in lines F-F and G-G in FIG. 31 are shown in FIGS. 32 and 33, respectively. The sectional configuration along lines B-B and D-D are identical with that shown in FIGS. 13, 14.

As shown in FIG. 31, the drain regions 13A, 23A are shared by the first and second sets, and the body-tied regions 14, 24 by the second and third sets.

Also, as shown in FIG. 31, the PMOS transistors P41, P42 share the drain region 13A, and as shown in FIGS. 32, 33, the drain region 13A is covered by a silicide film 33. This is also the case with the drain region 23A of the NMOS transistors N41, N42.

By employing this configuration, a configuration is obtained, with a minimum layout area, in which the PMOS transistors P41 to P43 are connected in parallel to each other and so are the NMOS transistors N41 to N43 in the first to third sets.

Figure 34:
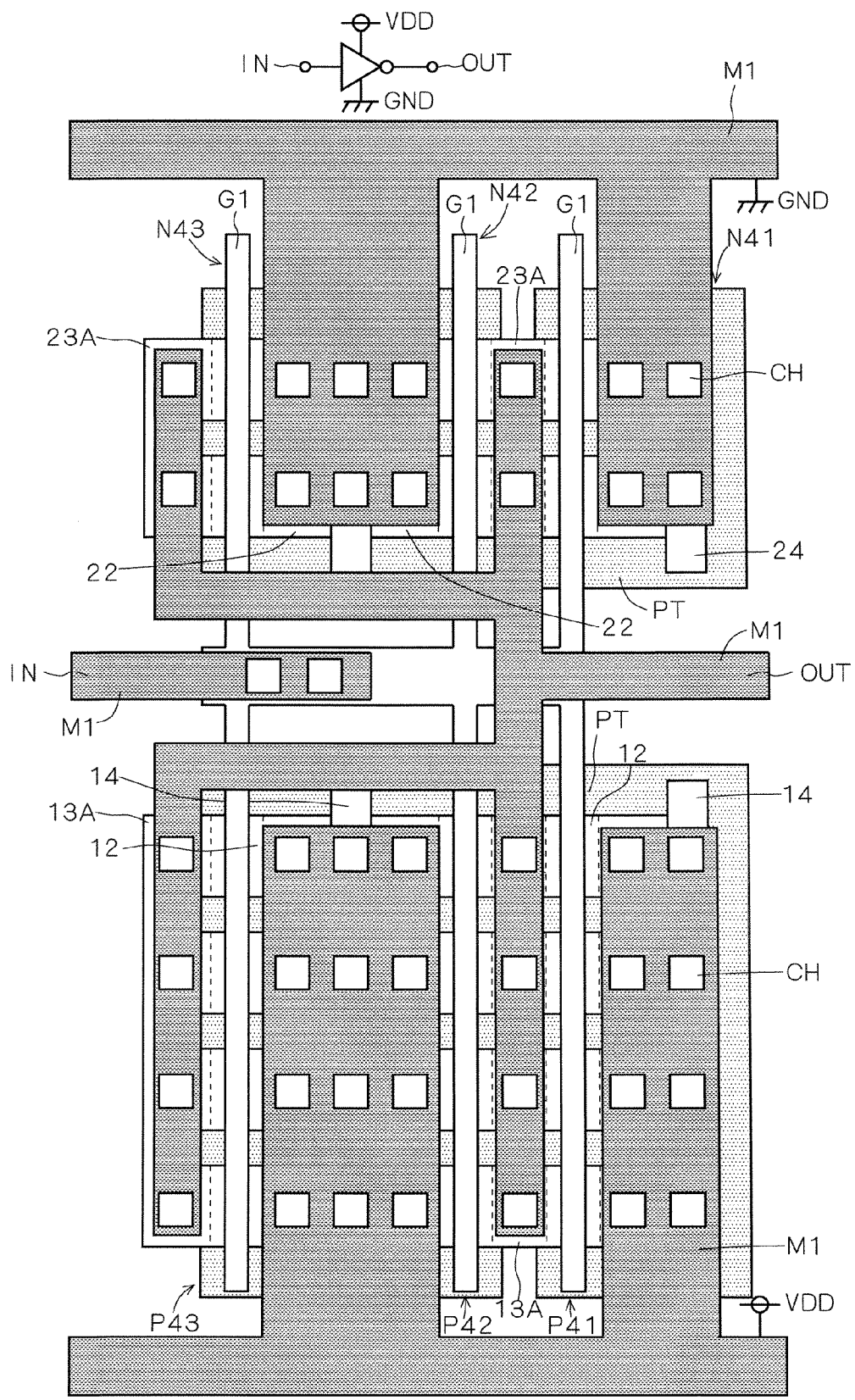
FIGS. 34 to 36 are plan views showing a layout pattern of the wiring layer of the first application of the semiconductor device according to the fourth embodiment of the invention.

Now, an example of the layout pattern of the wiring layer M1 formed as an upper layer of the semiconductor device 400A is shown in FIG. 34.

As shown in FIG. 34, the drain region 13A of the PMOS transistors P41 to P43 and the drain region 23A of the NMOS transistors N41 to N43 are each connected to the corresponding wiring layer M1 through the contact holes CH, and the wiring layer M1 is connected to the output terminal OUT.

A plurality of the source regions 12 of the PMOS transistors P41 to P43 and the body-tied region 14 are each connected to the corresponding wiring layer M1 through the contact holes CH, and the wiring layer M1 is connected to the source potential VDD. A plurality of the source regions 22 of the NMOS transistors N41 to N43 and the body-tied region 24, on the other hand, are connected to the wiring layer M1 through the contact holes CH, and the wiring layer M1 is connected to the grounding potential GND.

Also, a plurality of the gate electrodes G1 are all connected to the wiring layer M1, which in turn is connected to the input terminal IN.

This wiring pattern enables the semiconductor device 400A to function as an inverter. In FIG. 34, the inverter is also designated by a circuit symbol.

Figure 35:
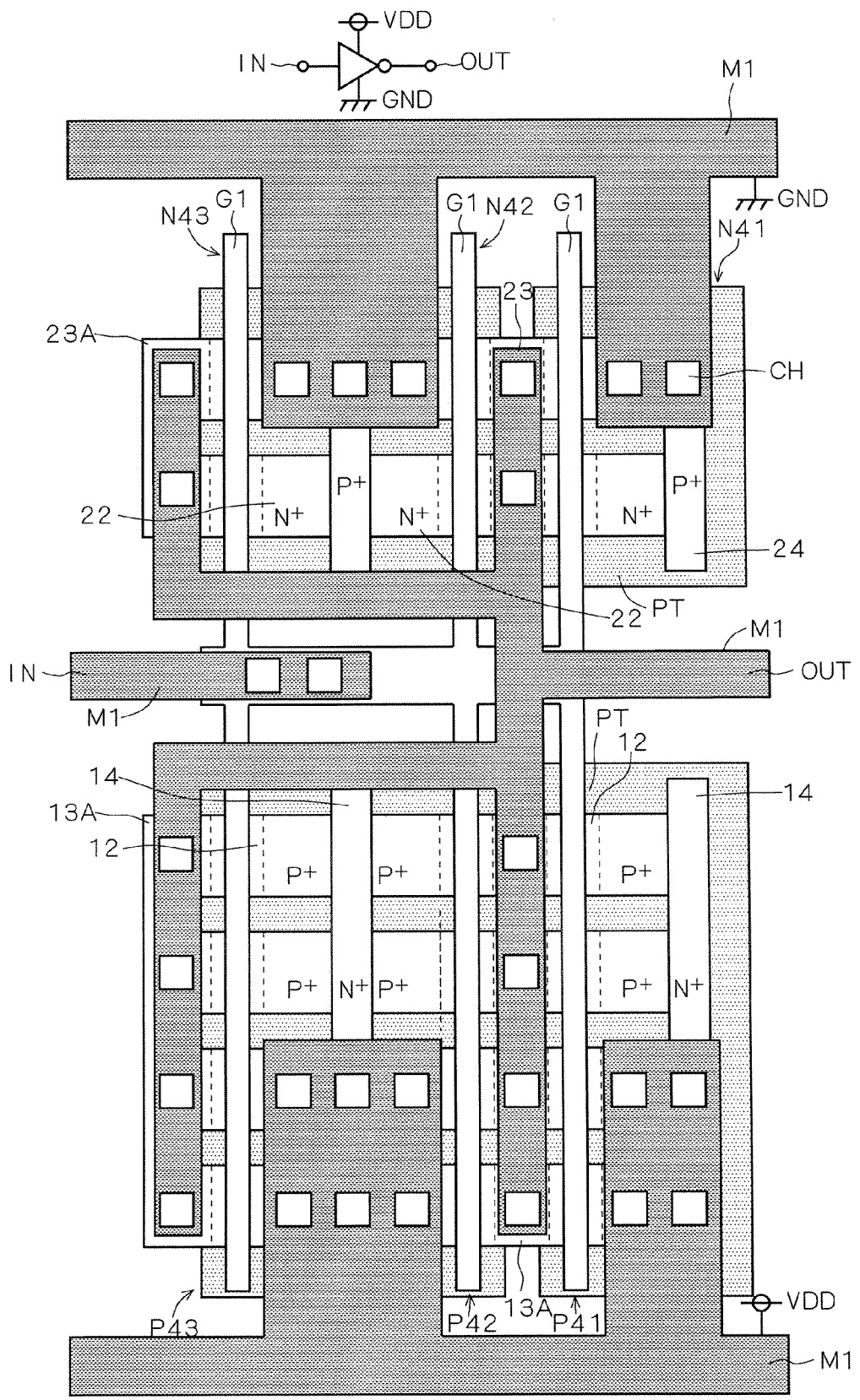

FIG. 35 shows another example of the layout pattern of the wiring layer M1 formed as an upper layer of the semiconductor device 400A.

The wiring pattern shown in FIG. 35 is basically the same as the layout pattern of the wiring layer M1 shown in FIG. 34, in which the semiconductor device 400A is used as an inverter. Nevertheless, only a part of the plurality of the source regions 12 of the PMOS transistors P41 to P43 and the plurality of the source regions 22 of the NMOS transistors N41 to N43 is connected to the wiring layer M1 through the contact holes CH, while the remaining source regions 12, 22 are not connected to the wiring layer M1.

All the source regions 12, 22 of the transistors, as shown in FIG. 33, are covered with a common silicide film SS and electrically connected to each other. By connecting a part of them to the wiring layer M1 electrically, therefore, all the source regions of the transistors are electrically connected to the wiring layer M1.

Figure 36:
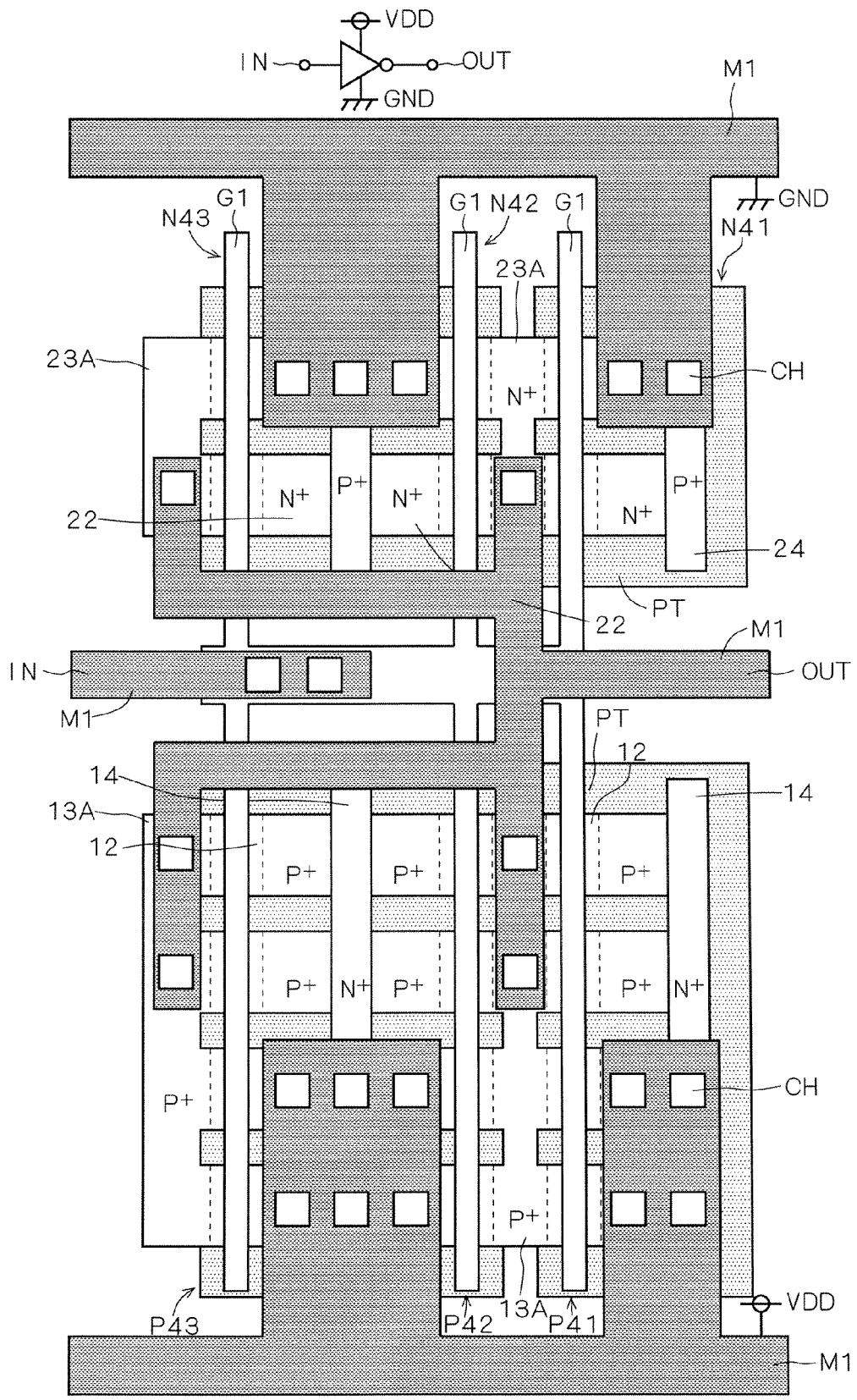

FIG. 36 shows still another example of the layout pattern of the wiring layer M1 formed as an upper layer of the semiconductor device 400A.

The wiring pattern in FIG. 36 is basically the same as the layout pattern of the wiring layer M1 shown in FIG. 35. In the drain region 13A of the PMOS transistors P41 to P43 and the drain region 23A of the NMOS transistors N41 to N43, however, an upper part thereof is covered by the wiring layer M1 and the drain regions 13A, 23A just under the wiring layer M1 are connected to the wiring layer M1 through the contact holes CH, while the other parts of the drain regions 13A, 23A are not connected to the wiring layer M1.

The drain regions 13A, 23A of the transistors are not divided, and as shown in FIG. 33, covered with the silicide film SS. By connecting a part thereof to the wiring layer M1 electrically, therefore, the drain regions of the transistors are electrically connected to the wiring layer M1.

D-4. Second Application

Figure 37:
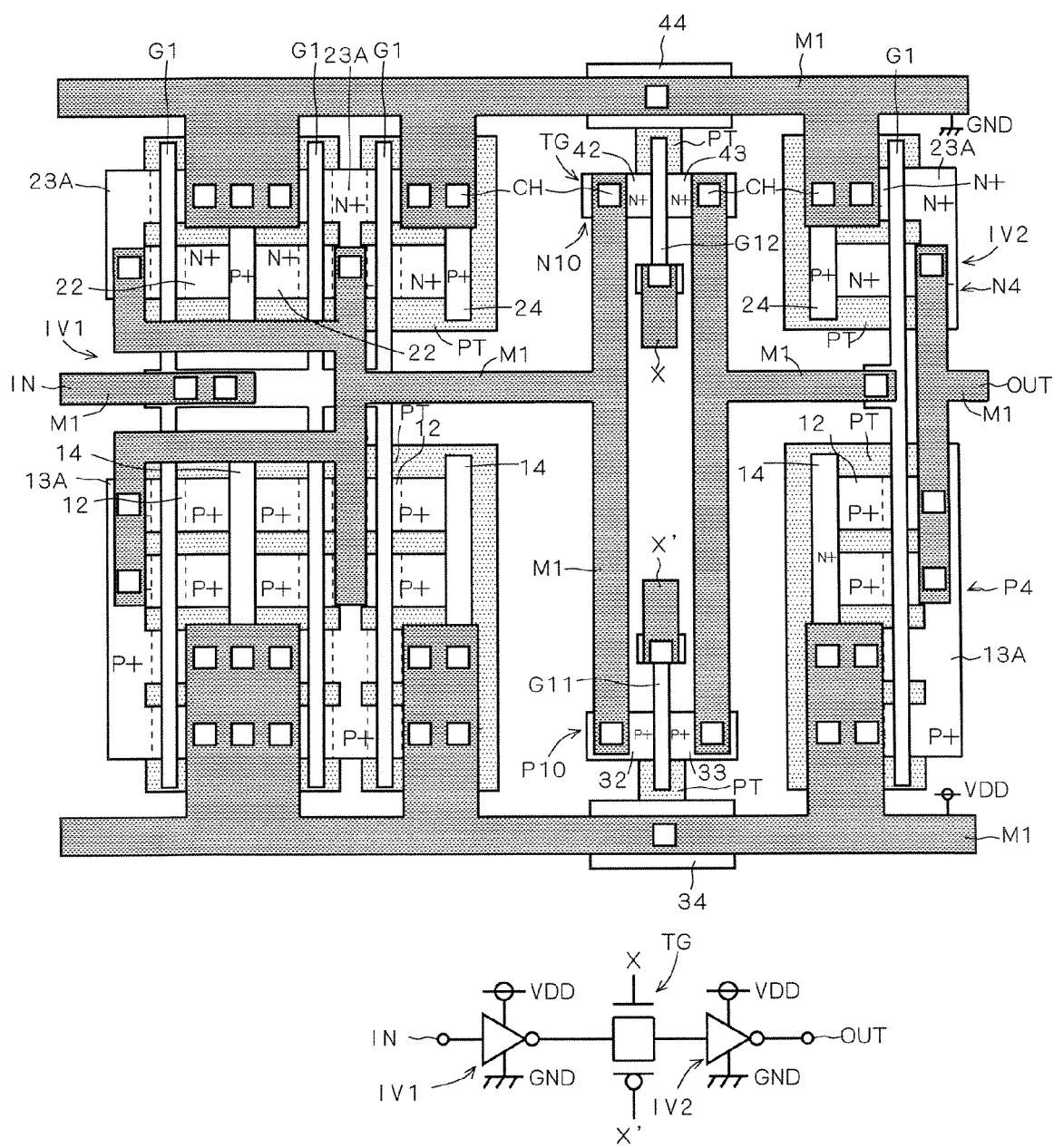
FIG. 37 is a plan view for explaining the configuration of a second application of the semiconductor device according to the fourth embodiment of the invention.

The configuration shown in FIG. 37 is also considered a second application of the semiconductor device 400. Specifically, in the example shown in FIG. 37, the semiconductor device 400A shown in FIG. 31 is used as an inverter IV1, and the semiconductor device 400 shown in FIG. 26 as an inverter IV2.

The inverter IV1 shown in FIG. 37 is obtained by arranging the wiring layer M1 of the pattern described with reference to FIG. 36 in the semiconductor device 400A shown in FIG. 31. In FIG. 37, the same component parts are designated as those in FIG. 36. The wiring layer M1 connected by both the drain region 13A of the PMOS transistors P41 to P43 and the drain region 23A of the NMOS transistors N41 to N43 constitutes the output terminal of the inverter IV1.

In the inverter IV2, on the other hand, the drain region 13A of the PMOS transistor P4 and the drain region 23A of the NMOS transistor N4 are each connected to the wiring layer M1 through the contact holes CH, and the wiring layer M1 is connected to the output terminal OUT.

Also, a part of the plurality of the source regions 12 of the PMOS transistor P4 and the body-tied region 14 is connected to the wiring layer M1 through the contact holes CH, and the wiring layer M1 is connected to the source potential VDD.

A part of the plurality of the source regions 22 of the NMOS transistor N4 and the body-tied region 24 is connected to the wiring layer M1 through the contact holes CH, and the wiring layer M1 is connected to the grounding potential GND. Also, all the gate electrodes G1 are connected to the wiring layer M1, which in turn constitutes an input terminal of the inverter IV2.

A transmission gate TG is formed between the output of the inverter IV1 and the input of the inverter IV2.

The transmission gate TG has a PMOS transistor P10 and a NMOS transistor N10, with the source regions 32, 42 connected to the wiring layer M1 through the contact holes CH, which wiring layer M1 connected to the output terminal of the inverter IV1. Also, the drain regions 33, 43 are both connected to a common wiring layer M1 through the contact holes CH, and the wiring layer M1 is connected to the input terminal of the inverter IV2.

The gate electrodes G11, G12 of the PMOS transistor P10 and the NMOS transistor N10 are formed in parallel to the gate electrode G1 of the inverters IV1, IV2. One end portion of the gate electrode G11 is supplied with a gate input X' through the contact hole CH, and one end portion of the gate electrode G12 supplied with a gate input X through the contact hole CH.

The body regions of the PMOS transistor P10 and the NMOS transistor N10 are electrically connected to the body-tied regions 34, 44 formed outside the other end portions of the gate electrodes G11, G12, respectively.

Specifically, the partial trench isolation insulating film PT is formed between the other end portions of the gate electrodes G11, G12 and the body-tied regions 34, 44, and carriers can be moved through the well region existing under the partial trench isolation insulating film PT.

The body-tied region 34 is connected through the contact hole CH to the wiring layer M1 for supplying the source potential VDD, and the body-tied region 44 is connected through the contact hole CH to the wiring layer M1 for supplying the grounding potential GND.

In FIG. 37, the inverters IV1, IV2 and the transmission gate TG are also designated by circuit symbols.

D-5. Third Application

The configuration shown in FIG. 38 is conceivable as a third application of the semiconductor device 400. Specifically, FIG. 38 shows an example in which the semiconductor device 400A shown in FIG. 31 is used as the inverter IV1, and the inverter IV3 is configured using the conventional MOS transistor having the source-tied structure.

The inverter IV1 and the transmission gate TG shown in FIG. 38 have the same configuration as those described with reference to FIG. 37 and therefore are not described again.

The inverter IV3 shown in FIG. 38 has a PMOS transistor P20 and a NMOS transistor N20 sharing the gate electrode G13.

The body-tied region 104 containing N-type impurities relatively high in concentration is selectively formed in the surface of the source region 102 of the PMOS transistor P20.

In similar fashion, the body-tied region 204 containing P-type impurities relatively high in concentration is selectively formed in the surface of the source region 202 of the NMOS transistor N20.

The body-tied regions 104, 204 are formed in contact with the body region existing under the gate electrode G13 and can fix the potential of the body region.

Though not shown, the surfaces of the source regions 102, 202 including the surfaces of the body-tied regions 104, 204 are covered with a silicide film, and by connecting the source regions 102, 202 to the source potential VDD and the grounding potential GND, respectively, the potential of the body regions of the PMOS transistor P20 and the NMOS transistor N20 can be fixed.

Also, in the inverter IV3, the drain region 103 of the PMOS transistor P20 and the drain region 203 of the NMOS transistor N20 are each connected to the wiring layer M1 through the contact hole CH and the wiring layer M1 is connected to the output terminal OUT.

The gate electrodes G1 are all connected to the wiring layer M1, which makes up the input terminal of the inverter IV3.

The partial trench isolation insulating film PT is formed in such a manner as to surround the source regions 102, 204, and the body regions of the PMOS transistor P20 and the NMOS transistor N20 are electrically connected to the body-tied regions 34A, 44A formed outside of the end portion of the gate electrode G13.

Specifically, the partial trench isolation insulating film PT is formed between the two end portions of the gate electrode G13 and the body-tied regions 34A, 44A, and carriers can be moved through the well region existing under the partial trench isolation insulating film PT.

The body-tied region 34A is connected through the contact hole CH to the wiring layer M1 for supplying the source potential VDD, and the body-tied region 44A is connected through the contact hole CH to the wiring layer M1 for supplying the grounding potential GND.

The body-tied regions 34A, 44A extend to the neighborhood of the transmission gate TG, so that the body regions of the PMOS transistor P10 and the NMOS transistor N10 of the transmission gate TG are electrically connected to each other. This configuration is also employed for connection with the body-tied regions 34, 44 explained with reference to FIG. 37 and therefore not explained any more.

In this way, the potential of the body regions is fixed utilizing the source-tied structure and the partial trench isolation insulating film PT, thereby making it possible to positively fix the potential of the body regions.

D-6. Fourth Application

Figure 39:
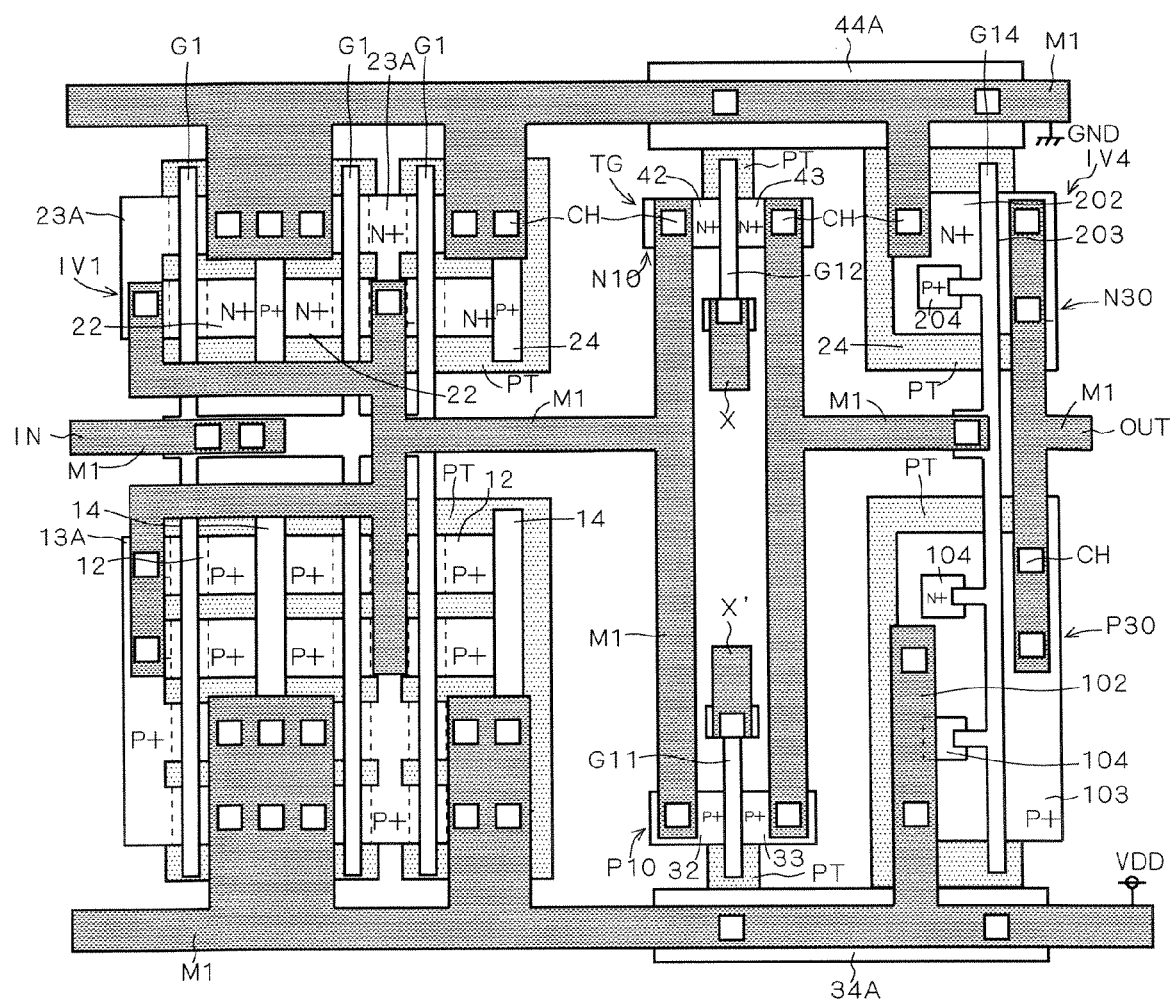
FIG. 39 is a plan view for explaining the configuration of a fourth application of the semiconductor device according to the fourth embodiment of the invention.

The configuration shown in FIG. 39 is conceivable as a fourth application of the semiconductor device 400. Specifically, FIG. 39 shows an example of a configuration in which the semiconductor device 400A shown in FIG. 31 is used as the inverter IV1, and the inverter IV4 is configured of the conventional MOS transistor having the source-tied structure.

The inverter IV1 and the transmission gate TG shown in FIG. 39 have the same configuration as the corresponding parts explained with reference to FIG. 37 and therefore not explained any more.

The inverter IV4 shown in FIG. 39 includes a PMOS transistor P30 and a NMOS transistor N30 having a common gate electrode G14.

The body-tied region 104 containing N-type impurities relatively high in concentration is selectively formed in the surface of the source region 102 of the PMOS transistor P30.

In similar fashion, the body-tied region 204 containing P-type impurities relatively high in concentration is selectively formed in the surface of the source region 202 of the NMOS transistor N30.

The body-tied regions 104, 204 are formed at a position distant from the gate electrode G14, and a branch gate electrode BG branching from the gate electrode G14 exists between the gate electrode G14 and the body-tied regions 104, 204.

The branch gate electrode BG has the same structure as the gate electrode G13, and the body-tied regions 104, 204 are formed in contact with the body region existing under the branch gate electrode BG, thereby making it possible to fix the potential of the body region.

Though not shown, the surfaces of the source regions 102, 202 including the surfaces of the body-tied regions 104, 204 are covered with a silicide film. By connecting the source regions 102, 202 to the source potential VDD and the grounding potential GND, respectively, the potential of the body regions of the PMOS transistor P30 and the NMOS transistor N30 can be fixed. The other component parts are identical with those shown in FIG. 38 and therefore not explained any more.

By employing this configuration, the potential of the body regions can be positively fixed even in the case where the gate length of the gate electrode G13 is fine and the body-tied regions 104, 204 and the body regions cannot be brought into direct contact with each other for the reason of machining accuracy.

E. Fifth Embodiment

E-1. Device Configuration

The configuration of the semiconductor device 500 according to a fifth embodiment of the invention is explained below with reference to FIGS. 40 to 44.

Figure 40:
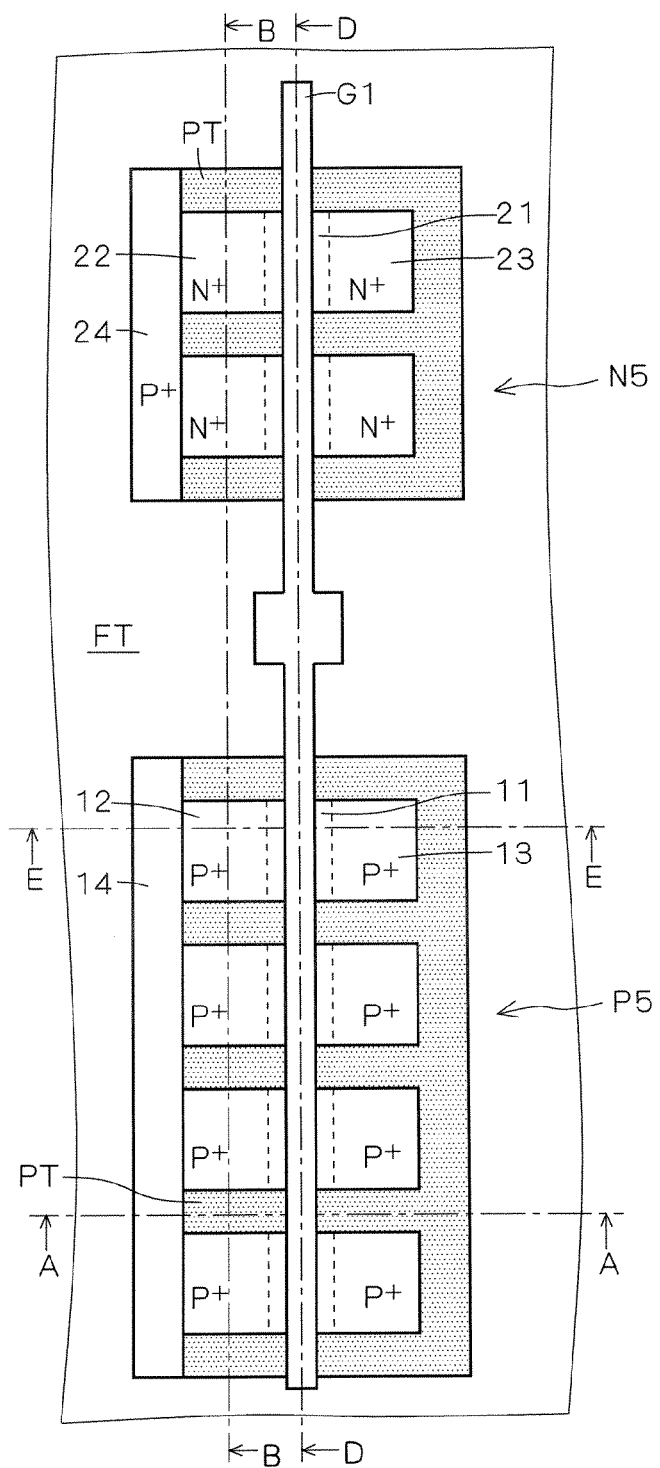
FIG. 40 is a plan view for explaining a configuration of a semiconductor device according to a fifth embodiment of the invention.

FIG. 40 is a plan view showing the configuration of the semiconductor device 500. The sectional views taken in lines A-A, B-B, D-D and E-E in FIG. 40 are shown in FIGS. 41, 42, 43 and 44, respectively. The same component parts as those in the semiconductor device 100 shown in FIGS. 1 to 5 are designated by the same reference numerals, respectively, and not explained again.

The semiconductor device 500 shown in FIG. 40 includes a PMOS transistor P5 and a NMOS transistor N5, which share the connection with the gate electrode G1.

In the PMOS transistor P5, the source-drain region is divided into four parts along the gate width thereby to form an arrangement of four independent source regions 12 and an arrangement of four independent drain regions 13.

The partial trench isolation insulating film PT is formed in contact with the whole of the opposed side surfaces between the adjacent ones of the four source regions 12. The partial trench isolation insulating film PT is formed also outside the source regions 12 provided at the ends of each arrangement.

The body-tied region 14 containing N-type impurities relatively high in concentration (N+) is formed in contact with the side surface of the source region 12 opposite to the gate electrode G1. This body-tied region 14 is in contact with the side surfaces of the four source regions 12 and also with the side surface of the partial trench isolation insulating film PT on the opposite side of the gate electrode G1. Thus, the body-tied region 14 extends in parallel to the gate electrode G1.

The partial trench isolation insulating film PT is formed also between the adjacent ones of the four drain regions 13 and outside the drain regions 13 provided at the ends of the arrangement. The partial trench isolation insulating films PT outside the drain regions are formed on the outer periphery of the MOS transistor, and therefore sometimes called the outer peripheral partial trench isolation insulating film.

The partial trench isolation insulating film PT is formed in contact with the side surface of the drain region 13 opposite to the gate electrode G1. This partial trench isolation insulating film PT is in contact with the side surfaces of the four drain regions 13 and also with the side surface of the partial trench isolation insulating film PT formed between each adjacent ones of the four drain regions 13 and the side surfaces of the partial trench isolation insulating films PT formed outside the arrangement of the drain regions. As a result, the four drain regions 13 are surrounded by the partial trench isolation insulating film PT.

In the NMOS transistor N5, the source-drain region is divided into two parts along the gate width thereby to form an arrangement of two independent source regions 22 and an arrangement of two independent drain regions 23.

The partial trench isolation insulating film PT is formed in contact with the whole of the opposed side surfaces between the two source regions 22 on the one hand and also outside the source regions 22 at the ends of the arrangement.

The body-tied region 24 containing P-type impurities relatively high in concentration (P+) is formed in contact with the side surface of the source region 22 on the opposite side of the gate electrode G1. This body-tied region 24 is in contact with the side surfaces of the two source regions 22 and also with the side surface of the partial trench isolation insulating film PT far from the gate electrode G1. Thus, the body-tied region 24 extends in parallel to the gate electrode G1.

Also, the partial trench isolation insulating film PT is formed between the two drain regions 23 and outside the drain regions 23 provided at the ends of the arrangement.

The partial trench isolation insulating film PT is formed in contact with the side surface of the drain region 23 opposite to the gate electrode G1. This partial trench isolation insulating film PT is in contact with the side surfaces of the two drain regions 23 and also with the side surface of the partial trench isolation insulating film PT formed outside the two drain regions 23. As a result, the two drain regions 23 are surrounded by the partial trench isolation insulating film PT.

Figure 41:
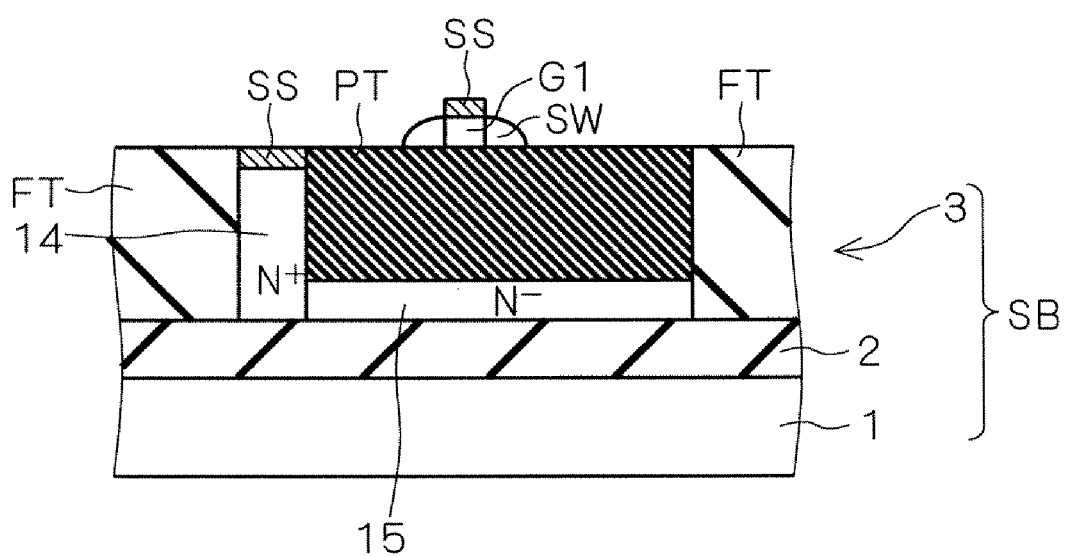
FIGS. 41 to 44 are sectional views for explaining a configuration of a semiconductor device according to the fifth embodiment of the invention.
Figure 42:
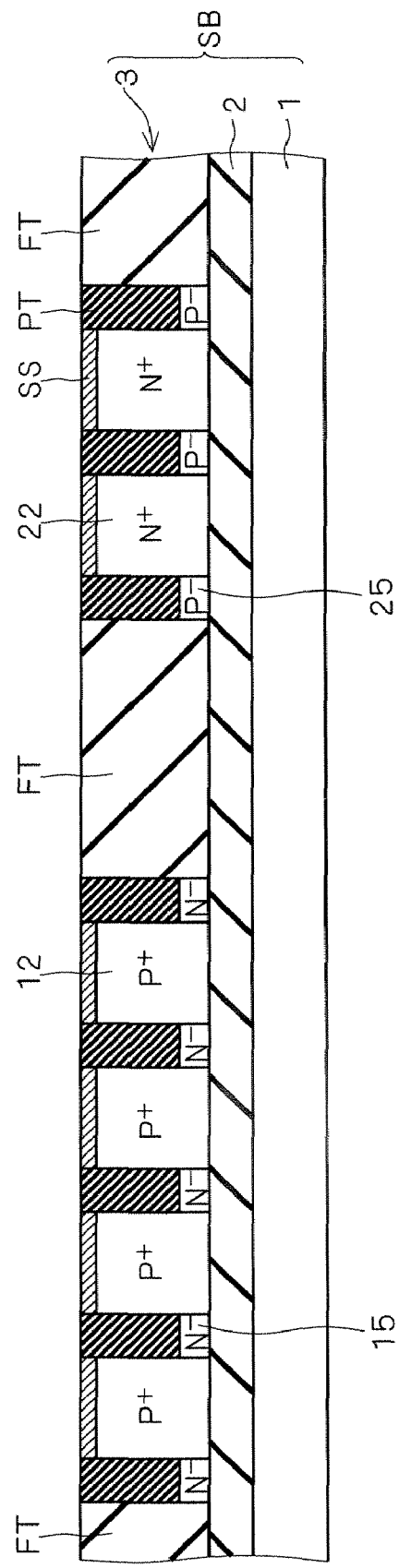
Figure 43:
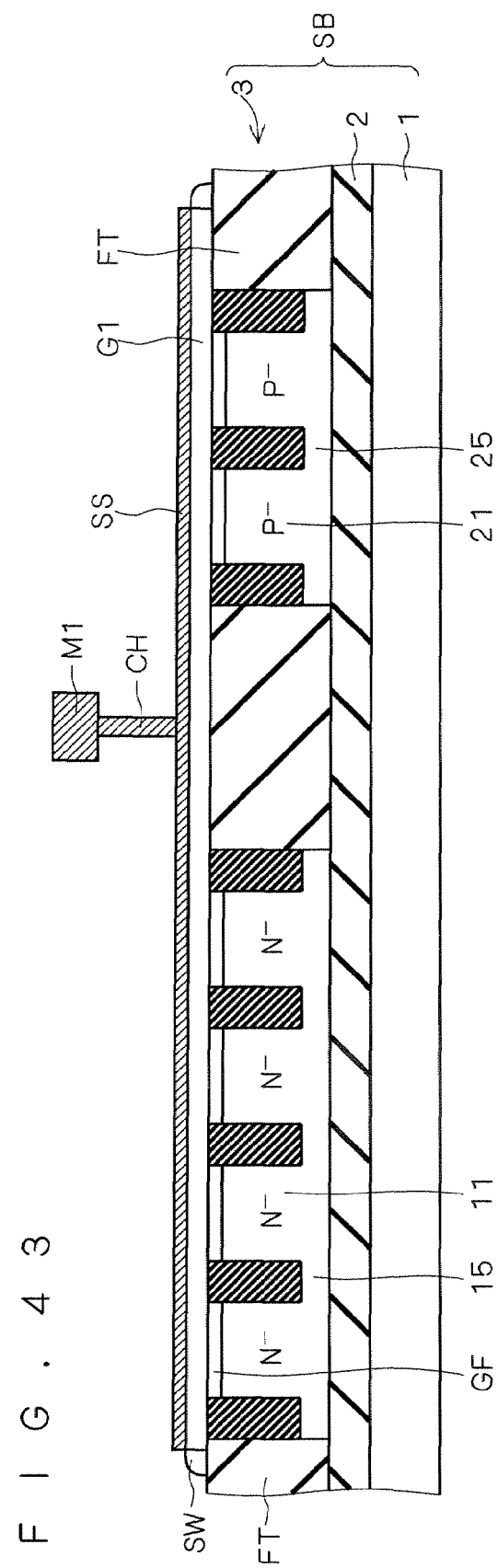
Figure 44:
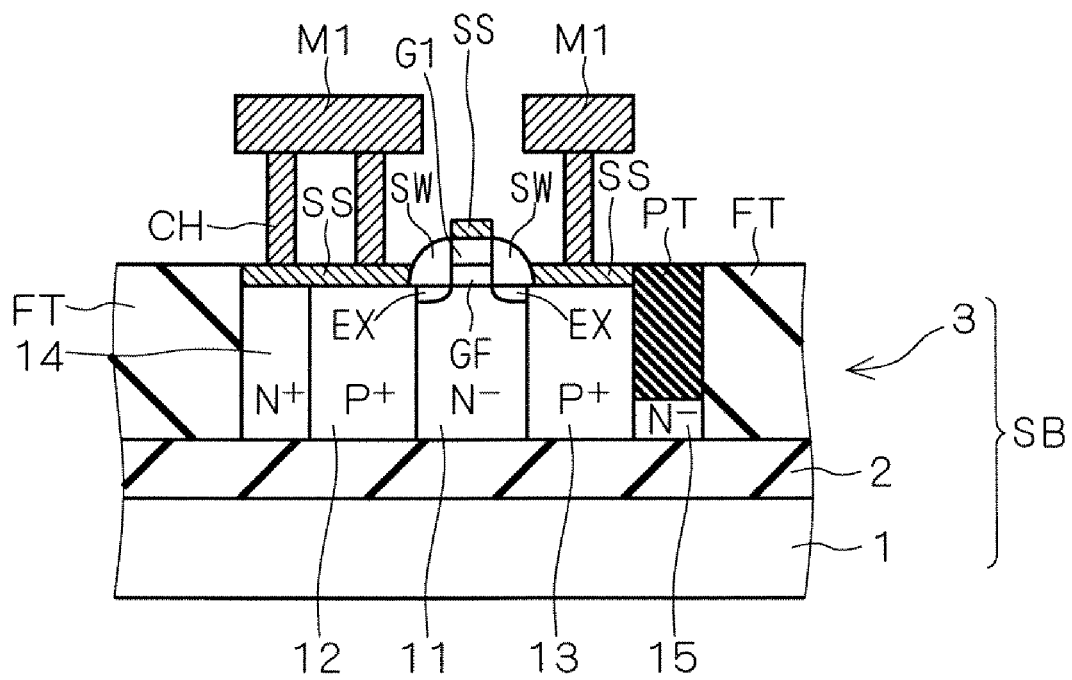

As shown in FIG. 41, the body-tied region 14 of the PMOS transistor P5 is formed to reach the buried oxide film 2 from the surface of the SOI layer 3, and in contact with the well region 15 containing N-type impurities relatively low in concentration (N−) existing in a layer lower than the partial trench isolation insulating film PT.

The well region 15 exists in a layer lower than the partial trench isolation insulating film PT, and in the semiconductor device 500, the drain regions 13, 23 are surrounded by the partial trench isolation insulating film PT. Therefore, the well region 15 exists around the drain regions 13, 23.

E-2. Effects

As explained above, in the semiconductor device 500, the source-drain region of the MOS transistor is divided along the gate width. Thus, in the PMOS transistor P5 and the NMOS transistor N5, like in the semiconductor device 100 explained with reference to FIGS. 1 to 5, the potential of the body regions 11, 21 can be positively fixed, and a kink can be suppressed while at the same time improving the operation withstanding voltage.

The source-drain region is divided by the partial trench isolation insulating film PT and the full trench isolation insulating film FT thereby to divide the gate electrode G1 substantially along the gate width. Since a mask having a high machining precision is used to form the trench isolation insulating film, however, the gate electrode G1 can be divided accurately according to the design value. Thus, the variation in gate width can be prevented and a semiconductor device free of the variation in operation characteristics is obtained.

Also, since the drain regions 13, 23 are surrounded by the partial trench isolation insulating film PT, the well region 15 can exist around the drain regions 13, 23, and a body-tied region can be formed at an arbitrary position around the drain regions 13, 23. Thus, the potential of the body region can be fixed through the body-tied region.

As a result, the potential of the body region can be fixed from both the source regions 12, 22 and the drain regions 13, 23, and the floating of the body region is positively prevented. Thus, the generation of a capacitance component which otherwise might be caused by the floating of the body region is prevented.

The side surface of each source region 12 of the PMOS transistor P5 is in contact with the partial trench isolation insulating film PT and the body-tied region 14. Also, the side surface of each source region 22 of the NMOS transistor N5 is in contact with the partial trench isolation insulating film PT and the body-tied region 24. Therefore, the junction area of the PN junction in the source regions 12, 22 is increased for an increased parasitic junction capacitance. In view of the fact that the increased junction capacitance in the source regions contributes to stable current supply, however, the power supply can be stabilized.

E-3. First Modification

Figure 45:
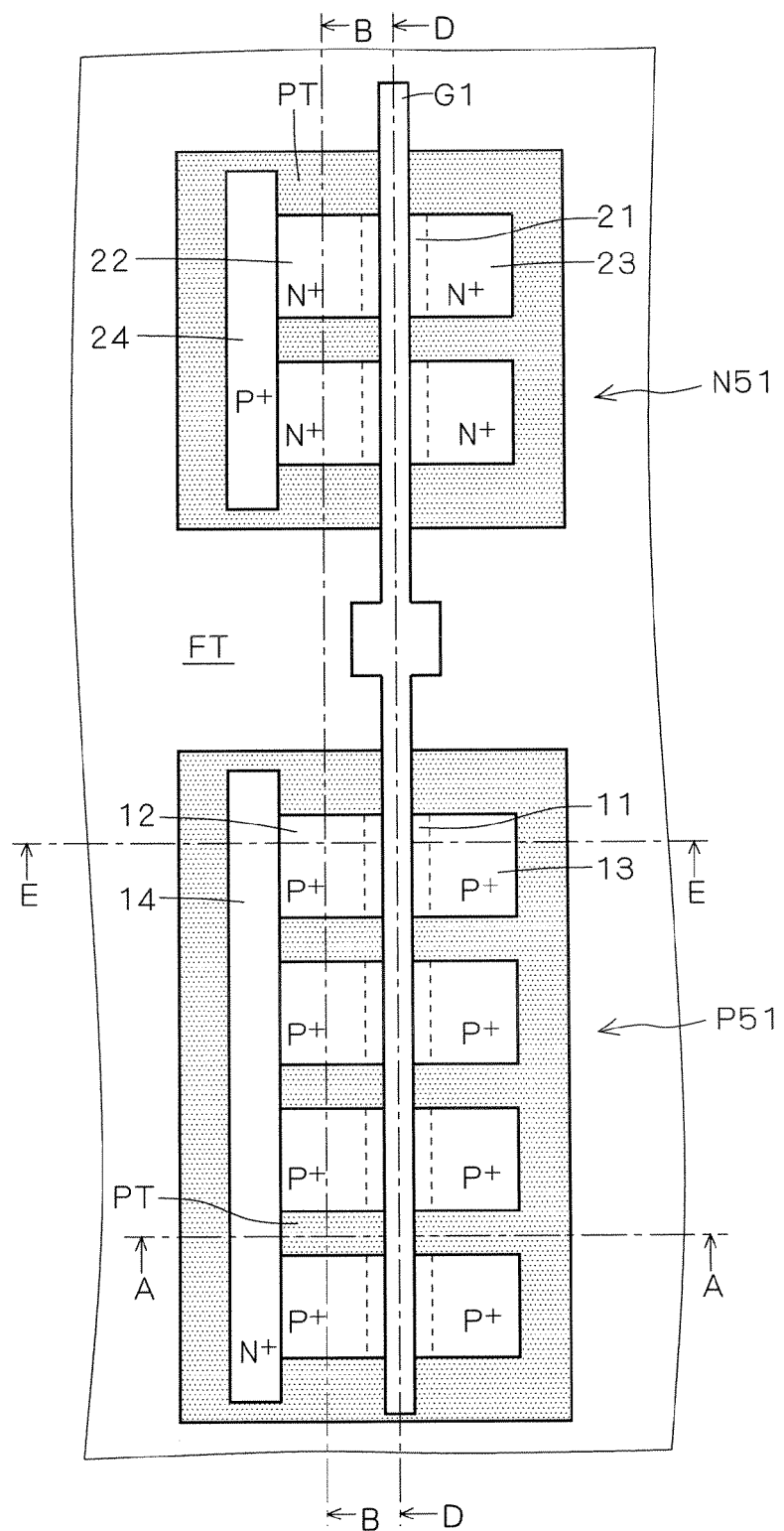
FIG. 45 is a plan view for explaining the configuration of a first modification of the semiconductor device according to the fifth embodiment of the invention.

Next, the configuration of a first modification of the fifth embodiment described above is explained. FIG. 45 is a plan view showing a configuration of the semiconductor device 501. The sectional views taken in lines A-A, B-B, D-D and E-E in FIG. 45 are shown in FIGS. 46, 47, 48 and 49, respectively. The same component parts as those of the semiconductor device 500 shown in FIGS. 40 to 44 are designated by the same reference numerals, respectively, and not described any more.

Figure 46:
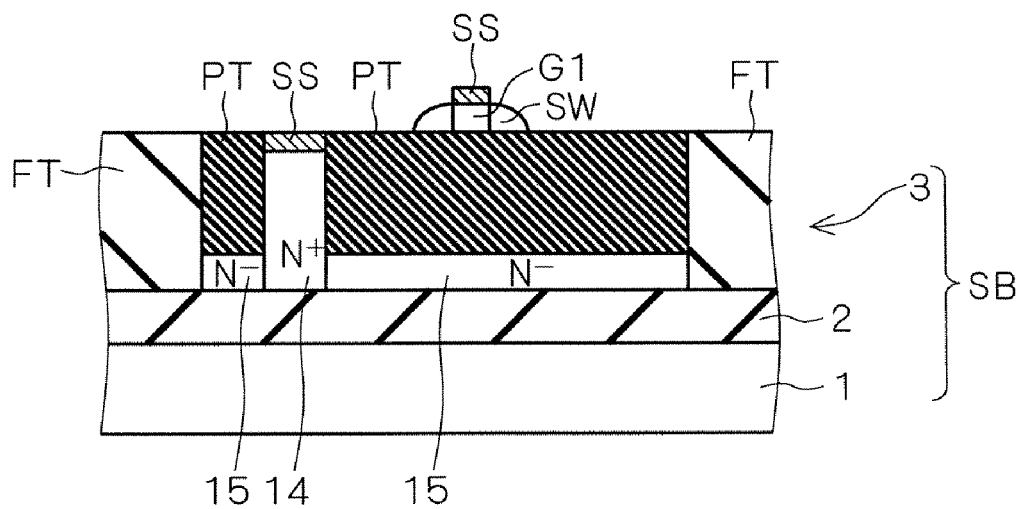
FIGS. 46 to 49 are sectional views for explaining the configuration of the first modification of the semiconductor device according to the fifth embodiment of the invention.
Figure 47:
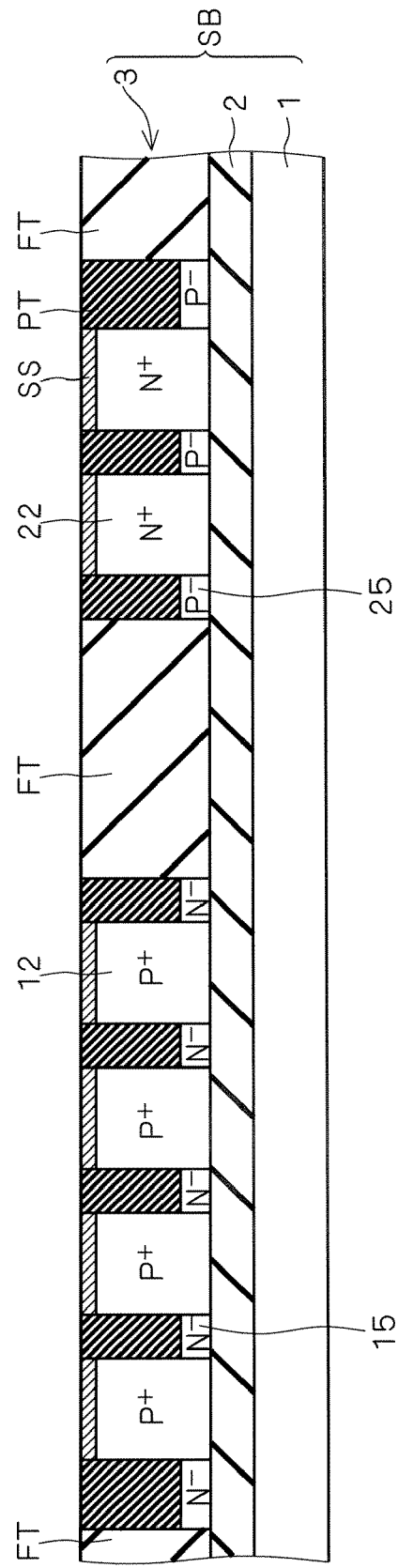
Figure 48:
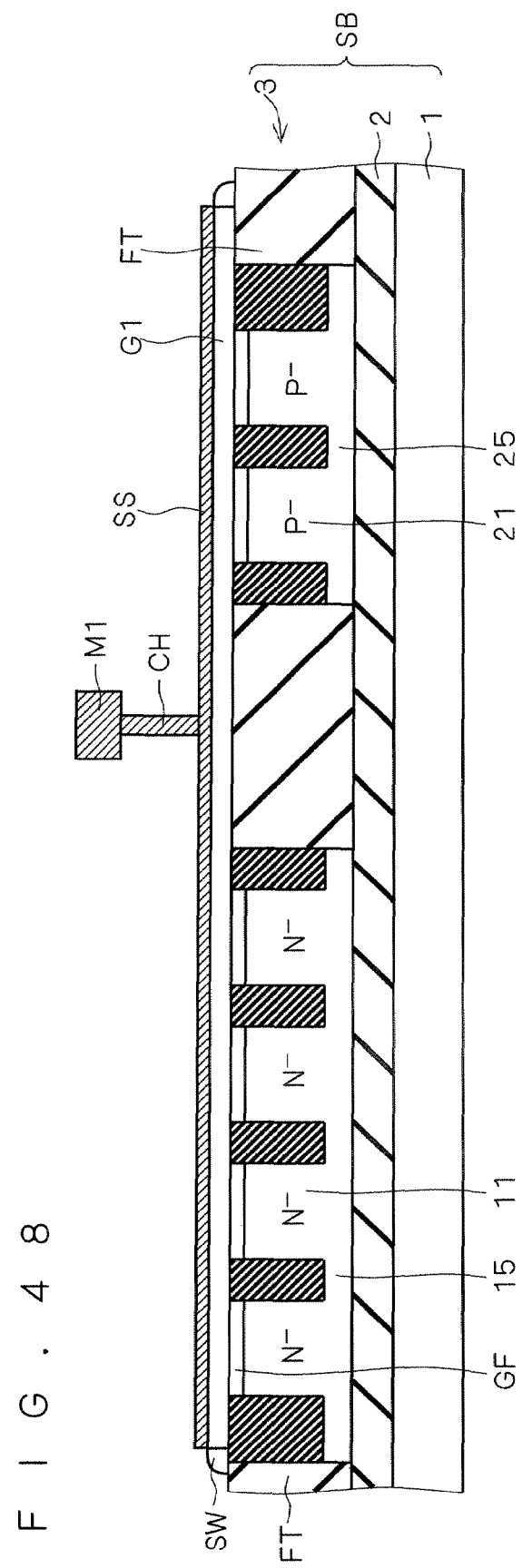
Figure 49:
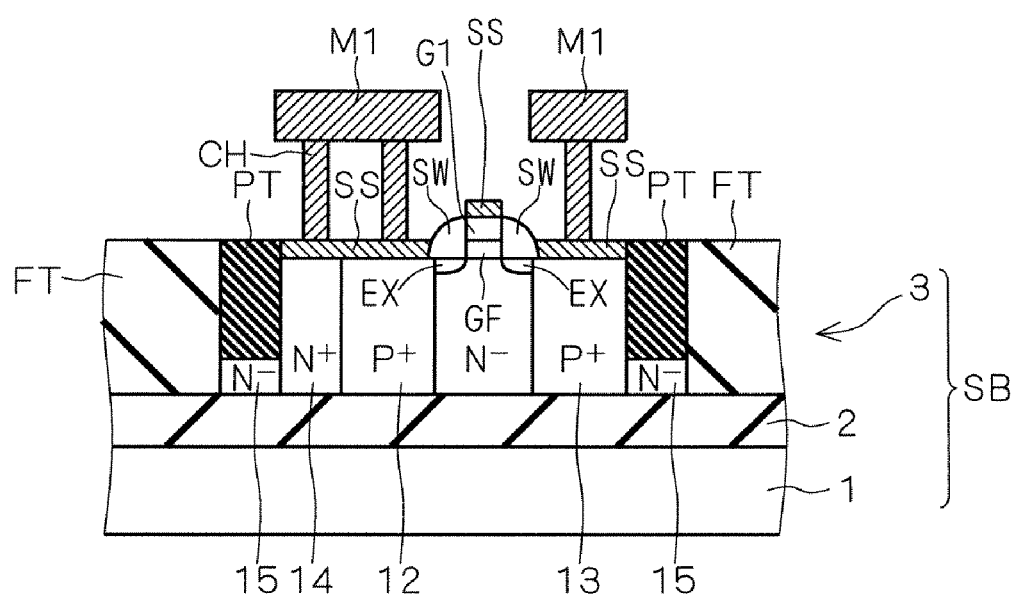

As shown in FIG. 45, the semiconductor device 501 is such that the partial trench isolation insulating film PT is formed in contact with the side surface of the body-tied region 14 of the PMOS transistor P51 far from the gate electrode G1 (FIG. 46), and the body-tied region 14 is surrounded by the partial trench isolation insulating film PT. In the PMOS transistor region, the well region 15 containing N-type impurities relatively low in concentration (N⁻) exists in a layer lower than the partial trench isolation insulating film PT, and as shown in FIG. 46, the body-tied region 14 and the well region 15 are in contact with each other.

In the NMOS transistor N51, the partial trench isolation insulating film PT is formed in contact with the side surface of the body-tied region 24 opposite to the gate electrode G1, and the body-tied region 24 is surrounded by the partial trench isolation insulating film PT. In the NMOS transistor region, the well region 25 containing P-type impurities relatively low in concentration (P⁻) exists in a layer lower than the partial trench isolation insulating film PT, and though not shown, the body-tied region 24 and the well region 25 are in contact with each other.

With this configuration, the side surface of each source region 12 of the PMOS transistor P51 is in contact with the partial trench isolation insulating film PT and the body-tied region 14. Also, the side surface of each source region 22 of the NMOS transistor N51 is in contact with the partial trench isolation insulating film PT and the body-tied region 24. Thus, the junction area of the PN junction in the source regions 12, 22 is increased and so is the parasitic junction capacitance, thereby stabilizing the power supply.

Further, the partial trench isolation insulating film PT is formed in contact with the side surface of the body-tied region 14 opposite to the gate electrode G1, and the body-tied region 14 is surrounded by the partial trench isolation insulating film PT. In the case where the wiring layer M1 is formed on the partial trench isolation insulating film PT, therefore, the parasitic capacitance of the wiring layer M1 can be further increased for stabilized power supply.

E-4. Second Modification

Figure 50:
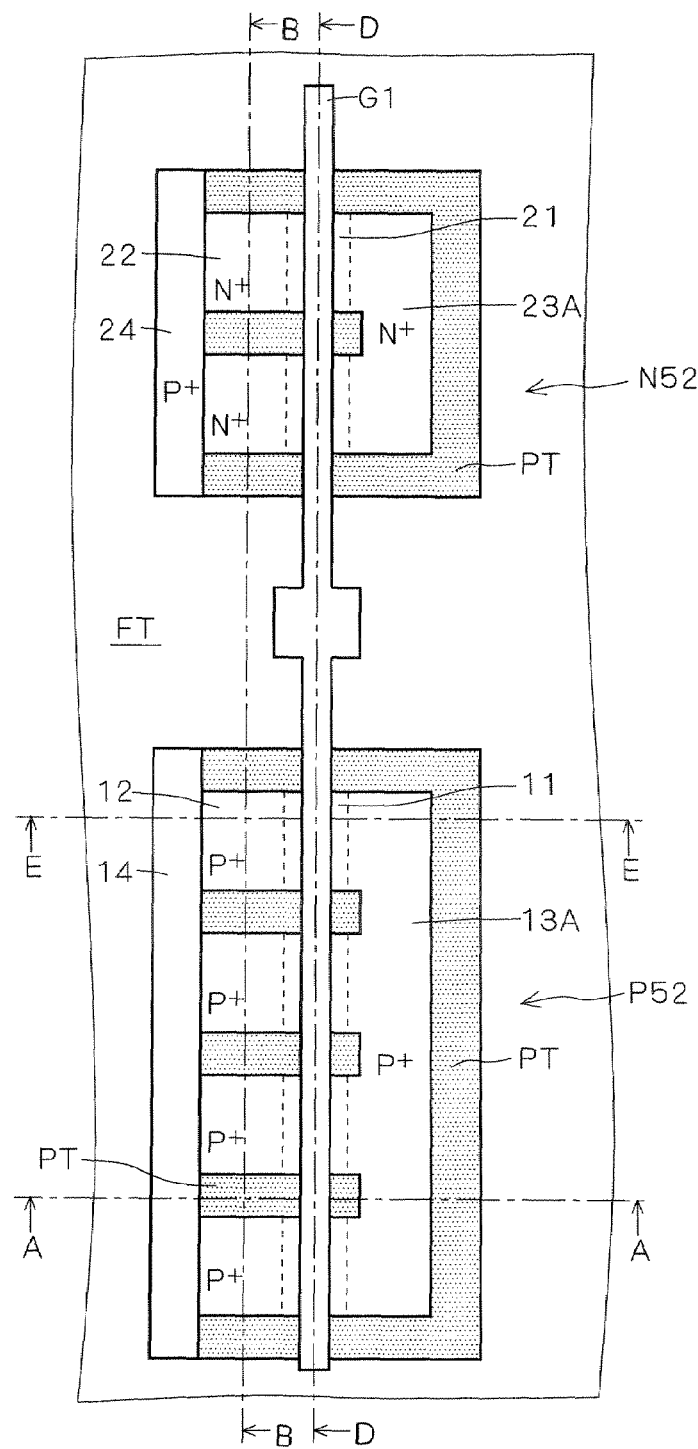
FIG. 50 is a plan view for explaining the configuration of a second modification of the semiconductor device according to the fifth embodiment of the invention.
Figure 51:
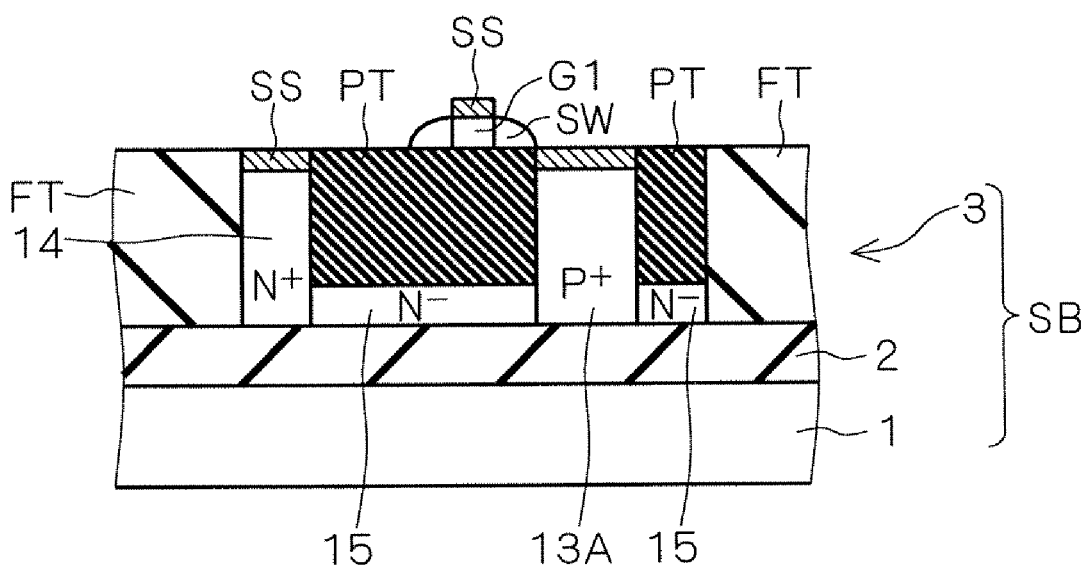
FIGS. 51 to 54 are sectional views for explaining the configuration of the second modification of the semiconductor device according to the fifth embodiment of the invention.
Figure 52:
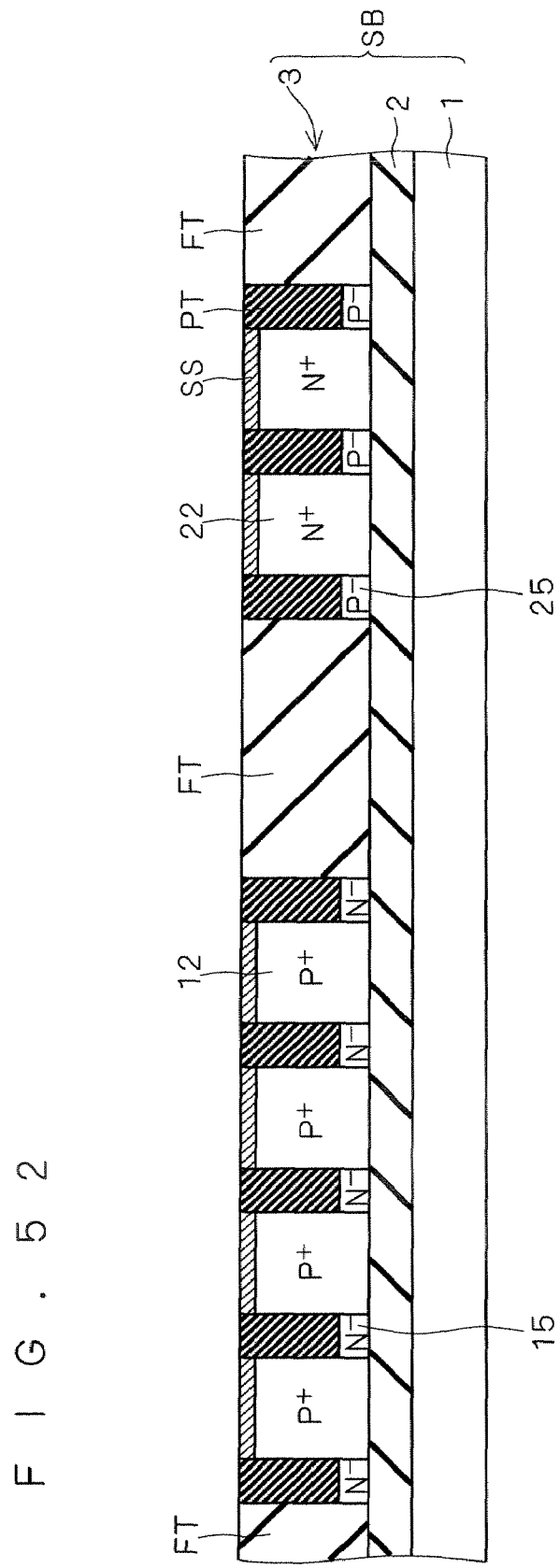
Figure 53:
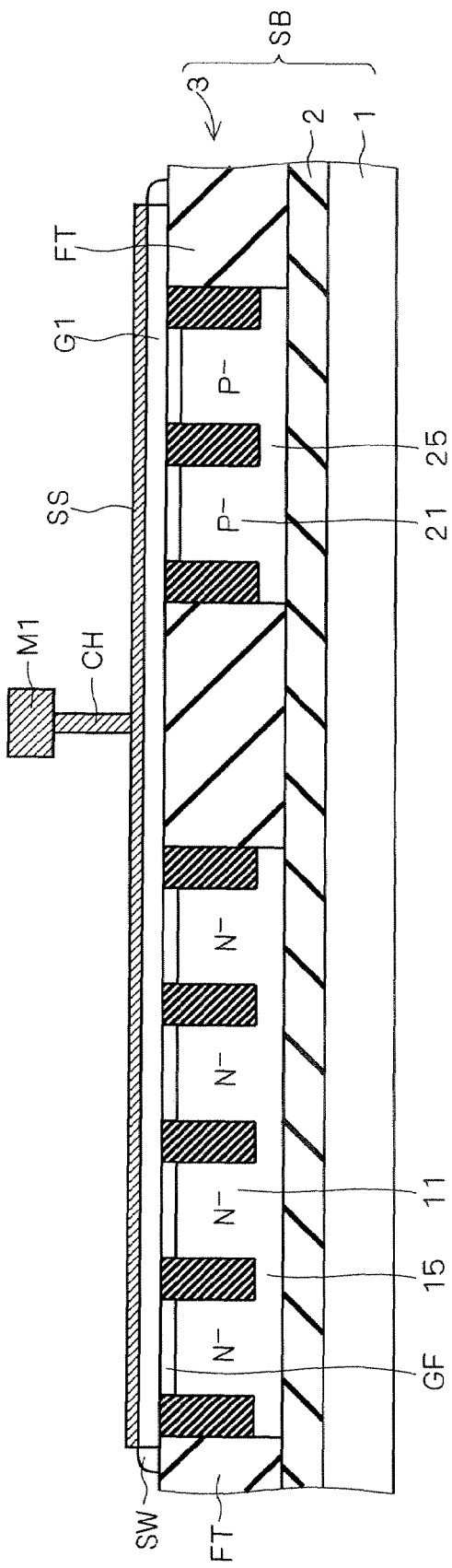
Figure 54:
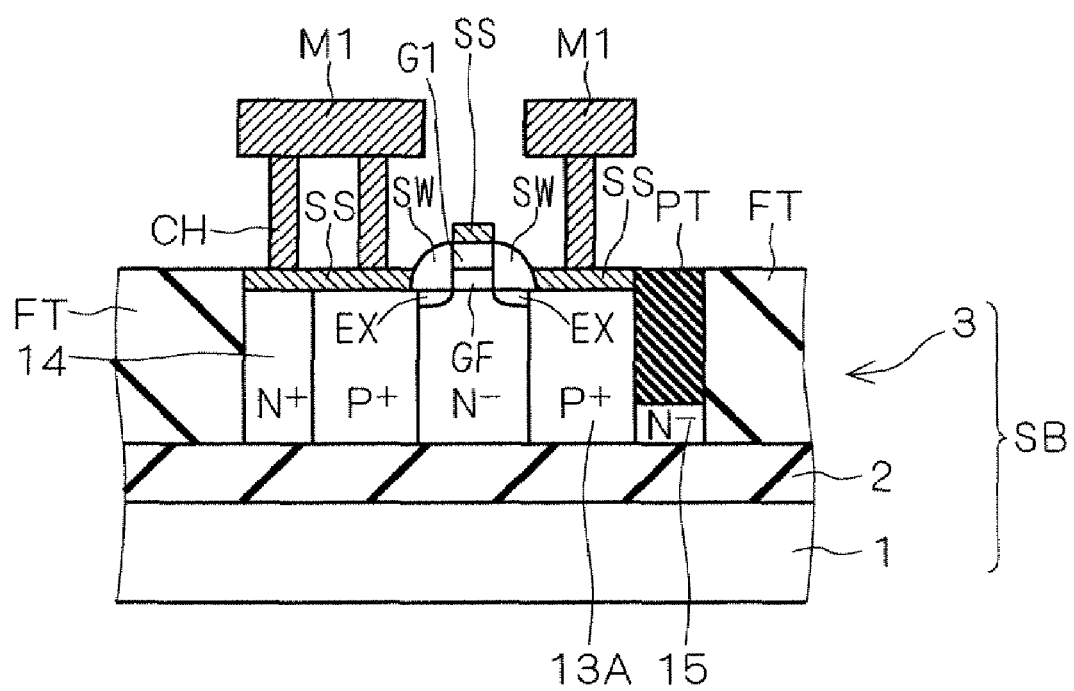

Now, the configuration of the second modification of the fifth embodiment is explained. FIG. 50 is a plan view showing a configuration of the semiconductor device 502. The sectional views taken in lines A-A, B-B, D-D and E-E in FIG. 50 are shown in FIGS. 51, 52, 53 and 54, respectively. The same component parts as those of the semiconductor device 500 shown in FIGS. 50 to 54 are designated by the same reference numerals, respectively, and not explained again.

As shown in FIG. 50, the source region of the PMOS transistor P52 of the semiconductor device 502 is divided into four parts along the gate width and has an arrangement of four independent source regions 12.

Specifically, the partial trench isolation insulating film PT is formed in contact with the whole of the opposed side surfaces between each adjacent ones of the four source regions 12, and also the partial trench isolation insulating film PT is formed outside the source region 12 provided at each end of the arrangement.

In the drain region 13A, on the other hand, each partial trench isolation insulating film PT is projected by a predetermined length from the gate electrode G1, and the portion of the drain region 13A far from the gate electrode G1 is continuously formed and not divided.

In the NMOS transistor N52, on the other hand, the source region is divided into two parts along the gate width, and has an arrangement of two independent source regions 22.

Specifically, the partial trench isolation insulating film PT is formed in contact with the whole of the opposed side surfaces between the two source regions 22, and also the partial trench isolation insulating film PT is formed outside the source region 22 provided at each end of the arrangement.

In the drain region 23A, on the other hand, the partial trench isolation insulating film PT is projected by a predetermined length from the gate electrode G1. The portion of the drain region 23A far from the gate electrode G1 is continuously formed and not divided.

With this configuration, the drain regions 13A, 23A are continuously formed, and at least one contact hole is sufficiently connected to fix the potential, thereby simplifying the process of forming the contact hole.

E-5. Third Modification

Figure 55:
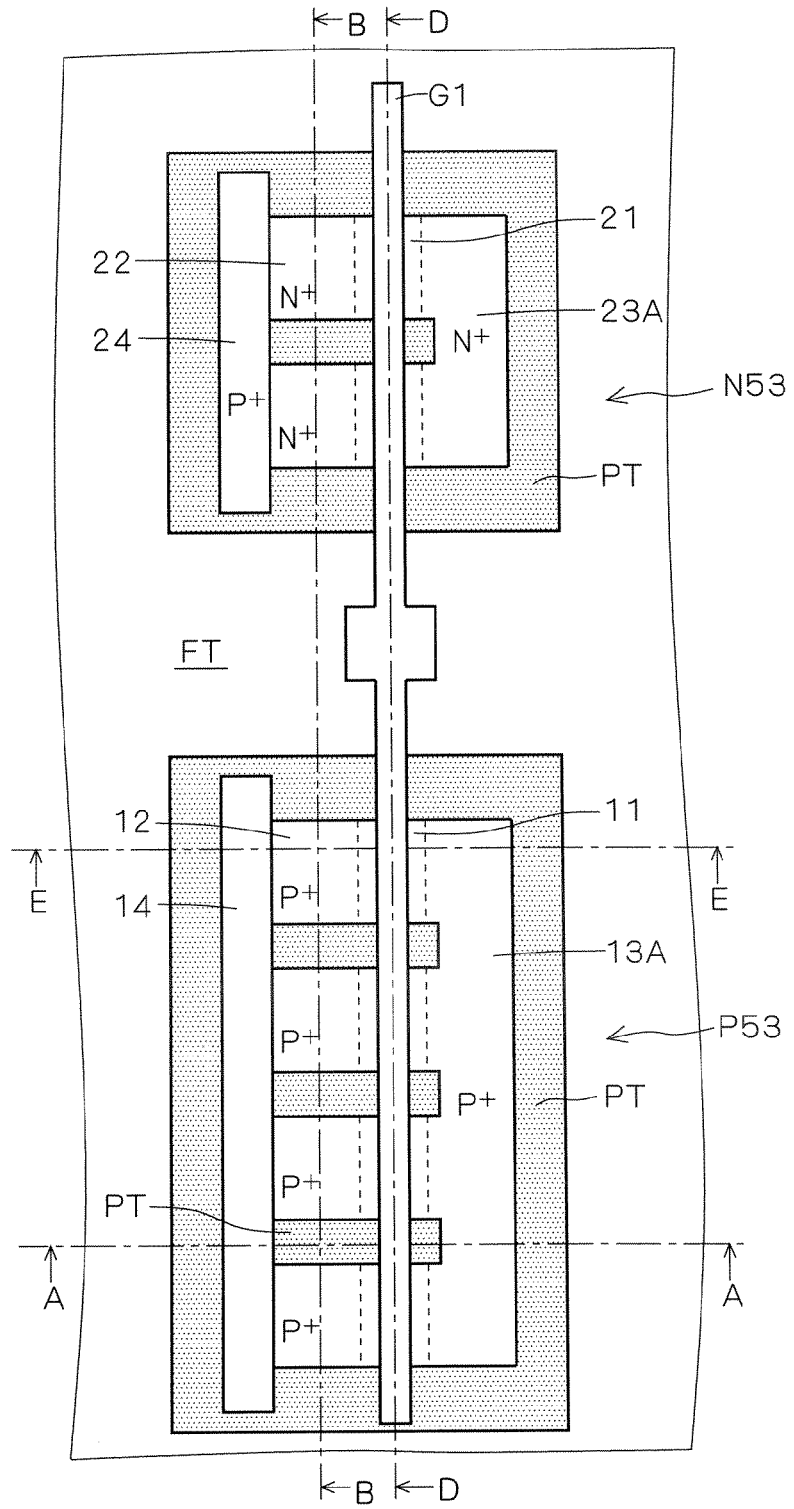
FIG. 55 is a plan view for explaining the configuration of a third modification of the semiconductor device according to the fifth embodiment of the invention.

Next, the configuration of a third embodiment of the fifth embodiment is explained. FIG. 55 is s plan view showing the configuration of the semiconductor device 503. The sectional views taken in lines A-A, B-B, D-D and E-E in FIG. 55 are shown in FIGS. 56, 57, 58 and 59, respectively. The same component parts as those of the semiconductor device 500 shown in FIGS. 50 to 54 are designated by the same reference numerals, respectively, and not explained again.

As shown in FIG. 55, the source region of the PMOS transistor P53 of the semiconductor device 503 is divided into four parts along the gate width, and has an arrangement of four independent source regions 12.

Specifically, the partial trench isolation insulating film PT is formed in contact with the whole of the opposed side surfaces between each adjacent ones of the four source regions 12, and also the partial trench isolation insulating film PT is formed outside the source region 12 provided at each end of the arrangement.

In the drain region 13A, on the other hand, each partial trench isolation insulating film PT is projected by a predetermined length from the gate electrode G1. The portion of the drain region 13A opposite to the gate electrode G1 is continuously formed and not divided.

In the NMOS transistor N53, the source region is divided into two parts along the gate width, and has an arrangement of two independent source regions 22.

Specifically, the partial trench isolation insulating film PT is formed in contact with the whole of the opposed side surfaces between the two source regions 22, and also the partial trench isolation insulating film PT is formed outside the source region 22 provided at each end of the arrangement.

In the drain region 23A, on the other hand, the partial trench isolation insulating film PT is projected by a predetermined length from the gate electrode G1. The portion of the drain region 23A opposite to the gate electrode G1 is continuously formed and not divided.

With this configuration, the drain regions 13A, 23A are continuously formed and at least one contact hole is sufficiently connected to fix the potential, thereby simplifying the process of forming the contact hole.

Figure 56:
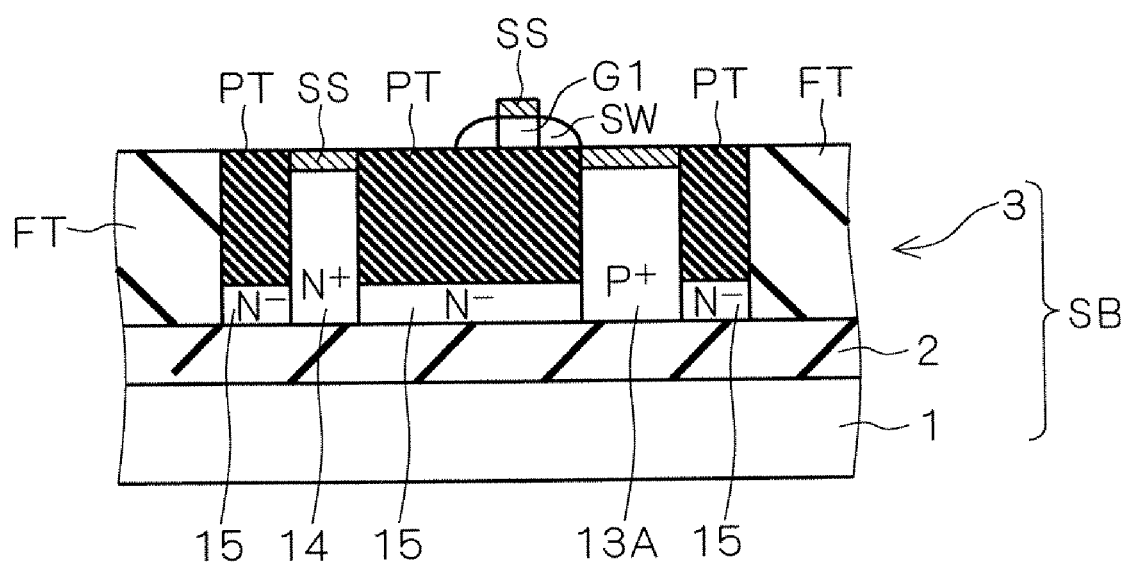
FIGS. 56 to 59 are sectional views for explaining the configuration of the third modification of the semiconductor device according to the fifth embodiment of the invention.
Figure 57:
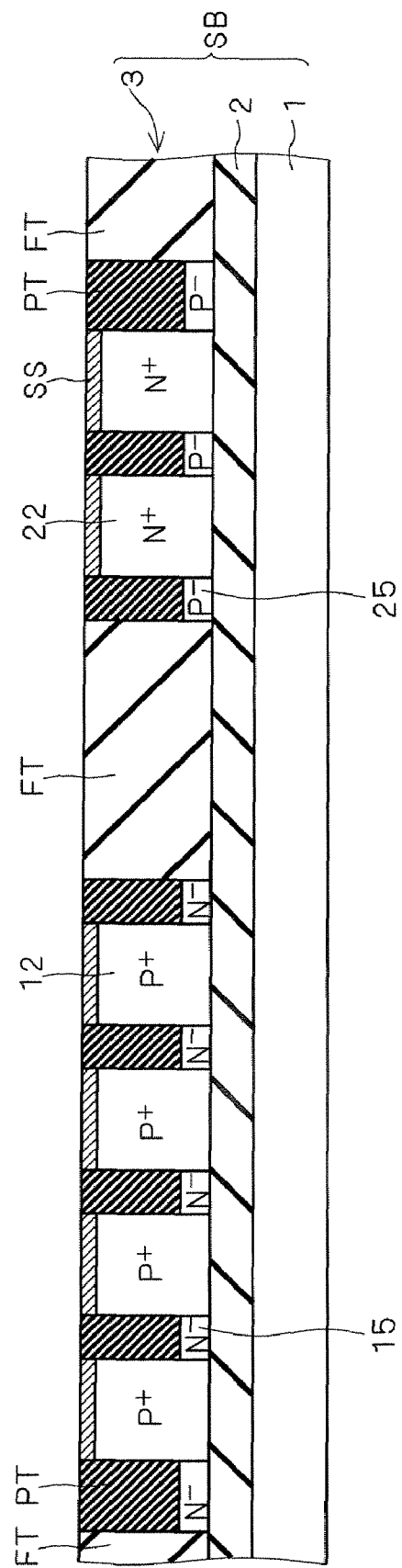
Figure 58:
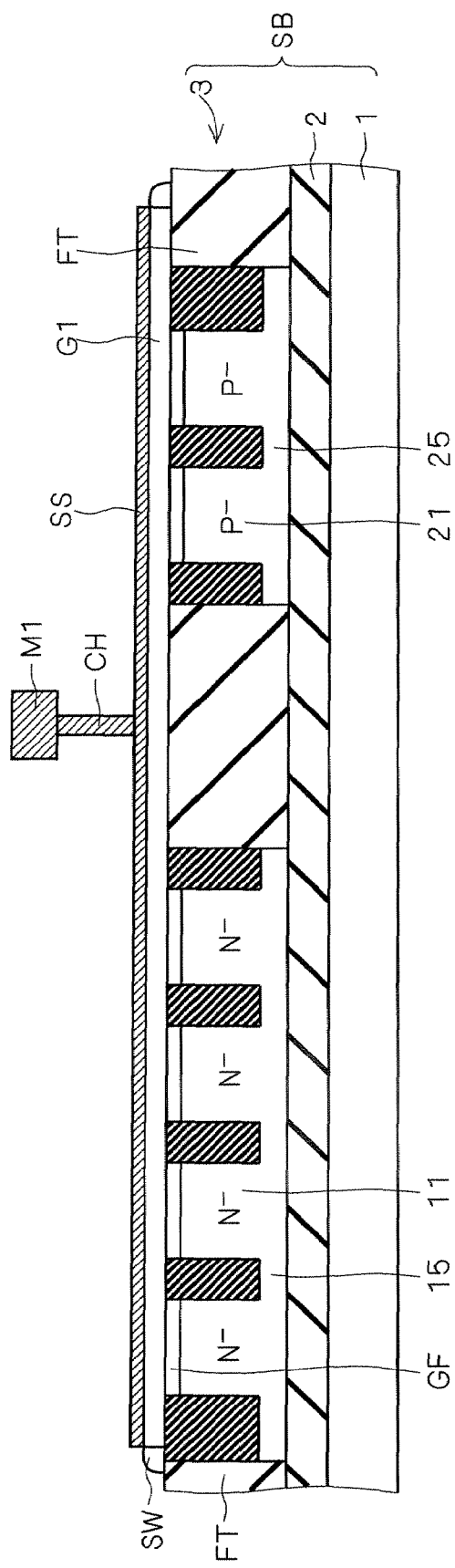
Figure 59:
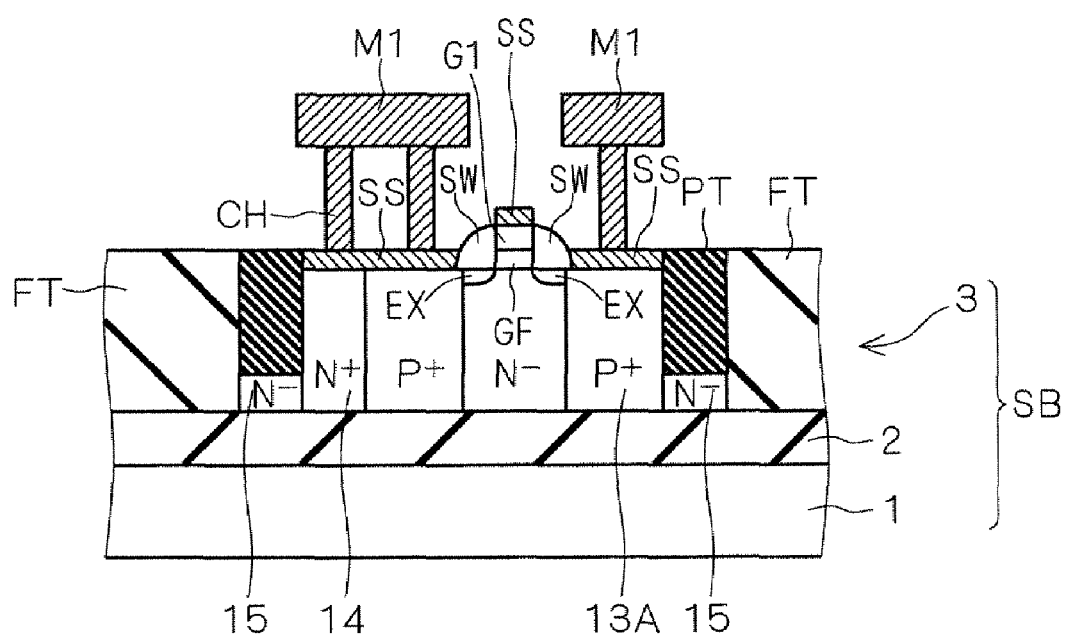

The partial trench isolation insulating film PT is formed in contact with the side surface of the body-tied region 14 opposite to the gate electrode G1 (FIG. 56), and the body-tied region 14 is surrounded by the partial trench isolation insulating film PT. In the PMOS transistor region, the well region 15 containing N-type impurities relatively low in concentration (N⁻) exists in a layer lower than the partial trench isolation insulating film PT, and as shown in FIGS. 56, 59, the body-tied region 14 and the well region 15 are in contact with each other.

In the NMOS transistor N53, the partial trench isolation insulating film PT is formed in contact with the side surface of the body-tied region 24 opposite to the gate electrode G1, and the body-tied region 24 is surrounded by the partial trench isolation insulating film PT. In the NMOS transistor region, the well region 25 containing P-type impurities relatively low in concentration (P⁻) exists in a layer lower than the partial trench isolation insulating film PT, and though not shown, the body-tied region 24 and the well region 25 are in contact with each other.

With this configuration, the side surface of each source region 12 of the PMOS transistor P51 is in contact with the partial trench isolation insulating film PT and the body-tied region 14. Also, the side surface of each source region 22 of the NMOS transistor N51 is in contact with the partial trench isolation insulating film PT and the body-tied region 24. Thus, the junction area of the PN junction in the source regions 12, 22 is increased and so is the parasitic junction capacitance, thereby stabilizing the power supply.

Further, the partial trench isolation insulating film PT is formed in contact with the side surface of the body-tied region 14 far from the gate electrode G1, and the body-tied region 14 is surrounded by the partial trench isolation insulating film PT. In the case where the wiring layer M1 is formed on the partial trench isolation insulating film PT, therefore, the parasitic capacitance of the wiring layer M1 can be further increased, thereby stabilizing the power supply.

F. Sixth Embodiment

F-1. Device Configuration

The configuration of the semiconductor device 600 according to a sixth embodiment of the invention is explained with reference to FIGS. 60 to 64.

Figure 60:
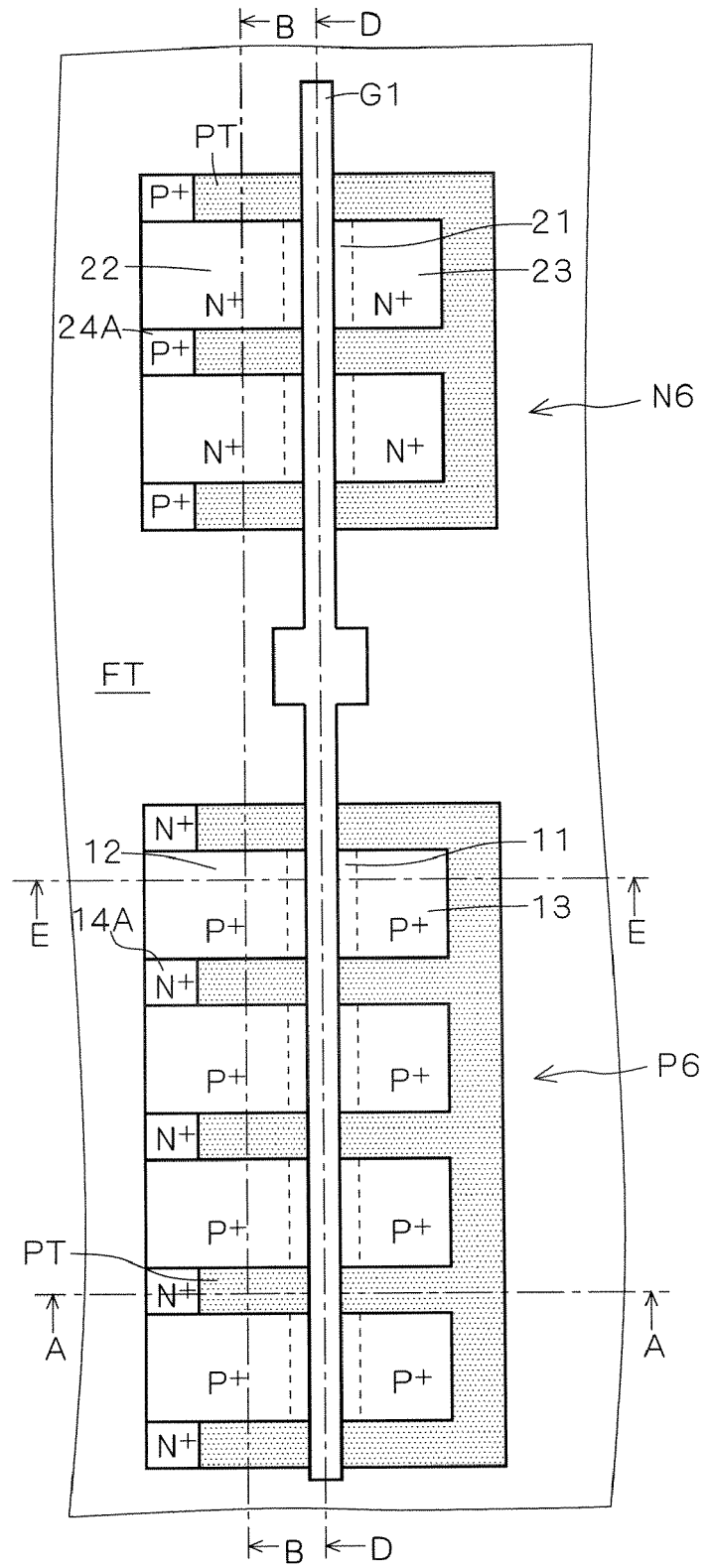
FIG. 60 is a plan view for explaining a configuration of a semiconductor device according to a sixth embodiment of the invention.

FIG. 60 is s plan view showing the configuration of the semiconductor device 600. The sectional views taken in lines A-A, B-B, D-D and E-E in FIG. 60 are shown in FIGS. 61, 62, 63 and 64, respectively. The same component parts as those of the semiconductor device 100 shown in FIGS. 1 to 5 are designated by the same reference numerals, respectively, and not explained again.

As shown in FIG. 60, the semiconductor device 600 includes a PMOS transistor P6 and a NMOS transistor N6, which are connected to a common gate electrode G1.

In the PMOS transistor P6, the source-drain region is divided into four parts along the gate width, and has an arrangement of four independent source regions 12 and an arrangement of four independent drain regions 13.

Figure 61:
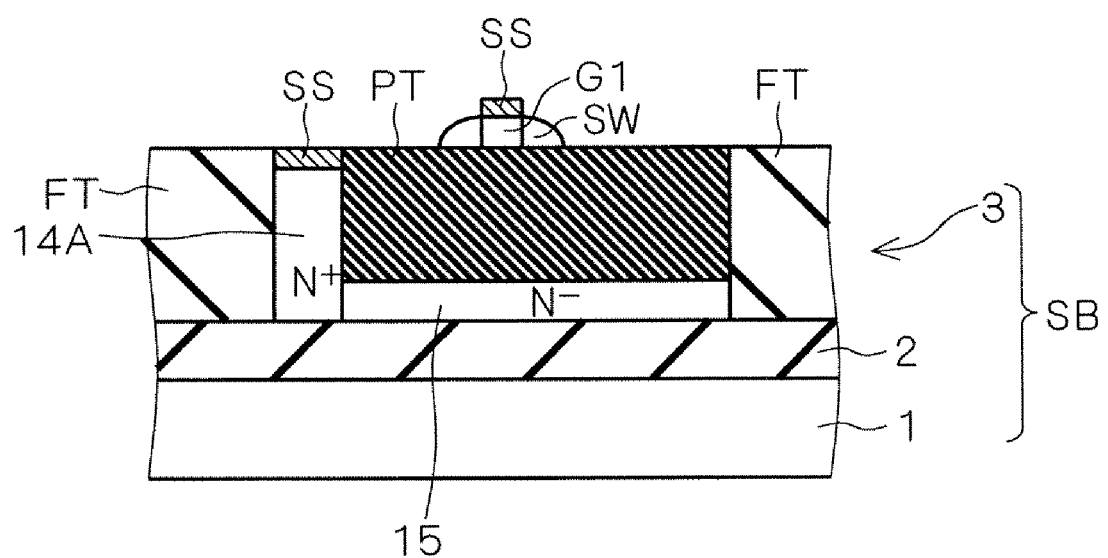
FIGS. 61 to 64 are sectional views for explaining a configuration of a semiconductor device according to the sixth embodiment of the invention.
Figure 62:
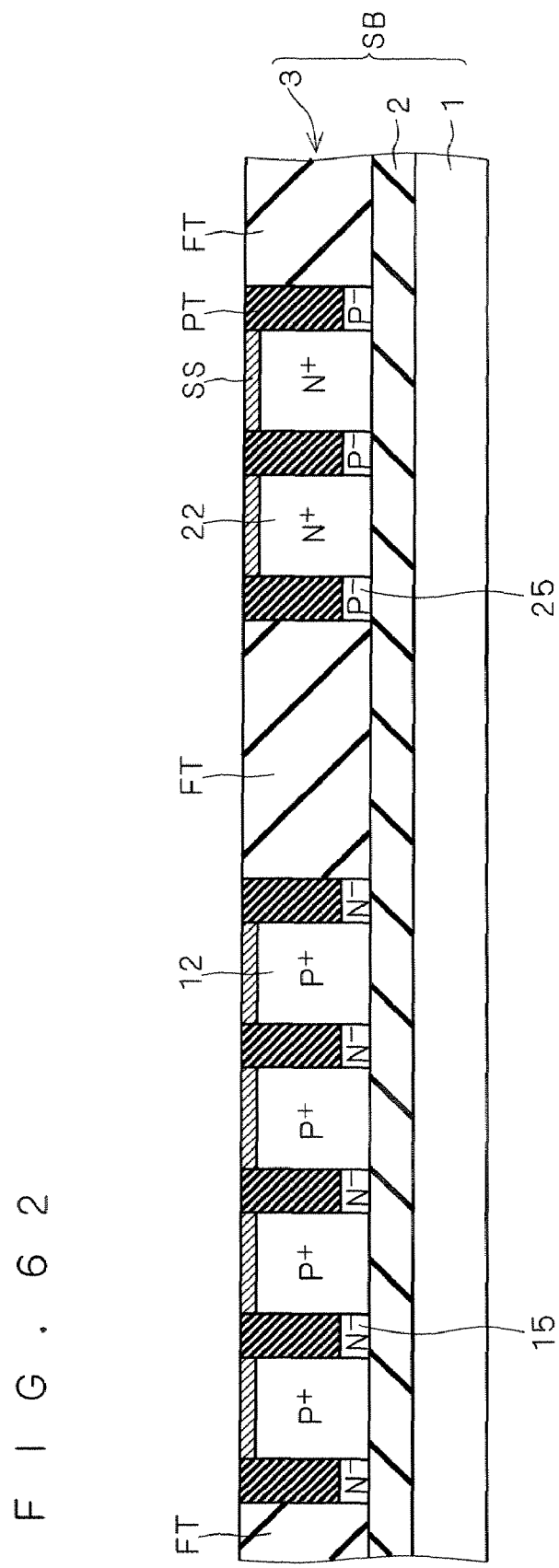
Figure 63:
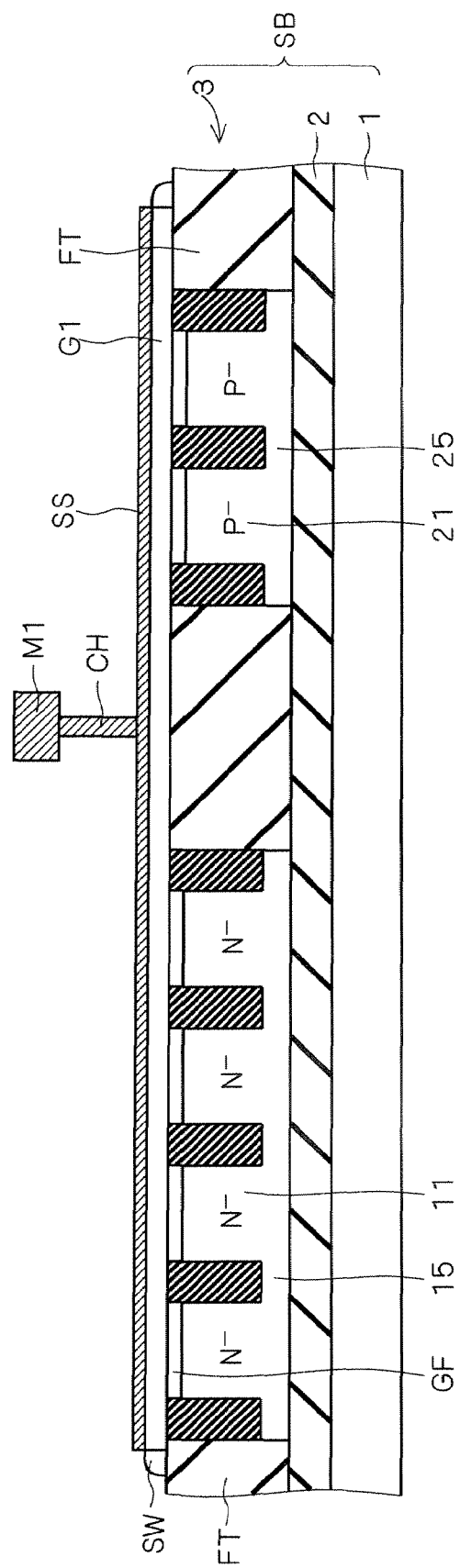

The partial trench isolation insulating film PT is formed in contact with the whole of the opposed side surfaces between each adjacent ones of the four source regions 12, and also the partial trench isolation insulating film PT is formed outside the source region 12 provided at each end of the arrangement. A body-tied region 14A containing N-type impurities relatively high in concentration (N⁺) is formed in contact with the side surface of each partial trench isolation insulating film PT opposite to the gate electrode G1 (FIG. 61). Incidentally, the body-tied regions 14A are each formed also in contact with the side surface of the corresponding source region 12 along the direction of arrangement.

Also, the partial trench isolation insulating film PT is formed between each adjacent ones of the four drain regions 13 and outside the drain region 13 provided at each end of the arrangement.

The partial trench isolation insulating film PT is formed in contact with the side surface of the drain region 13 opposite to the gate electrode G1. This partial trench isolation insulating film PT is in contact with the side surfaces of the four drain regions 13 on the one hand, and also in contact with the side surface of the partial trench isolation insulating film PT formed between each adjacent ones of the four drain regions 13 and outside the arrangement of the drain regions 13. As a result, the four drain regions 13 are surrounded by the partial trench isolation insulating film PT.

The NMOS transistor N6 is so configured that the source-drain region is divided into two parts along the gate width and has an arrangement of two independent source regions 22 and an arrangement of two independent drain regions 23.

The partial trench isolation insulating film PT is formed in contact with the whole of the opposed side surfaces between the two source regions 22, and also the partial trench isolation insulating film PT is formed outside the source region 22 provided at each end of the arrangement. The body-tied region 24A containing P-type impurities relatively high in concentration (P⁺) is formed in contact with the side surface of each partial trench isolation insulating film PT opposite to the gate electrode G1. Incidentally, each body-tied region 24A is formed also in contact with the side surface of the corresponding source region 22 along the direction of arrangement.

The configuration in which the body-tied regions 14A, 24A are independent of each other can reduce the area to form the body-tied regions 14A, 24A and therefore the area efficiency is improved.

The partial trench isolation insulating film PT is also formed between the two drain regions 23 and outside the drain region 23 provided at each end of the arrangement.

The partial trench isolation insulating film PT is formed in contact with the side surface of each drain region 23 opposite to the gate electrode G1. The partial trench isolation insulating film PT is formed in contact with the side surfaces of the two drain regions 23, and also with the side surfaces of the partial trench isolation insulating films PT formed between the two drain regions 23 and outside the arrangement of the drain regions 23. As a result, the two drain regions 23 are surrounded by the partial trench isolation insulating film PT.

As shown in FIG. 61, the body-tied region 14A of the PMOS transistor P6 is formed to reach the buried oxide film 2 from the surface of the SOI layer 3, and configured to be in contact with the well region 15 containing N-type impurities relatively low in concentration (N⁻) existing in a layer lower than the partial trench isolation insulating film PT.

The well region 15 exists in a layer lower than the partial trench isolation insulating film PT, and in the semiconductor device 600, the drain regions 13, 23 are surrounded by the partial trench isolation insulating film PT. Therefore, the well region 15 exists around the drain regions 13, 23.

Figure 64:
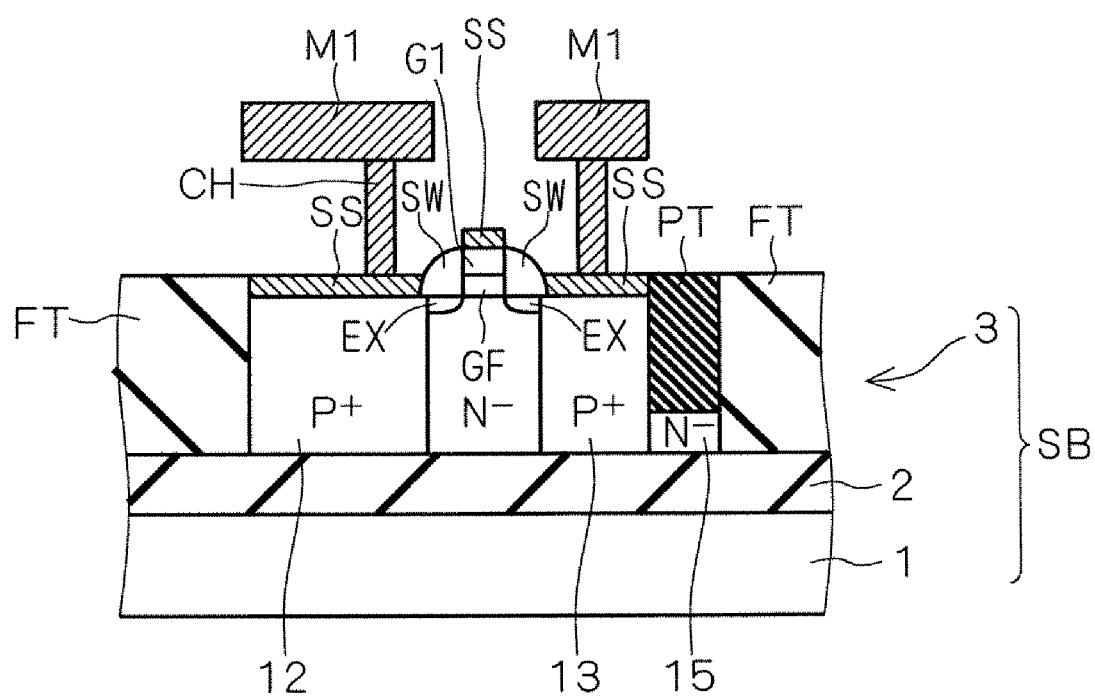

Incidentally, although the area of the body-tied region 14A is small and as shown in FIGS. 61, 64, the body-tied region 14A and the source region 12 are both covered with a common silicide film SS and electrically connected to each other. By electrically connecting a part thereof to the wiring layer M1, therefore, the potential of the body-tied region 14A can be fixed.

This configuration is the same also for the body-tied region 24A and the source regions 22 of the NMOS transistor N6.

F-2. Effects

As explained above, in the semiconductor device 600, the source-drain region of the MOS transistor is divided along the gate width. Like in the semiconductor device 100 explained with reference to FIGS. 1 to 5, therefore, the potential of the body regions 11, 21 can be positively fixed in the PMOS transistor P6 and the NMOS transistor N6. Thus, a kink can be suppressed, while at the same time improving the operation withstanding voltage.

The source-drain region is divided by the partial trench isolation insulating film PT and the full trench isolation insulating film FT thereby to divide the gate electrode G1 substantially along the gate width. Since a mask having a high machining precision is used to form the trench isolation insulating film, however, the gate electrode G1 can be divided accurately according to the design value. Thus, the variation in gate width can be prevented and a semiconductor device having no variation in operation characteristics is obtained.

Also, since the drain regions 13, 23 are surrounded by the partial trench isolation insulating film PT, the well region 15 exists around the drain regions 13, 23, and a body-tied region can be formed at an arbitrary position around the drain regions 13, 23. Thus, the potential of the body region can be fixed through the body-tied region.

As a result, the potential of the body region can be fixed from both the source regions 12, 22 and the drain regions 13, 23, and the floating of the body region is positively prevented. Thus, the generation of a capacitance component which otherwise might be caused by the floating of the body region is prevented.

The side surface of each source region 12 of the PMOS transistor P6 is in contact only partially with the body-tied region 14A. Also, the side surface of each source region 22 of the NMOS transistor N6 is in contact only partially with the body-tied region 24A. Therefore, the junction area of the PN junction in the source regions 12, 22 and the parasitic junction capacitance are small. Therefore, this configuration is effective in the case where a large junction capacitance of the source regions is not desired.

F-3. First Modification

Figure 65:
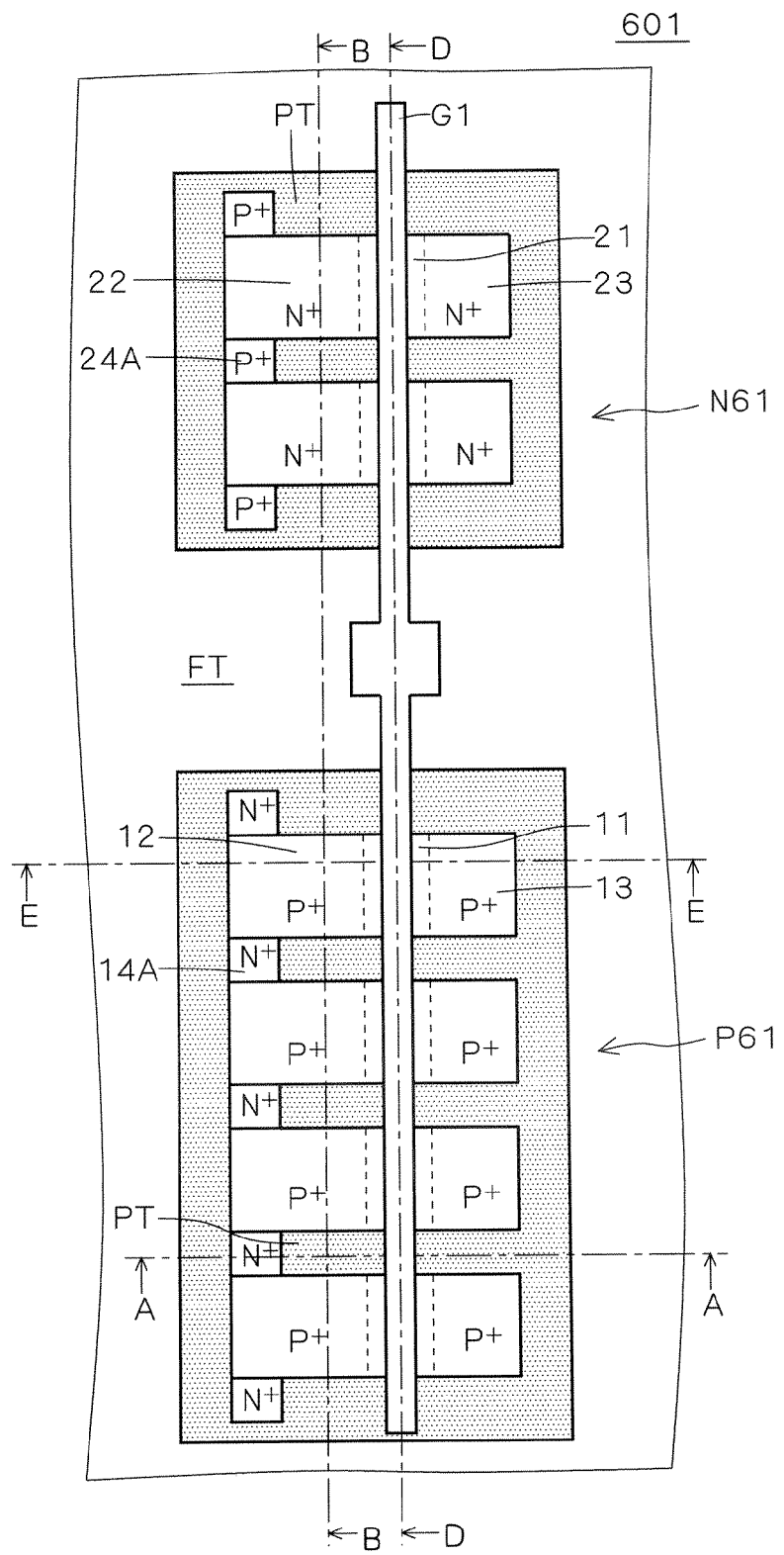
FIG. 65 is a plan view for explaining the configuration of a first modification of the semiconductor device according to the sixth embodiment of the invention.

Next, the configuration of a first modification of the sixth embodiment described above is explained. FIG. 65 is a plan view showing a configuration of the semiconductor device 601. The sectional views taken in lines A-A, B-B, D-D and E-E in FIG. 65 are shown in FIGS. 66, 67, 68 and 69, respectively. The same component parts as those of the semiconductor device 600 shown in FIGS. 60 to 64 are designated by the same reference numerals, respectively, and not described any more.

Figure 66:
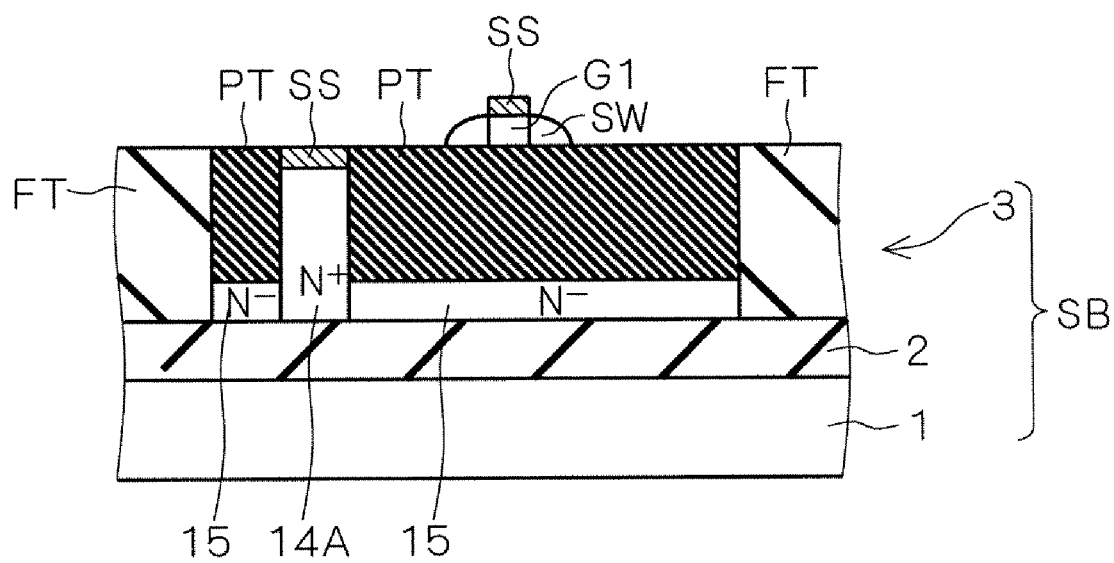
Figure 67:
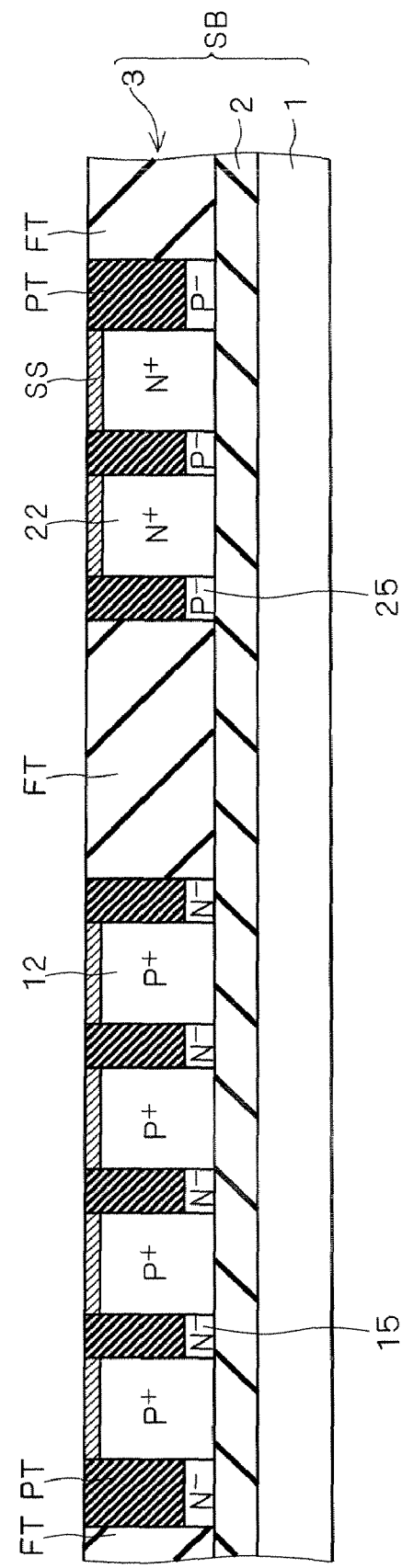
Figure 68:
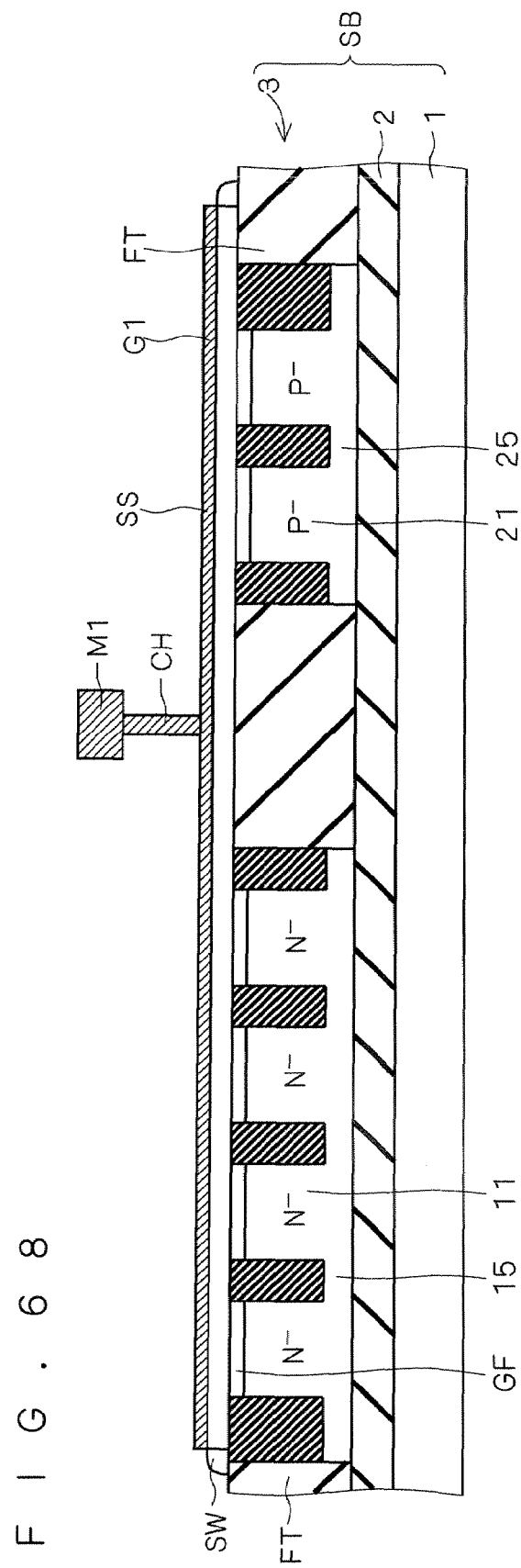

As shown in FIG. 65, in the semiconductor device 601, each partial trench isolation insulating film PT is formed in contact with the side surface of the corresponding body-tied region 14A of the PMOS transistor P61 opposite to the gate electrode G1 (FIG. 66). The partial trench isolation insulating film PT is also formed in contact with the side surface of the source region 12 on the opposite side of the gate electrode G1 (FIG. 69), and each source region 12 is surrounded by the partial trench isolation insulating film PT.

In the PMOS transistor region, the well region 15 containing N-type impurities relatively low in concentration ($N^-$) exists in a layer under the partial trench isolation insulating film PT, and as shown in FIG. 66, each body-tied region 14A and the well region 15 are in contact with each other.

In the NMOS transistor N61, on the other hand, each partial trench isolation insulating film PT is formed in contact with the side surface of the corresponding body-tied region 24A opposite to the gate electrode G1. The partial trench isolation insulating film PT is also in contact with the side surface of the source region 22 opposite to the gate electrode G1. The source regions 22 are thus surrounded by the partial trench isolation insulating film PT.

In the NMOS transistor region, the well region 25 containing P-type impurities relatively low in concentration ($P^-$) exists in a layer under the partial trench isolation insulating film PT, and though not shown, the body-tied region 24A and the well region 25 are in contact with each other.

With this configuration, the side surface of each source region 12 of the PMOS transistor P61 is in contact with the corresponding partial trench isolation insulating film PT and the body-tied region 14A. Also, since the side surface of each source region 22 of the NMOS transistor N61 is in contact with the partial trench isolation insulating film PT and the body-tied region 24A, the junction area of the PN junction in the source regions 12, 22 is increased for an increased parasitic junction capacitance. Thus, the power supply can be stabilized.

The source regions 12, 22 are surrounded by the partial trench isolation insulating film PT. In the case where the wiring layer M1 is formed on the partial trench isolation insulating film PT, therefore, the parasitic capacitance of the wiring layer M1 can be further increased, thereby stabilizing the power supply.

F-4. Second Modification

Figure 70:
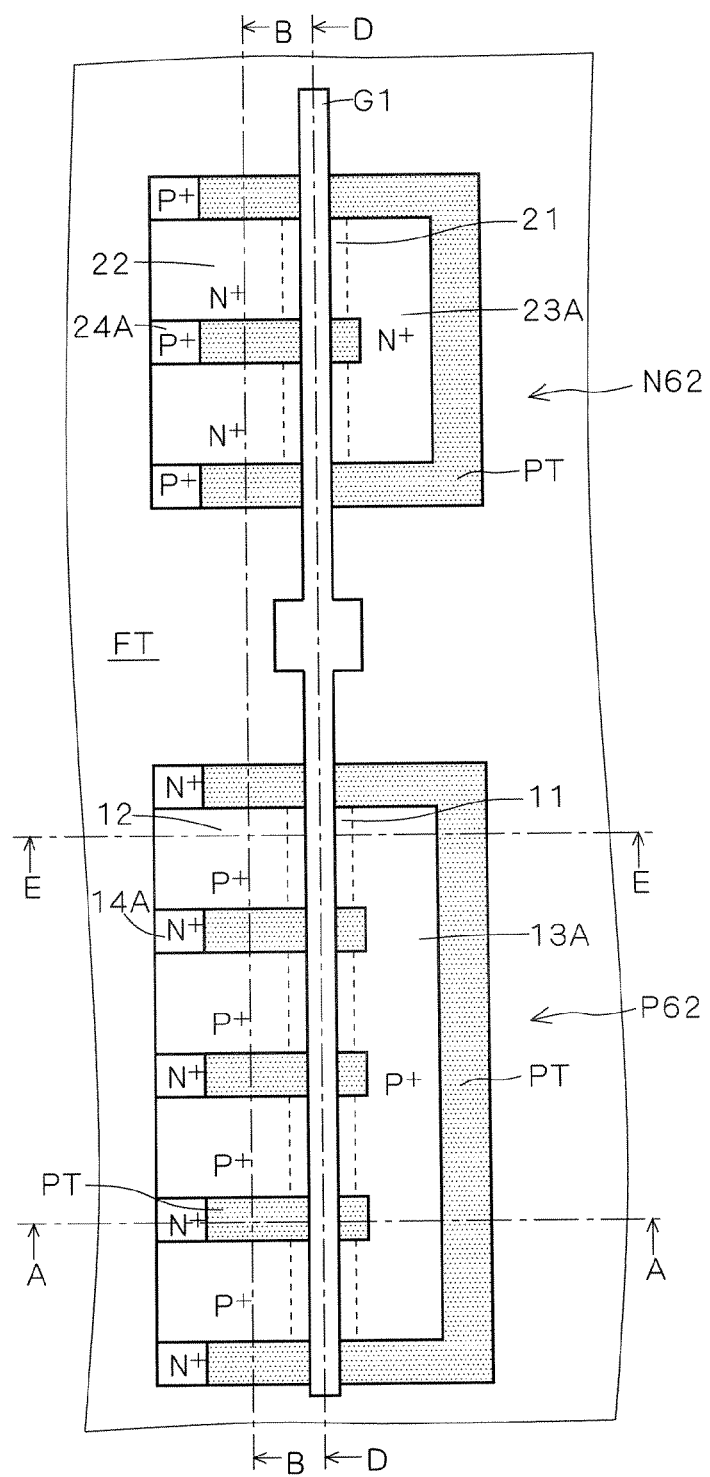
FIG. 70 is a plan view for explaining the configuration of a second modification of the semiconductor device according to the sixth embodiment of the invention.
Figure 71:
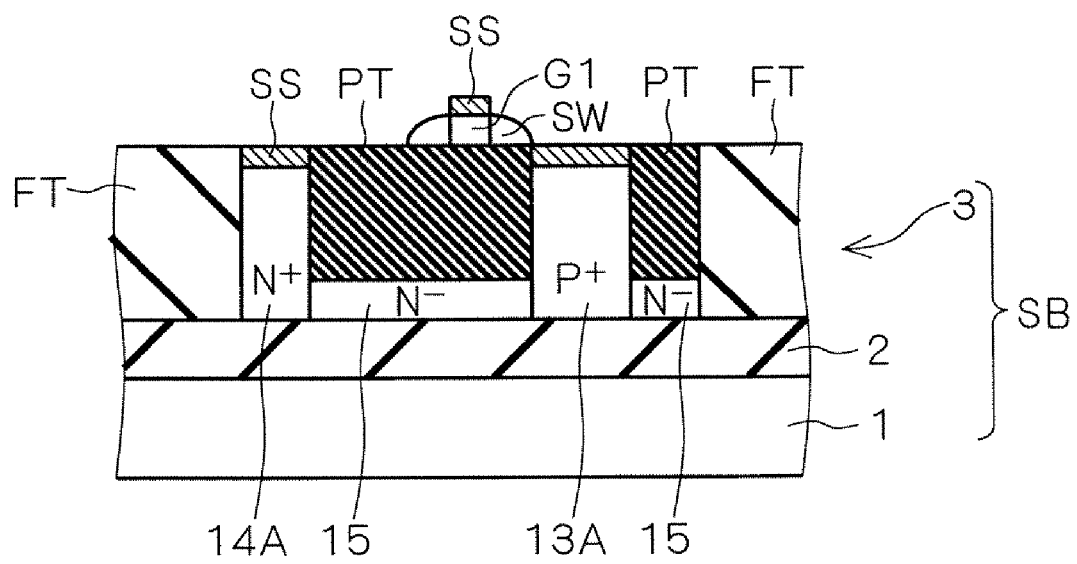
FIGS. 71 to 74 are sectional views for explaining the configuration of the second modification of the semiconductor device according to the sixth embodiment of the invention.
Figure 72:
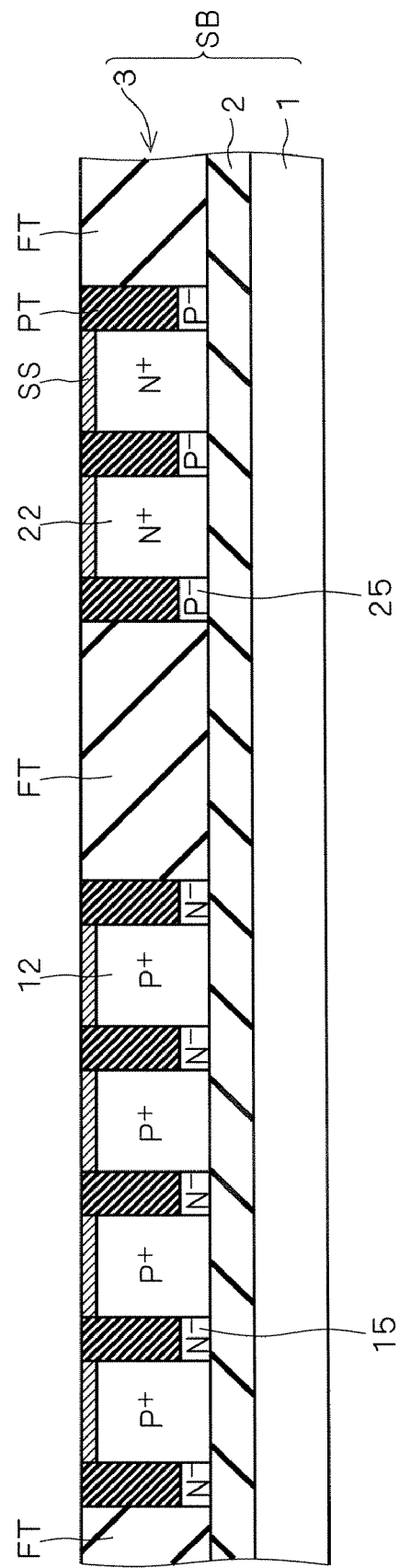
Figure 73:
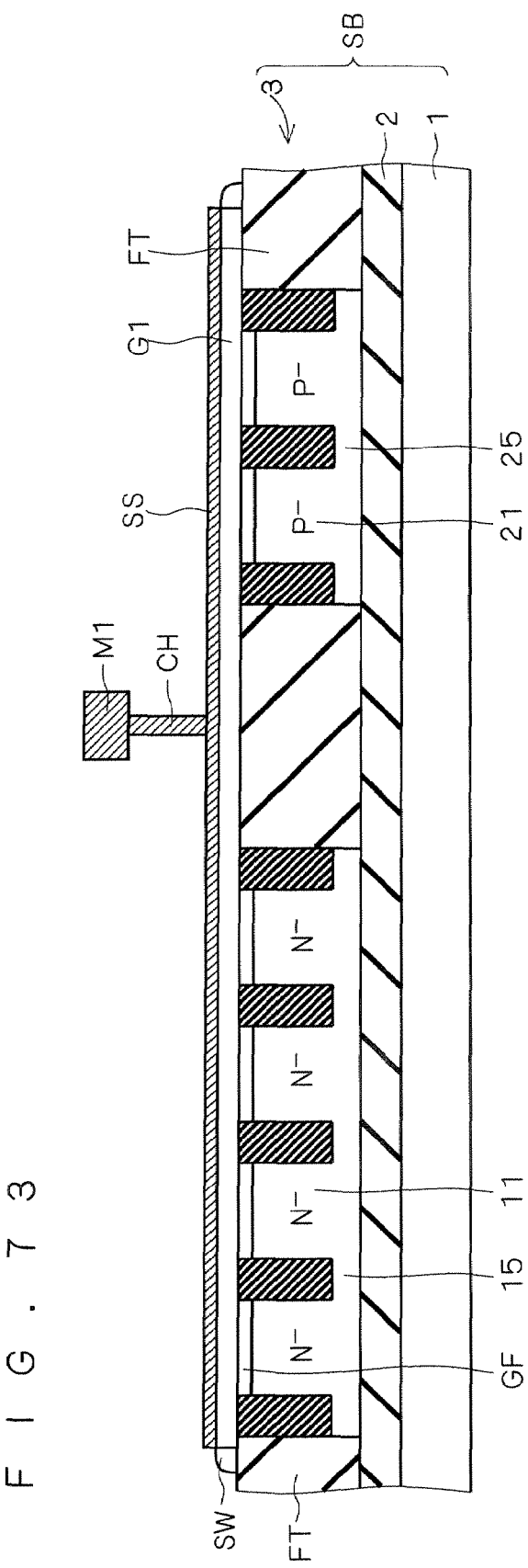
Figure 74:
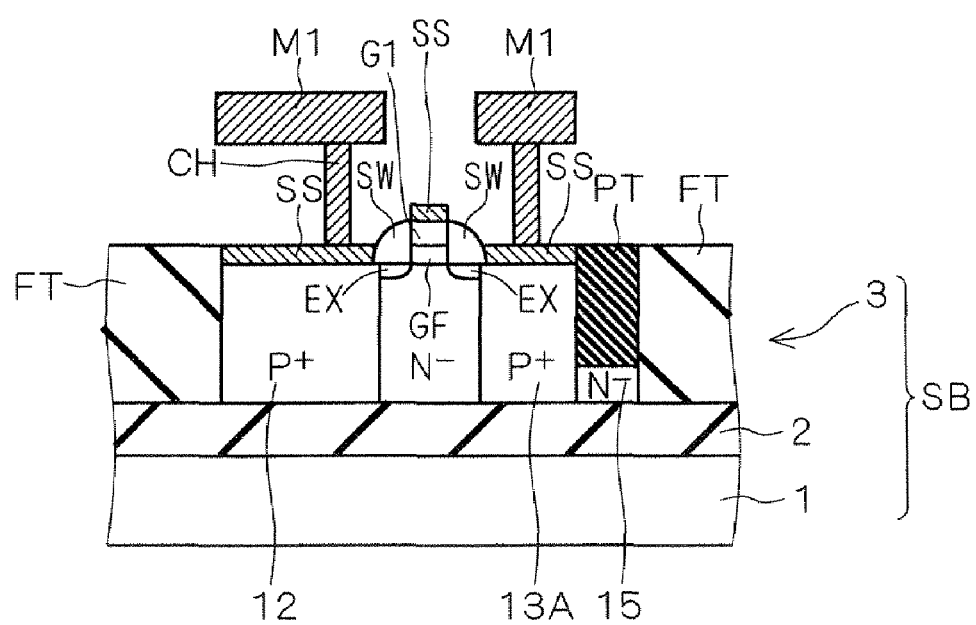

Next, the configuration of a second modification of the sixth embodiment described above is explained. FIG. 70 is a plan view showing a configuration of the semiconductor device 602. The sectional views taken in lines A-A, B-B, D-D and E-E in FIG. 70 are shown in FIGS. 71, 72, 73 and 74, respectively. The same component parts as those of the semiconductor device 600 shown in FIGS. 60 to 64 are designated by the same reference numerals, respectively, and not described any more.

As shown in FIG. 70, in the PMOS transistor P62 of the semiconductor device 602, the source region is divided into four parts along the gate width and has an arrangement of four independent source regions 12.

Specifically, the partial trench isolation insulating film PT is formed in contact with the whole of the opposed side surfaces between each adjacent ones of the four source regions 12. Also, the partial trench isolation insulating film PT is formed outside the source regions 12 provided at each end of the arrangement.

In the drain region 13A, on the other hand, the partial trench isolation insulating films PT are projected by a predetermined length from the gate electrode G1. Nevertheless, the portion of the drain region 13A on the opposite side of the gate electrode G1 is continuously formed and not divided.

In the NMOS transistor N62, the source region 22 is divided into two parts along the gate width and has an arrangement of two independent source regions.

Specifically, the partial trench isolation insulating film PT is formed in contact with the whole of the opposed side surfaces between the two source regions, and also the partial trench isolation insulating film PT is formed outside the source regions 22 provided at each end of the arrangement.

In the drain region 23A, on the other hand, the partial trench isolation insulating film PT is projected by a predetermined length from the gate electrode G1, and the portion of the drain region 23A on the other side of the gate electrode G1 is continuously formed and not divided.

With this configuration, the drain regions 13A, 23A are continuously formed, and at least one contact hole is sufficiently connected to fix the potential, thereby simplifying the process of forming the contact hole.

F-5. Third Modification

Figure 75:
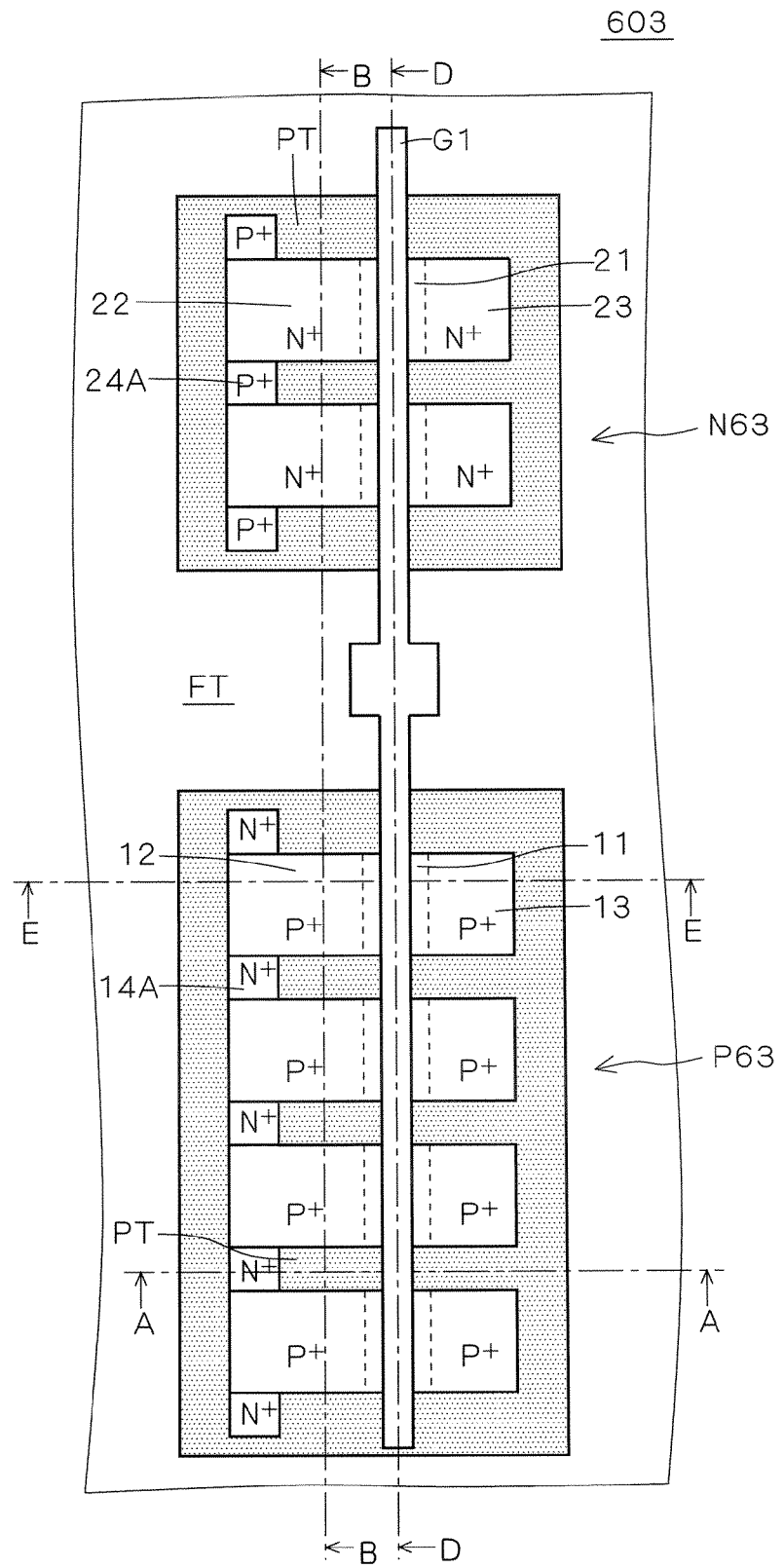
FIG. 75 is a plan view for explaining the configuration of a third modification of the semiconductor device according to the sixth embodiment of the invention.

Next, the configuration of a third modification of the sixth embodiment described above is explained. FIG. 75 is a plan view showing a configuration of the semiconductor device 603. The sectional views taken in lines A-A, B-B, D-D and E-E in FIG. 75 are shown in FIGS. 76, 77, 78 and 79, respectively. The same component parts as those of the semiconductor device 600 shown in FIGS. 60 to 64 are designated by the same reference numerals, respectively, and not described any more.

As shown in FIG. 75, in the PMOS transistor P63 of the semiconductor device 603, the source region is divided into four parts along the gate width and has an arrangement of four independent source regions 12.

Specifically, the partial trench isolation insulating film PT is formed in contact with the whole of the opposed side surfaces between each adjacent ones of the four source regions 12. Also, the partial trench isolation insulating film PT is formed outside each of the source regions 12 provided at the ends of the arrangement.

In the drain region 13A, on the other hand, each partial trench isolation insulating film PT is projected by a predetermined length from the gate electrode G1. Nevertheless, the portion of the drain region 13A on the opposite side of the gate electrode G1 is continuously formed and not divided.

In the NMOS transistor N63, the source region is divided into two parts along the gate width and has an arrangement of two independent source regions 22.

Specifically, the partial trench isolation insulating film PT is formed in contact with the whole of the opposed side surfaces between the two source regions 22, and also the partial trench isolation insulating film PT is formed outside each of the source regions 22 provided at the ends of the arrangement.

In the drain region 23A, on the other hand, the partial trench isolation insulating film PT is projected by a predetermined length from the gate electrode G1, and the portion of the drain region 23A on the opposite side of the gate electrode G1 is continuously formed and not divided.

With this configuration, the drain regions 13A, 23A are continuously formed, and at least one contact hole is sufficiently connected to fix the potential, thereby simplifying the process of forming the contact hole.

Figure 76:
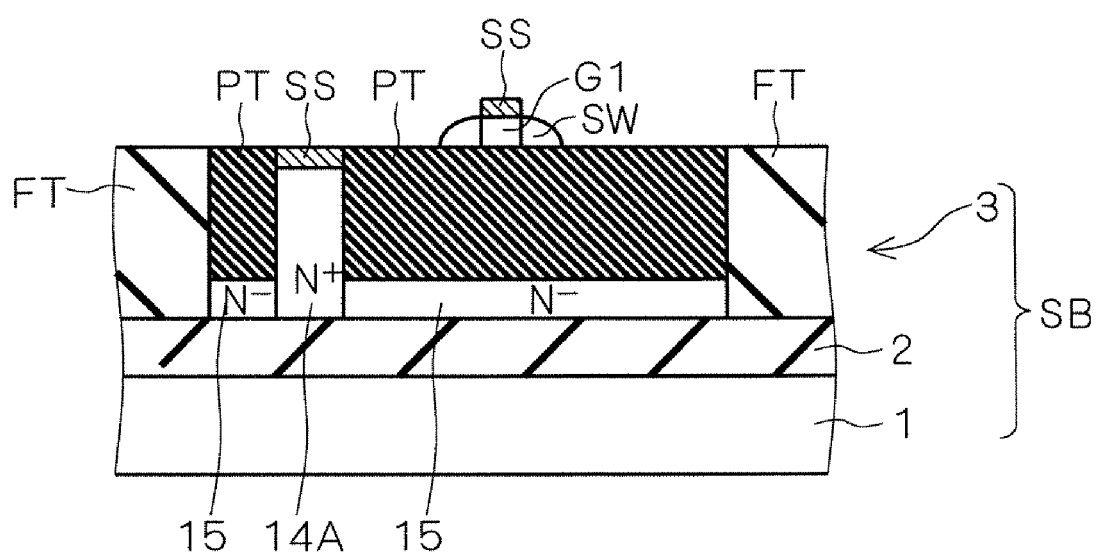
FIGS. 76 to 79 are sectional views for explaining the configuration of the third modification of the semiconductor device according to the sixth embodiment of the invention.
Figure 77:
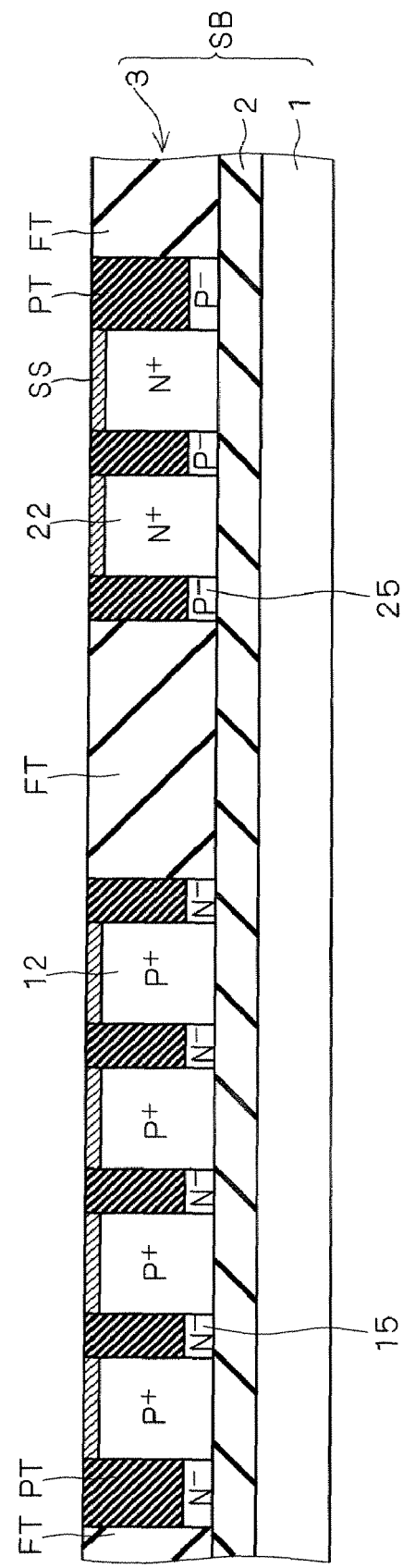
Figure 78:
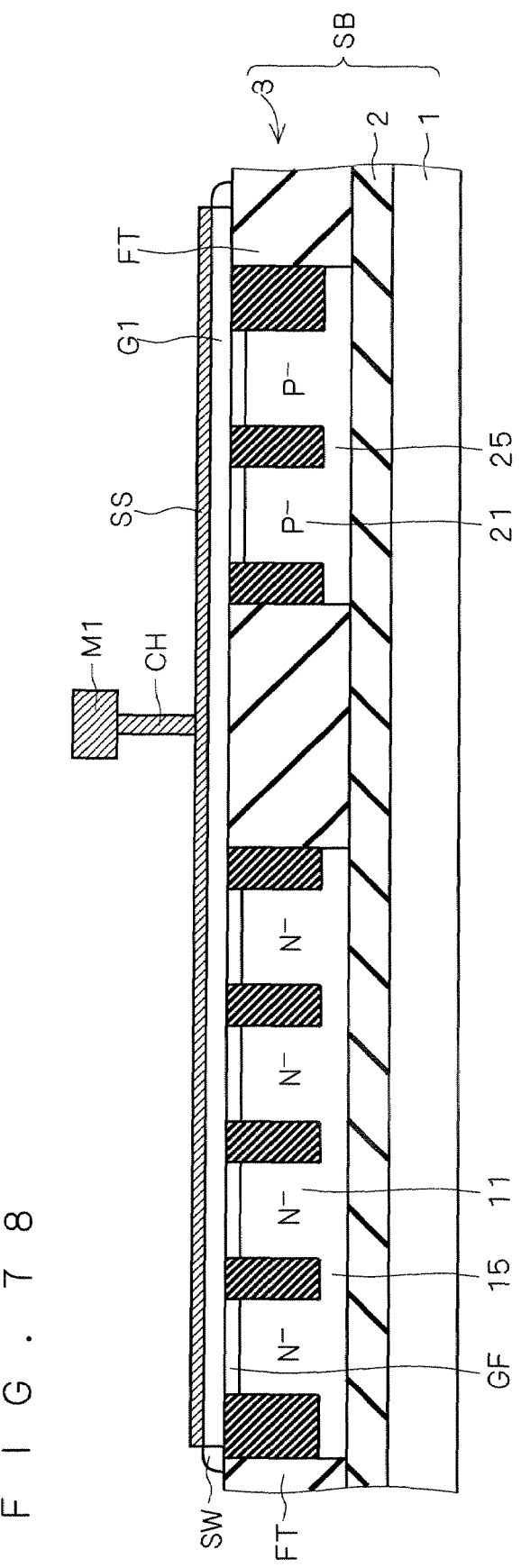
Figure 79:
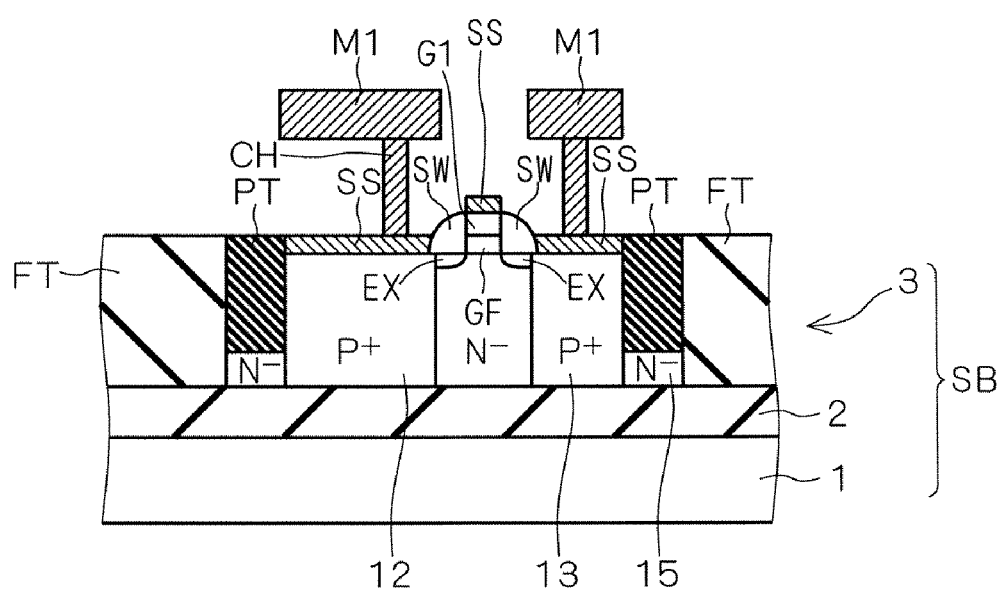

Also, the partial trench isolation insulating film PT is formed in contact with the side surface of the corresponding one of the body-tied regions 14A opposite to the gate electrode G1 (FIG. 76). The partial trench isolation insulating film PT is also formed in contact with the side surface of the corresponding source region 12 far from the gate electrode G1 (FIG. 79). Thus, the source regions 12 are surrounded by the partial trench isolation insulating film PT.

In the PMOS transistor region, the well region 15 containing N-type impurities relatively low in concentration (N⁻) exists in a layer under the partial trench isolation insulating film PT, and as shown in FIG. 76, the body-tied region 14A and the well region 15 are in contact with each other.

In the NMOS transistor N63, the partial trench isolation insulating film PT is formed in contact with the side surface of the corresponding body-tied region 24A opposite to the gate electrode G1. This partial trench isolation insulating film PT is formed also in contact with the side surface of the source region 22 opposite to the gate electrode G1. Thus, each source region 22 is surrounded by the partial trench isolation insulating film PT.

In the NMOS transistor region, the well region 25 containing P-type impurities relatively low in concentration (P⁻) exists in a layer under the partial trench isolation insulating film PT, and though not shown, the body-tied region 24 and the well region 25 are in contact with each other.

With this configuration, the side surface of the source region 12 of the PMOS transistor P63 is in contact with the partial trench isolation insulating film PT and the body-tied region 14A. Also, the side surface of the source region 22 of the NMOS transistor N63 is in contact with the partial trench isolation insulating film PT and the body-tied region 24A. Thus, the junction area of the PN junction in the source regions 12, 22 is increased and so is the parasitic junction capacitance, thereby stabilizing the power supply.

The source regions 12, 22 are surrounded by the partial trench isolation insulating film PT. In the case where the wiring layer M1 is arranged on the partial trench isolation insulating film PT, therefore, the parasitic capacitance of the wiring layer M1 can be further increased, thereby stabilizing the power supply.

G. Seventh Embodiment

G-1. Device Configuration

The configuration of the semiconductor device 700 according to a seventh embodiment of the invention is explained below with reference to FIGS. 80 to 84.

Figure 80:
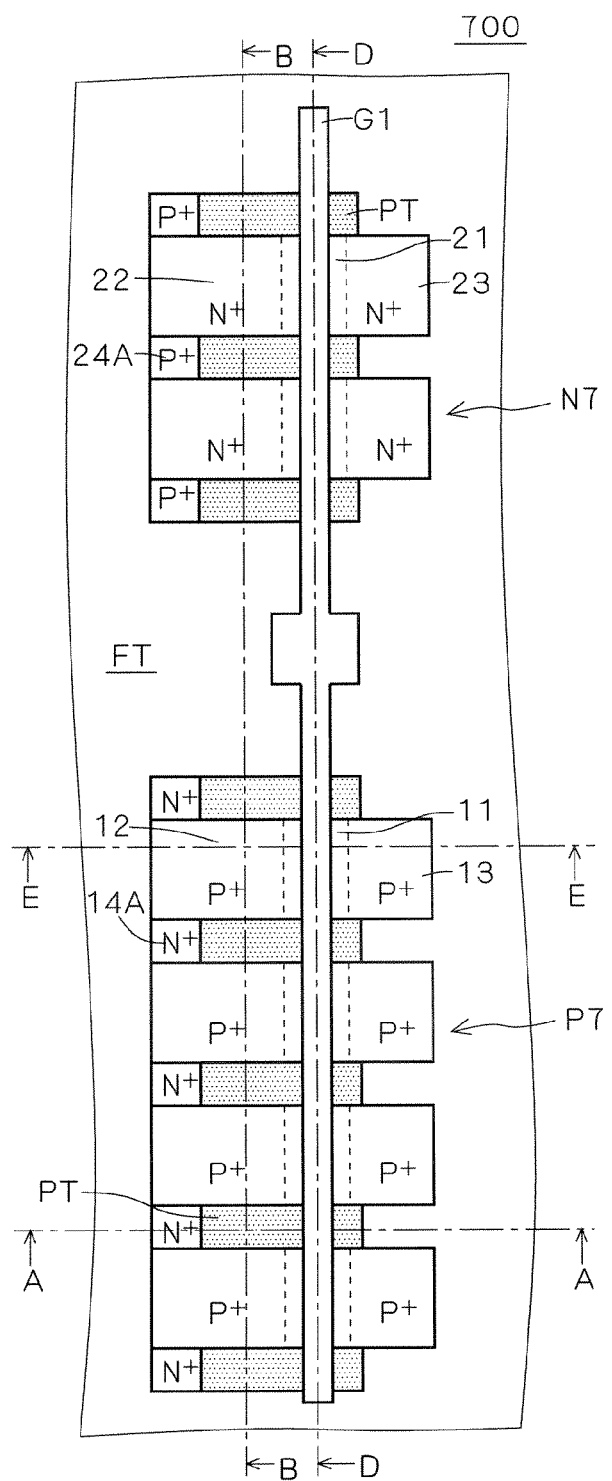
FIG. 80 is a plan view for explaining a configuration of a semiconductor device according to a seventh embodiment of the invention.

FIG. 80 is a plan view showing the configuration of the semiconductor device 700. The sectional views taken in lines A-A, B-B, D-D and E-E in FIG. 80 are shown in FIGS. 81, 82, 83 and 84, respectively. The same component parts as those of the semiconductor device 100 shown in FIGS. 1 to 5 are designated by the same reference numerals, respectively, and not described again.

As shown in FIG. 80, the semiconductor device 700 includes a PMOS transistor P7 and a NMOS transistor N7, which are connected to a common gate electrode G1.

In the PMOS transistor P7, the source-drain region has an arrangement of four independent source regions 12 and an arrangement of four independent drain regions 13 formed along the gate width.

Figure 81:
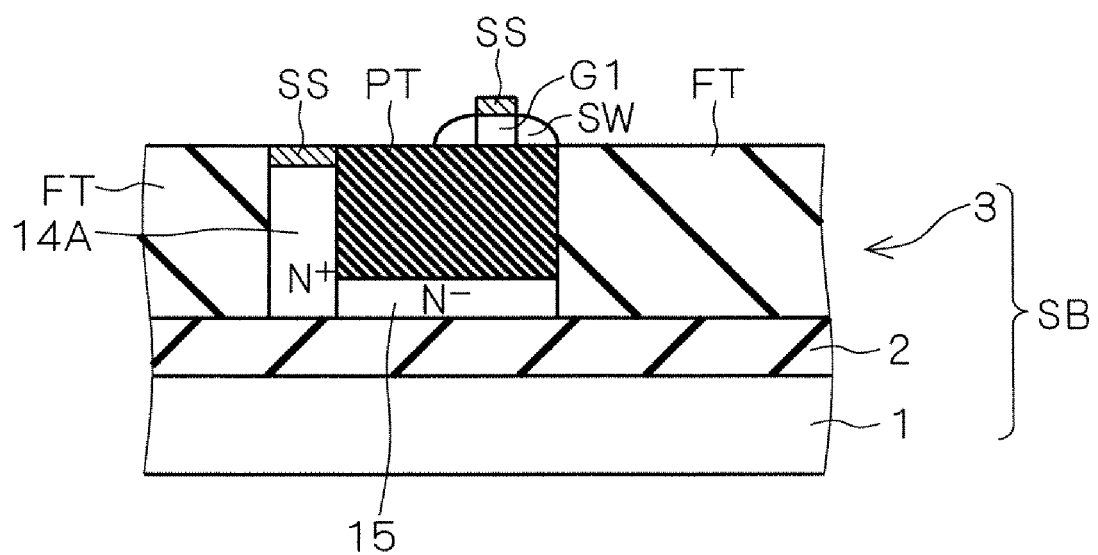
FIGS. 81 to 84 are sectional views for explaining a configuration of a semiconductor device according to the seventh embodiment of the invention.
Figure 82:
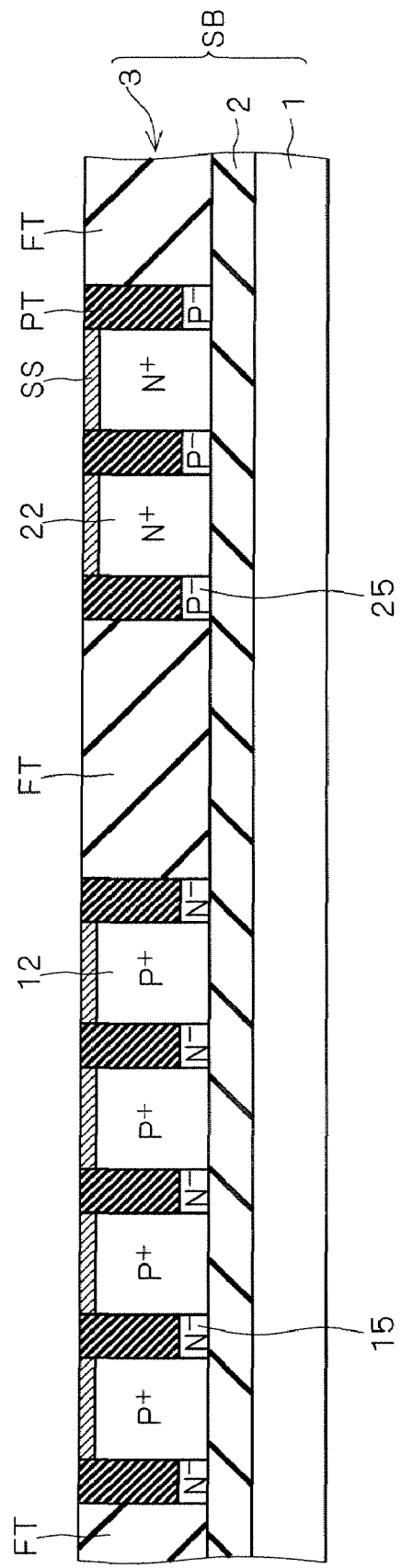
Figure 83:
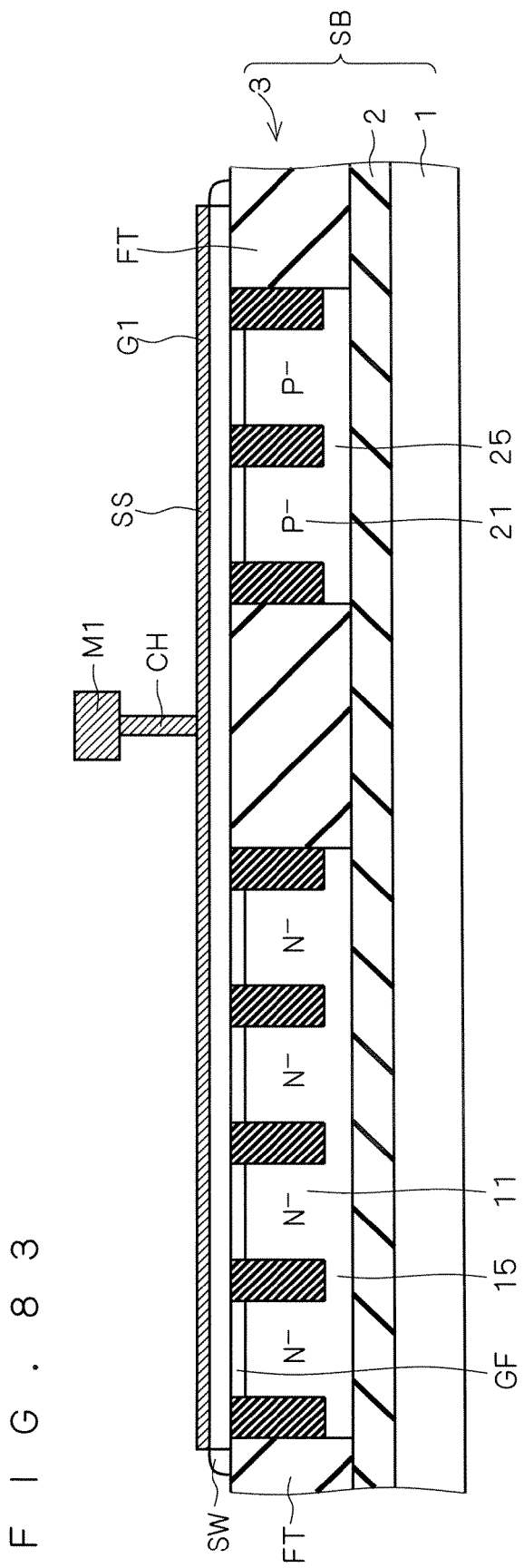

The partial trench isolation insulating film PT is formed in contact with the whole of the opposed side surfaces between each adjacent ones of the four source regions 12, and also the partial trench isolation insulating film PT is formed outside each of the source regions 12 provided at the ends of the arrangements. The body-tied region 14A containing N-type impurities relatively high in concentration (N⁺) is formed in contact with the side surface of the partial trench isolation insulating film PT opposite to the gate electrode G1 (FIG. 81). The body-tied region 14A is formed also in contact with the side surface of the source regions 12 along the direction of arrangement.

The partial trench isolation insulating film PT is formed also between each adjacent ones of the four drain regions 13. The partial trench isolation insulating film PT, however, is formed not in contact with the whole of the opposed side surfaces of the drain regions 13, but projected by a predetermined length from the gate G1. This is also the case with the partial trench isolation insulating film PT formed outside the drain regions 13 provided at each end of the arrangements.

In the NMOS transistor N7, the source-drain region is divided into two parts along the gate width, and has an arrangement of two independent source regions 22 and an arrangement of two independent drain regions 23.

The partial trench isolation insulating film PT is formed in contact with the whole of the opposed side surfaces between the two source regions 22, and also the partial trench isolation insulating film PT is formed outside each of the source regions 22 provided at the ends of the arrangements.

The body-tied region 24A containing P-type impurities relatively high in concentration (P$^+$) is formed in contact with the side surface of each of the source regions 22 opposite to the gate electrode G1. The body-tied region 24A is also formed in contact with the side surface of the source regions 22 along the direction of arrangement.

The partial trench isolation insulating film PT, though formed also between the two drain regions 23, is not formed in contact with the whole of the opposed side surfaces of the drain regions 23 but projected by a predetermined length from the gate electrode G1. This is also the case with the partial trench isolation insulating film PT formed outside each of the drain regions 23 provided at the ends of the arrangements.

As shown in FIG. 81, each body-tied region 14A of the PMOS transistor P7 is formed to reach the buried oxide film 2 from the surface of the SOI layer 3, and in contact with the well region 15 containing N-type impurities relatively low in concentration (N$^-$) existing in a layer under the partial trench isolation insulating film PT.

Figure 84:
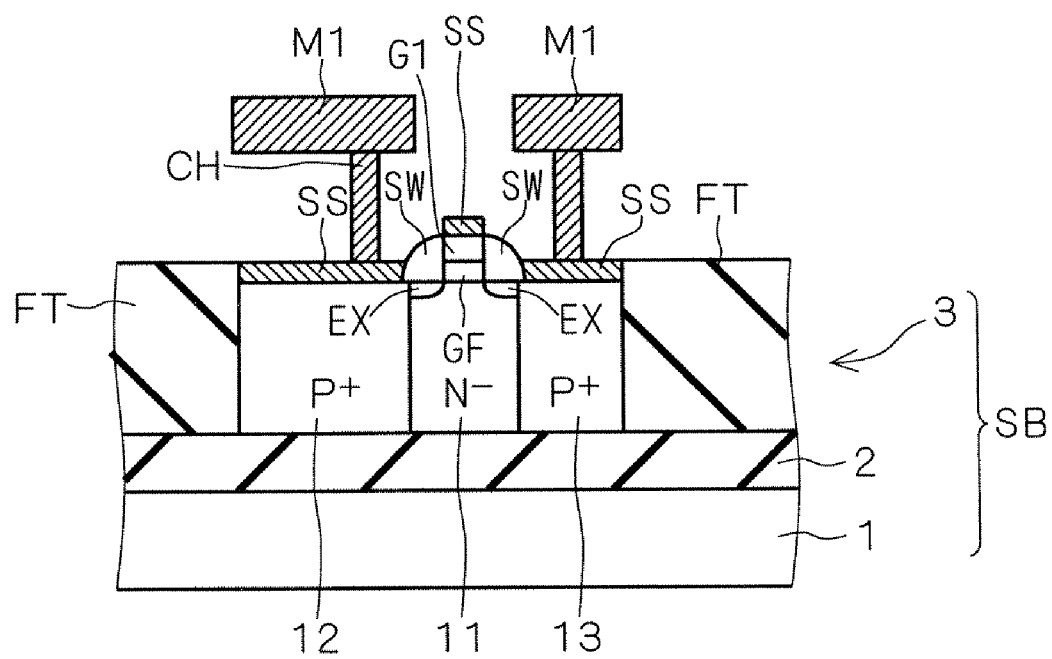

Although the body-tied region 14A is small in area, as shown in FIGS. 81 and 84, a silicide film SS is covered on both the body-tied region 14A and the source region 12 which are thus electrically connected to each other. By connecting a part of them to the wiring layer M1 electrically, therefore, the potential of the body-tied regions 14A can be fixed.

This configuration is also the same for the body-tied regions 24A and the source regions 22 of the NMOS transistor N7.

G-2. Effects

As explained above, in the semiconductor device 700, the source-drain region of the MOS transistor is divided along the gate width. Like in the semiconductor device 100 explained above with reference to FIGS. 1 to 5, therefore, the potential of the body regions 11, 21 of the PMOS transistor P7 and the NMOS transistor N7 can be positively fixed. Thus, a kink can be suppressed while at the same time improving the operation withstanding voltage.

Also, the source-drain region is divided by the partial trench isolation insulating film PT and the full trench isolation insulating film FT. In this way, the gate electrode G1 is substantially divided along the gate width. Since a mask of high machining accuracy is used to form the trench isolation insulating film, however, the gate electrode G1 can be accurately divided according to the design value. Thus, the variation in gate width and operation characteristics of the semiconductor device can be prevented.

The side surfaces of the source regions 12 of the PMOS transistor P7 are only partially in contact with the body-tied region 14A, and the side surfaces of the source regions 22 of the NMOS transistor N7 are only partially in contact with the body-tied region 24A. Therefore, the junction area of the PN junction of the source regions 12, 22 is small and so is the parasitic junction capacitance. This is effective in the case where a large junction capacitance of the source regions is not desired.

The greater part of the side surfaces of the drain regions 13 of the PMOS transistor P7 and the drain regions 23 of the NMOS transistor N7 are in contact with the full trench isolation insulating film FT, and only with a part of the partial trench isolation insulating film PT.

With this configuration, the greater part of the drain regions 13, 23 are surrounded by the full trench isolation insulating film FT, and the junction area of the PN junction is correspondingly reduced. Thus, the parasitic junction capacitance in the drain regions 13, 23 is reduced and only a short time length is required for charge/discharge operation. Therefore, the reduction in the operation speed of the MOS transistor is prevented.

G-3. First Modification

Figure 85:
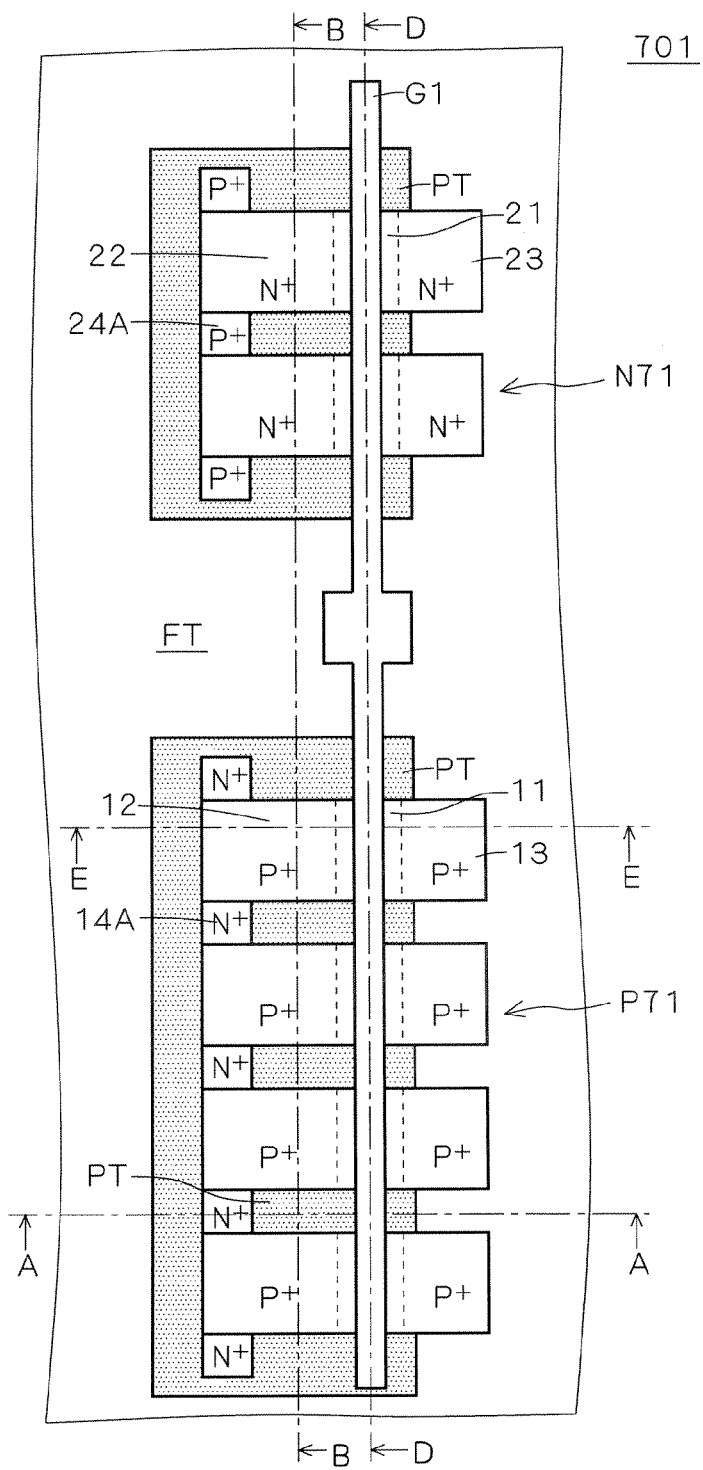
FIG. 85 is a plan view for explaining the configuration of a first modification of the semiconductor device according to the seventh embodiment of the invention.

Next, the configuration of a first modification of the seventh embodiment is explained. FIG. 85 is a plan view showing the configuration of the semiconductor device 701. The sectional views taken in lines A-A, B-B, D-D and E-E in FIG. 85 are shown in FIGS. 86, 87, 88 and 89, respectively. The same component parts as those of the semiconductor device 700 shown in FIGS. 80 to 84 are designated by the same reference numerals, respectively, and not described again.

Figure 86:
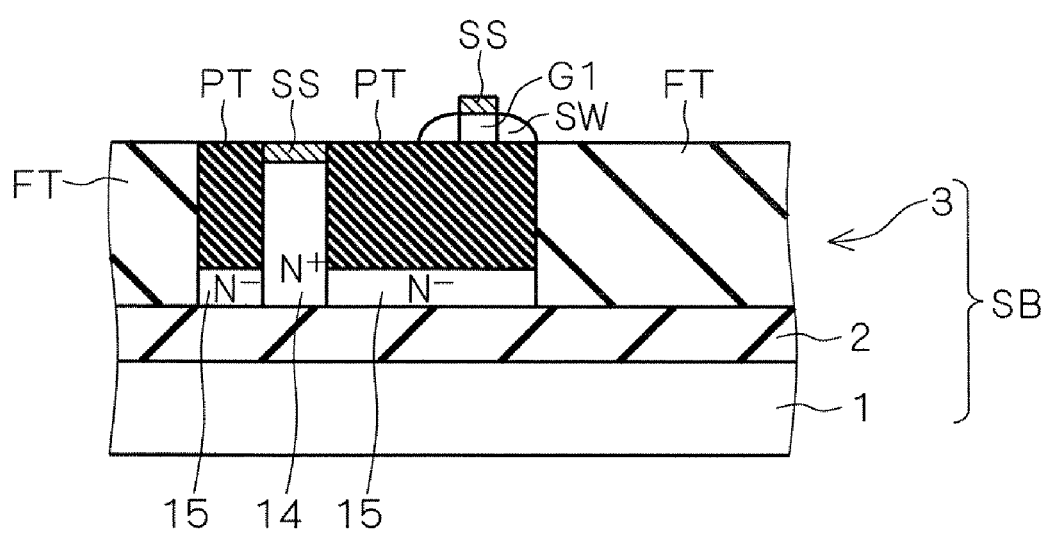
FIGS. 86 to 89 are sectional views for explaining the configuration of the first modification of the semiconductor device according to the seventh embodiment of the invention.
Figure 87:
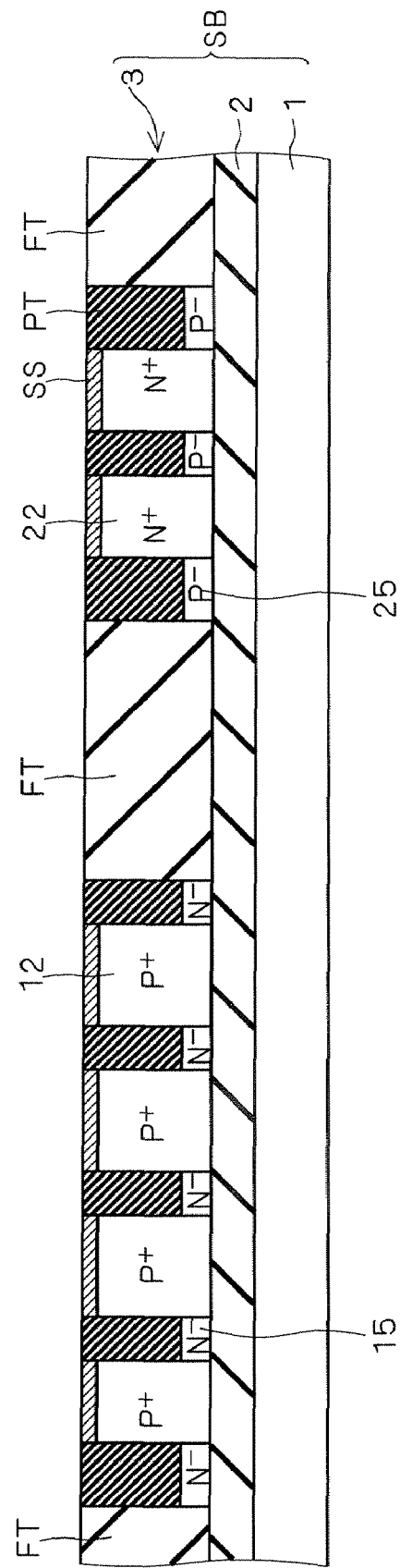
Figure 88:
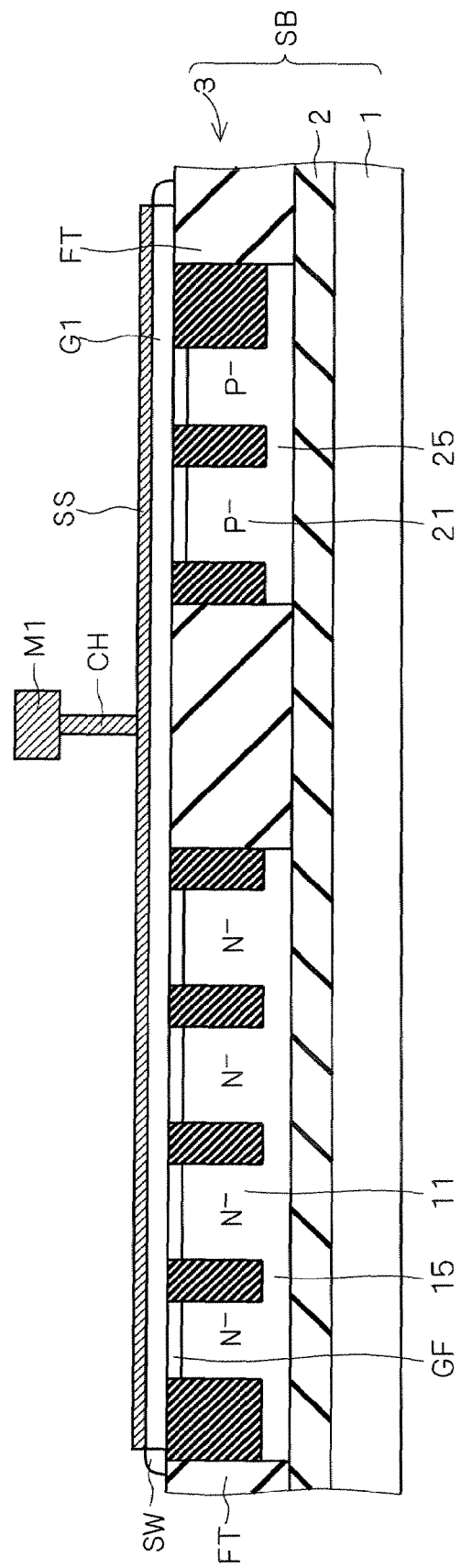
Figure 89:
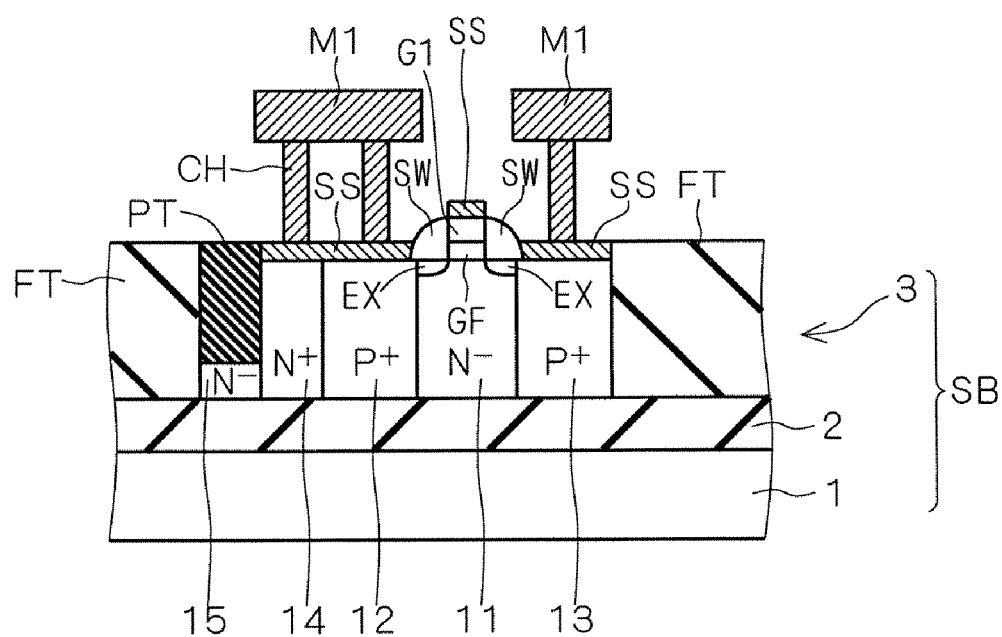

In the semiconductor device 801 shown in FIG. 85, each partial trench isolation insulating film PT is formed in contact with the side surface of the corresponding body-tied region 14A of the PMOS transistor P71 opposite to the gate electrode G1 (FIG. 86). The partial trench isolation insulating film PT is also formed in contact with the side surface of the source region 12 opposite to the gate electrode G1 (FIG. 89), and each source region 12 is surrounded by the partial trench isolation insulating film PT.

In the PMOS transistor region, the well region 15 containing N-type impurities relatively low in concentration (N$^-$) exists in a layer lower than the partial trench isolation insulating film PT, and as shown in FIG. 86, the body-tied region 14 and the well region 15 are in contact with each other.

In the NMOS transistor N71, on the other hand, the partial trench isolation insulating film PT is formed in contact with the side surface of the corresponding body-tied region 24 opposite to the gate electrode G1. The partial trench isolation insulating film PT is also formed in contact with the side surface of the source region 22 opposite to the gate electrode G1, and each source region 22 is surrounded by the partial trench isolation insulating film PT.

In the NMOS transistor region, the well region 25 containing P-type impurities relatively low in concentration (P$^-$) exists in a layer lower than the partial trench isolation insulating film PT, and though no shown, the body-tied region 24 and the well region 25 are in contact with each other.

With this configuration, the side surface of each source region 12 of the PMOS transistor P71 is in contact with the partial trench isolation insulating film PT and the body-tied region 14A. Also, the side surface of the source region 22 of the NMOS transistor N61 is in contact with the partial trench isolation insulating film PT and the body-tied region 24A. Thus, the junction area of the PN junction of the source regions 12, 22 is increased and so is the parasitic junction capacitance, thereby stabilizing the power supply.

Also, the source regions 12, 22 are surrounded by the partial trench isolation insulating film PT. In the case where the wiring layer M1 is arranged on the partial trench isolation insulating film PT, therefore, the parasitic capacitance of the wiring layer M1 can be further increased thereby to stabilize the power supply.

G-4. Second Modification

Figure 90:
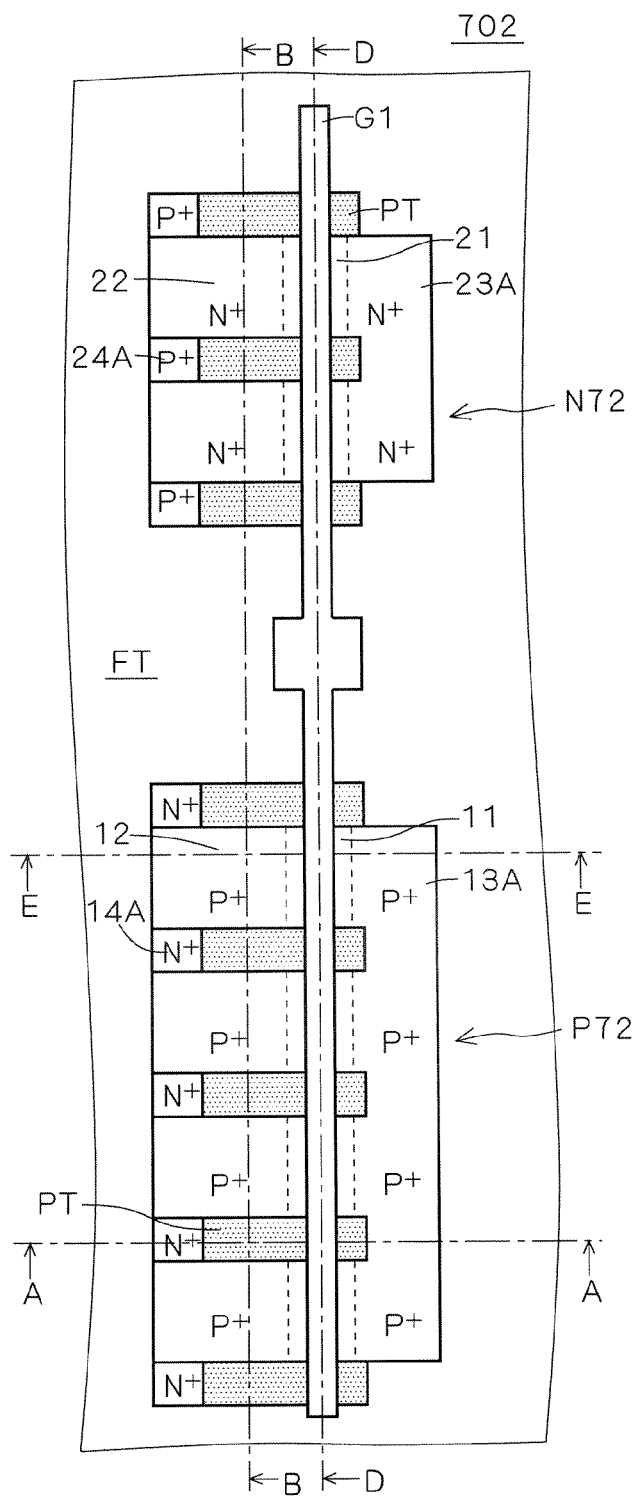
FIG. 90 is a plan view for explaining the configuration of a second modification of the semiconductor device according to the seventh embodiment of the invention.
Figure 92:
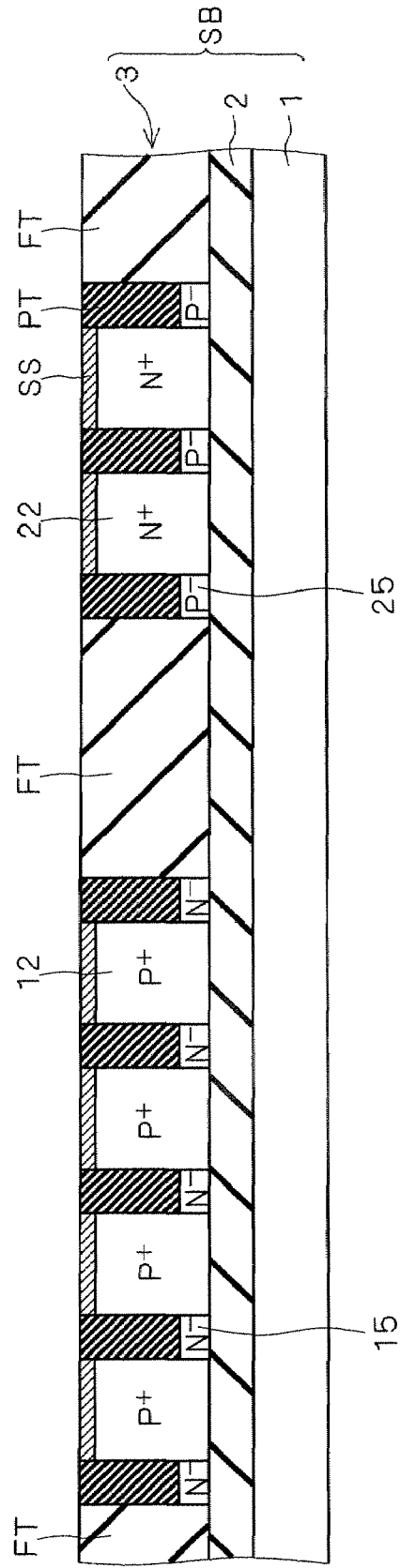
Figure 93:
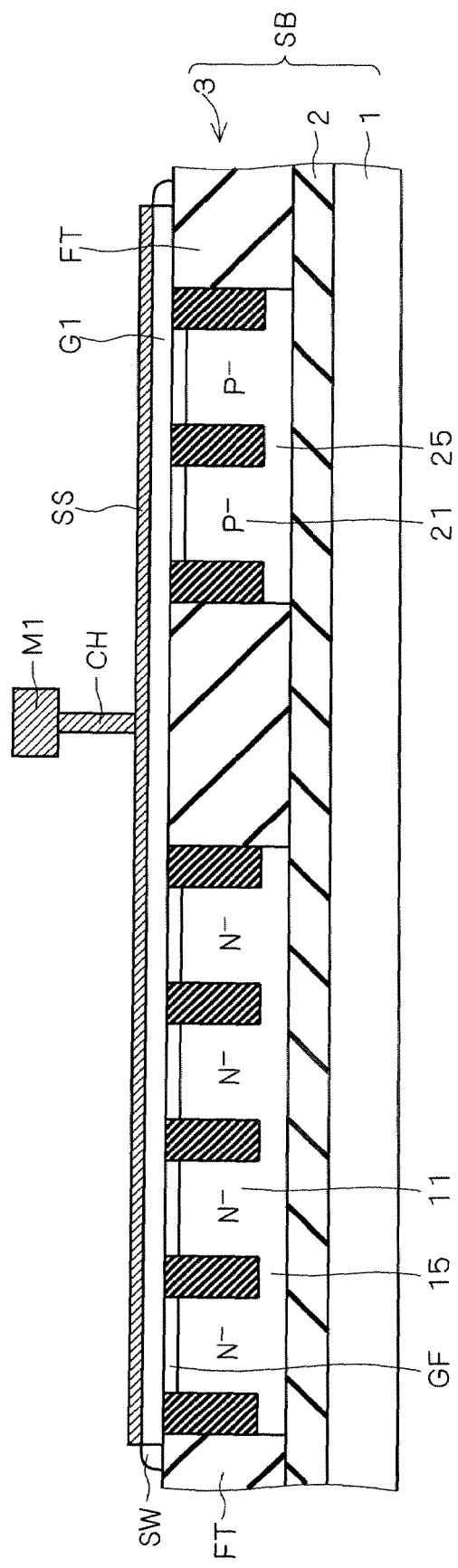
Figure 94:
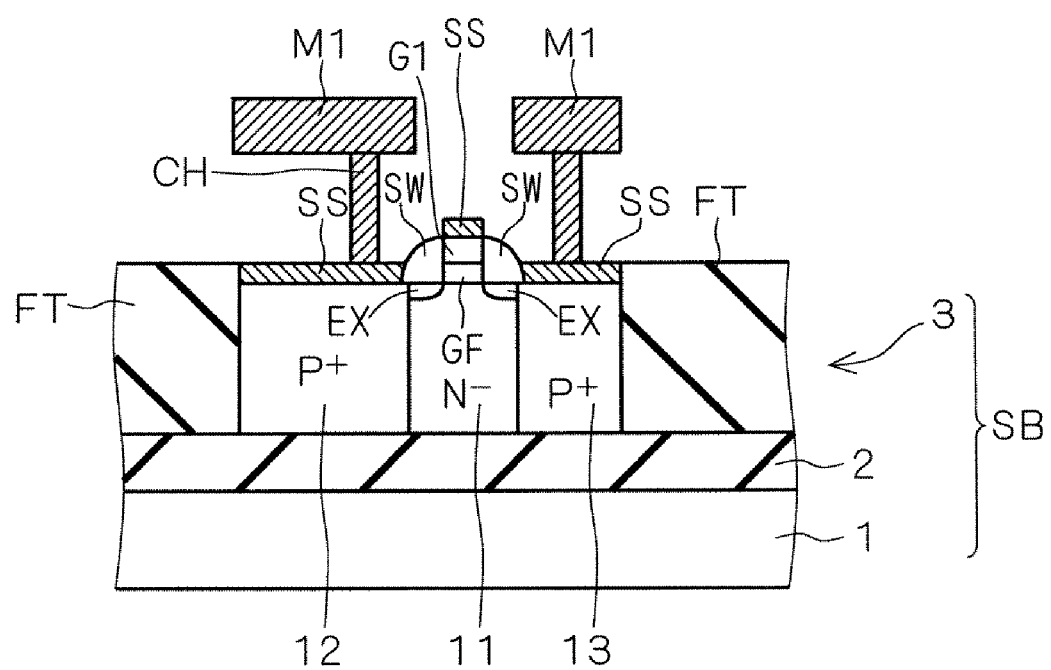

Next, the configuration of a second modification of the seventh embodiment of the invention is explained. FIG. 90 is a plan view showing the configuration of the semiconductor device 702. The sectional views taken in lines A-A, B-B, D-D and E-E in FIG. 90 are shown in FIGS. 91, 92, 93 and 94, respectively. The same component parts as those of the semiconductor device 700 shown in FIGS. 80 to 84 are designated by the same reference numerals, respectively, and not described again.

As shown in FIG. 90, in the PMOS transistor P72 of the semiconductor device 702, the source region is divided into four parts along the gate width and has an arrangement of four independent source regions 12.

Specifically, the partial trench isolation insulating film PT is formed in contact with the whole of the opposed side surfaces between each adjacent ones of the four source regions 12. Also, the partial trench isolation insulating film PT is formed outside each of the source regions 12 provided at the ends of the arrangement.

In each drain region 13A, on the other hand, the partial trench isolation insulating film PT is projected by a predetermined length from the gate electrode G1. The portion of the drain regions 13A on the opposite side of the gate electrode G1 is continuously formed and not divided.

In the NMOS transistor N72, the source region is divided into two parts along the gate width and has an arrangement of two independent source regions 22.

Specifically, the partial trench isolation insulating film PT is formed in contact with the whole of the opposed side surfaces between each adjacent ones of the two source regions 22, and also the partial trench isolation insulating film PT is formed outside each of the source regions 22 provided at the ends of the arrangement.

In the drain region 23A, on the other hand, the partial trench isolation insulating films PT are projected by a predetermined length from the gate electrode G1. The portion of the drain region 23A opposite to the gate electrode G1, however, is continuously formed and not divided.

With this configuration, the drain regions 13A, 23A are each continuously configured, and at least one contact hole is sufficiently required to fix the potential, thereby simplifying the process of forming the contact hole.

G-5. Third Modification

Figure 95:
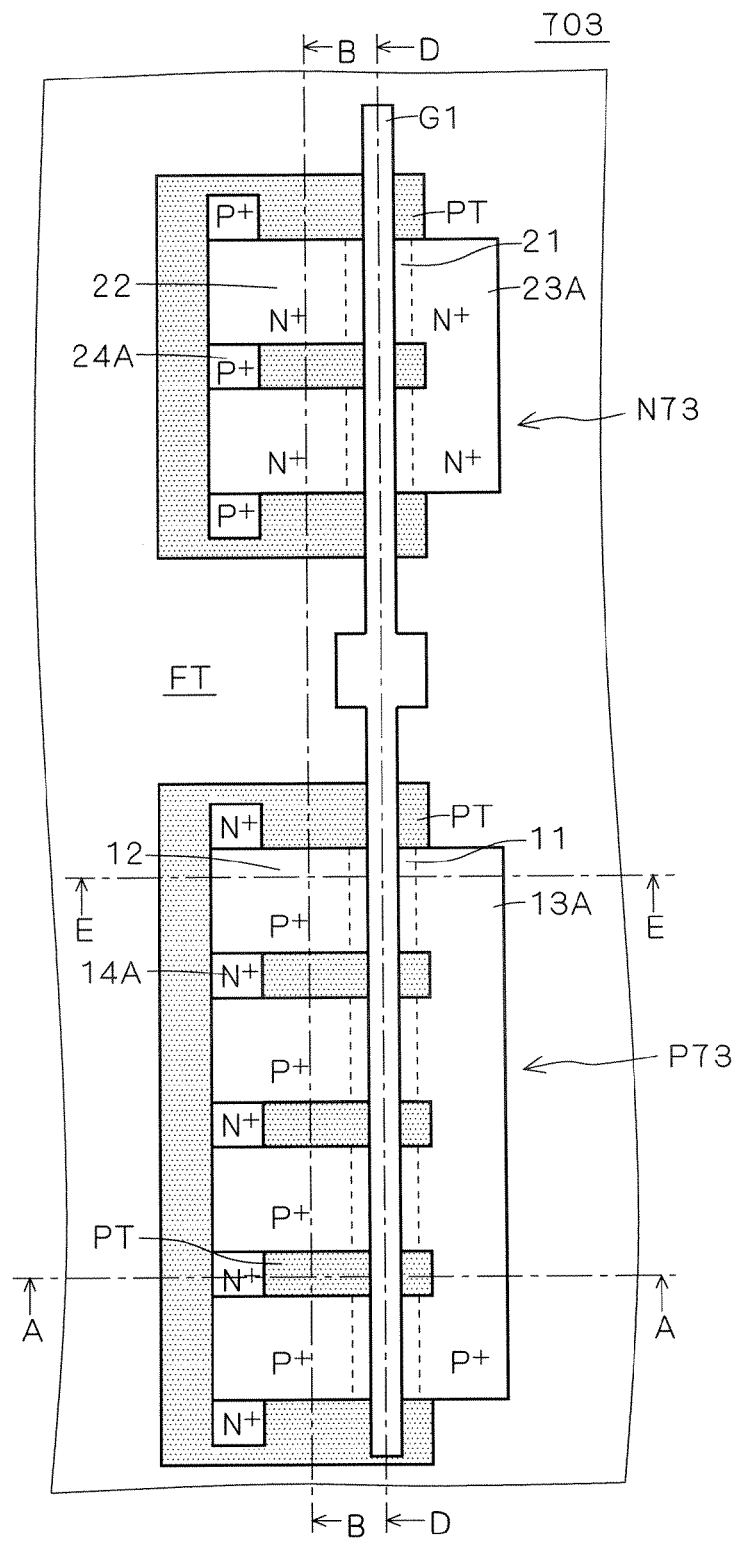
FIG. 95 is a plan view for explaining the configuration of a third modification of the semiconductor device according to the seventh embodiment of the invention.

Next, the configuration of a third modification of the seventh embodiment of the invention is explained. FIG. 95 is a plan view showing the configuration of the semiconductor device 703. The sectional views taken in lines A-A, B-B, D-D and E-E in FIG. 95 are shown in FIGS. 96, 97, 98 and 99, respectively. The same component parts as those of the semiconductor device 700 shown in FIGS. 80 to 84 are designated by the same reference numerals, respectively, and not described again.

As shown in FIG. 95, in the PMOS transistor P73 of the semiconductor device 703, the source region is divided into four parts along the gate width and has an arrangement of four independent source regions 12.

Specifically, the partial trench isolation insulating film PT is formed in contact with the whole of the opposed side surfaces between each adjacent ones of the four source regions 12. Also, the partial trench isolation insulating film PT is formed outside each of the source regions 12 provided at the ends of the arrangement.

In each drain region 13A, on the other hand, the partial trench isolation insulating film PT is projected by a predetermined length from the gate electrode G1. The portion of the drain region 13A opposite to the gate electrode G1 is continuously formed and not divided.

In the NMOS transistor N73, the source region is divided into two parts along the gate width and has an arrangement of two independent source regions 22.

Specifically, the partial trench isolation insulating film PT is formed in contact with the whole of the opposed side surfaces between the two source regions 22, and also the partial trench isolation insulating film PT is formed outside each of the source regions 22 provided at the ends of the arrangement.

Although the partial trench isolation insulating film PT is projected by a predetermined length from the gate electrode G1 in the drain region 23A, the portion of the drain region 23A opposite to the gate electrode G1 is continuously formed and not divided.

With this configuration, the drain regions 13A, 23A are each continuously configured, and at least one contact hole is sufficiently required to fix the potential, thereby simplifying the process of forming the contact hole.

Figure 96:
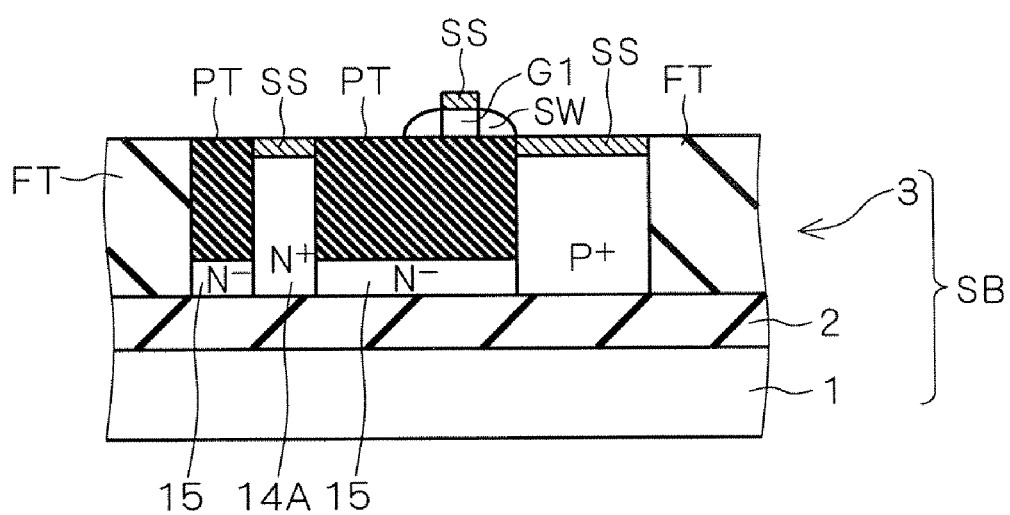
FIGS. 96 to 99 are sectional views for explaining the configuration of the third modification of the semiconductor device according to the seventh embodiment of the invention.
Figure 97:
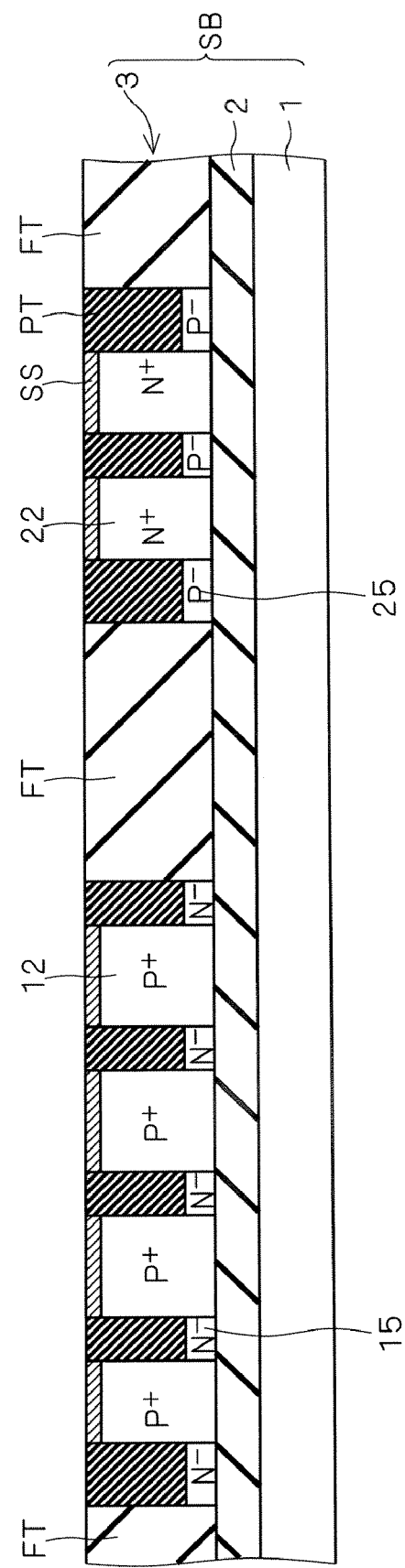
Figure 98:
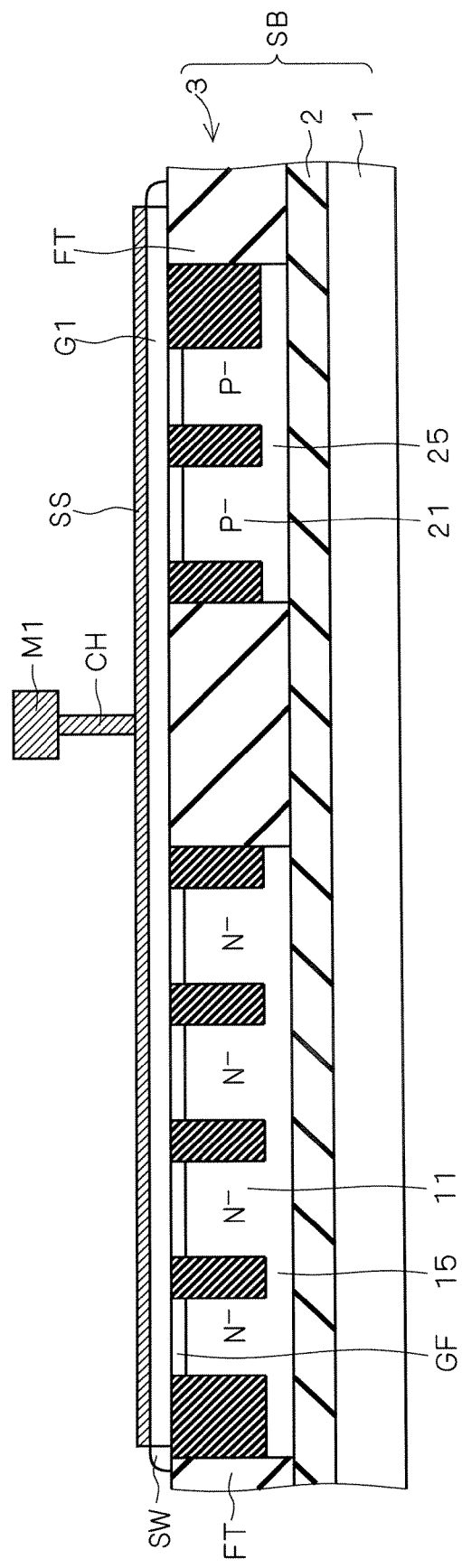
Figure 99:
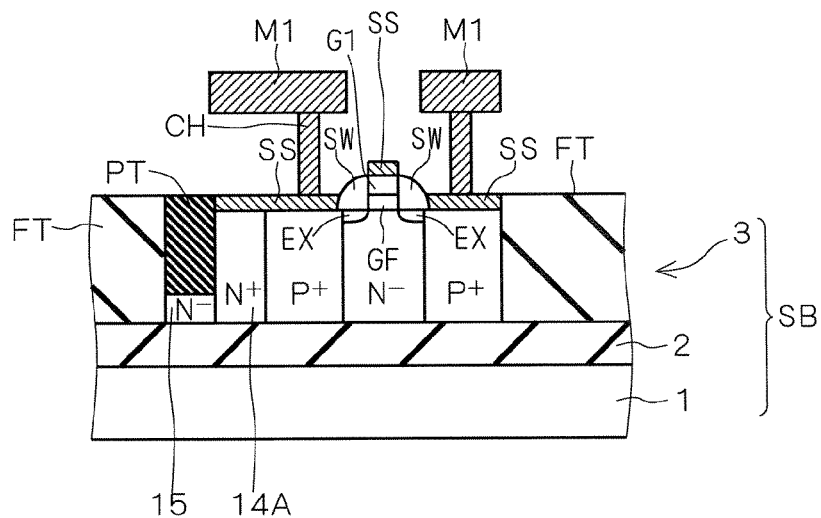

Also, the partial trench isolation insulating film PT is formed in contact with the side surface of each body-tied region 14A far from the gate electrode G1 (FIG. 96). This partial trench isolation insulating film PT is also formed in contact with the side surface of the source region 12 opposite to the gate electrode G1 (FIG. 99), and the source region 12 is surrounded by the partial trench isolation insulating film PT.

In the PMOS transistor region, the well region 15 containing N-type impurities relatively low in concentration (N⁻) exists in a layer lower than the partial trench isolation insulating film PT, and as shown in FIG. 96, the body-tied region 14A and the well region 15 are in contact with each other.

In the NMOS transistor N73, on the other hand, the partial trench isolation insulating films PT are formed in contact with the side surfaces of the body-tied regions 24A opposite to the gate electrode G1. The partial trench isolation insulating films PT are also formed in contact with the side surfaces of the source regions 22 opposite to the gate electrode G1, and each source region 22 is surrounded by the partial trench isolation insulating films PT.

In the NMOS transistor region, the well region 25 containing P-type impurities relatively low in concentration (P⁻) exists in a layer lower than the partial trench isolation insulating film PT, and though no shown, each body-tied region 24 and the well region 25 are in contact with each other.

With this configuration, the side surface of each source region 12 of the PMOS transistor P73 is in contact with the corresponding partial trench isolation insulating film PT and the body-tied region 14A. Also, the side surface of each source region 22 of the NMOS transistor N73 is in contact with the partial trench isolation insulating film PT and the body-tied region 24A. Thus, the junction area of the PN junction of the source regions 12, 22 is increased and so is the parasitic junction capacitance, thereby stabilizing the power supply.

Also, the source regions 12, 22 are surrounded by the partial trench isolation insulating film PT. In the case where the wiring layer M1 is formed on the partial trench isolation insulating film PT, therefore, the parasitic capacitance of the wiring layer M1 can be further increased thereby to stabilize the power supply.

H. Channel Width

In the first to seventh embodiments described above, the channel region of the PMOS transistor is divided into four parts along the gate width while the channel region of the NMOS transistor is divided into two parts along the gate width.

This is in order to substantially equalize the channel width between the PMOS and NMOS transistors by dividing the channel region thereof in view of the fact that the channel width of the PMOS transistor is about twice as long as that of the NMOS transistor. This division advantageously facilitates the layout design. Nevertheless, the invention is not limited to this division.

Also, as explained above, the operation withstanding voltage of the MOS transistor is limited by the channel width and reduced with the increase in channel width. This is explained in more detail with reference to FIG. 100.

Figure 100:
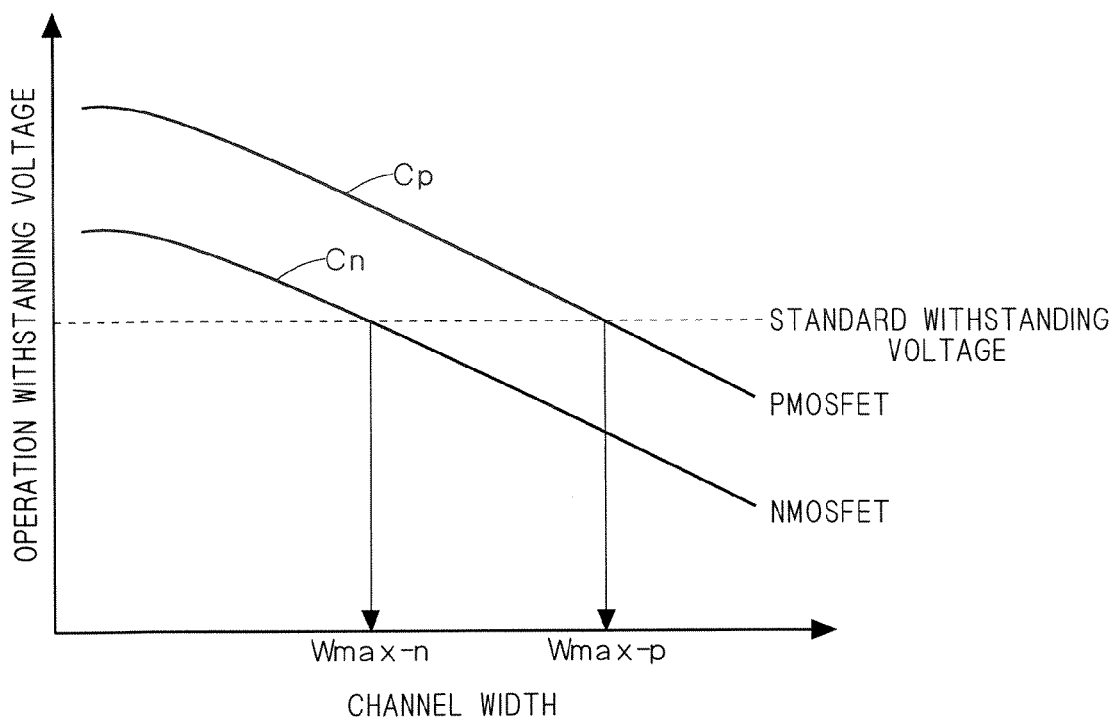
FIG. 100 is a diagram showing the operation withstanding voltage characteristic of the MOS transistor.

FIG. 100 is a diagram showing the operation withstanding voltage characteristic of the MOS transistor versus channel width. The abscissa represents the channel width, and the ordinate the operation withstanding voltage. The unit is arbitrary for both the abscissa and the ordinate.

As understood from FIG. 100, the operation withstanding voltage is limited by the channel width for both the PMOS and NMOS transistors, and reduced with the increase in channel width. One of the technical concepts of the invention, therefore, is that the voltage applicable to each channel region is increased to improve the operation withstanding voltage for the transistor as a whole by dividing the channel region into a plurality of parts along the gate width.

FIG. 100 shows the operation withstanding voltage characteristic Cn of the NMOS transistor and the operation withstanding voltage characteristic Cp of the PMOS transistor, and the maximum channel width for reaching the standard withstanding voltage value for the characteristics Cn and Cp are expressed as Wmax-n and Wmax-p, respectively.

From FIG. 100, it is understood that Wmax-n is smaller for the NMOS transistor. This indicates that the channel width of the NMOS transistor is required to be shorter than that for the PMOS transistor to secure the same standard withstanding voltage value.

Also, in view of the fact that the current drive capacity is 2 to 2.5 times larger for the NMOS transistor than for the PMOS transistor, the channel width of the NMOS transistor is required to be shorter than that of the PMOS transistor to equalize the current drive capacity.

For these reasons, the channel width of the PMOS transistor is often set at a value longer than that of the NMOS transistor, but not necessarily.

Modifications in which the channel width and the channel region of the PMOS and NMOS transistors is divided are explained below.

H-1. First Modification

Figure 101:
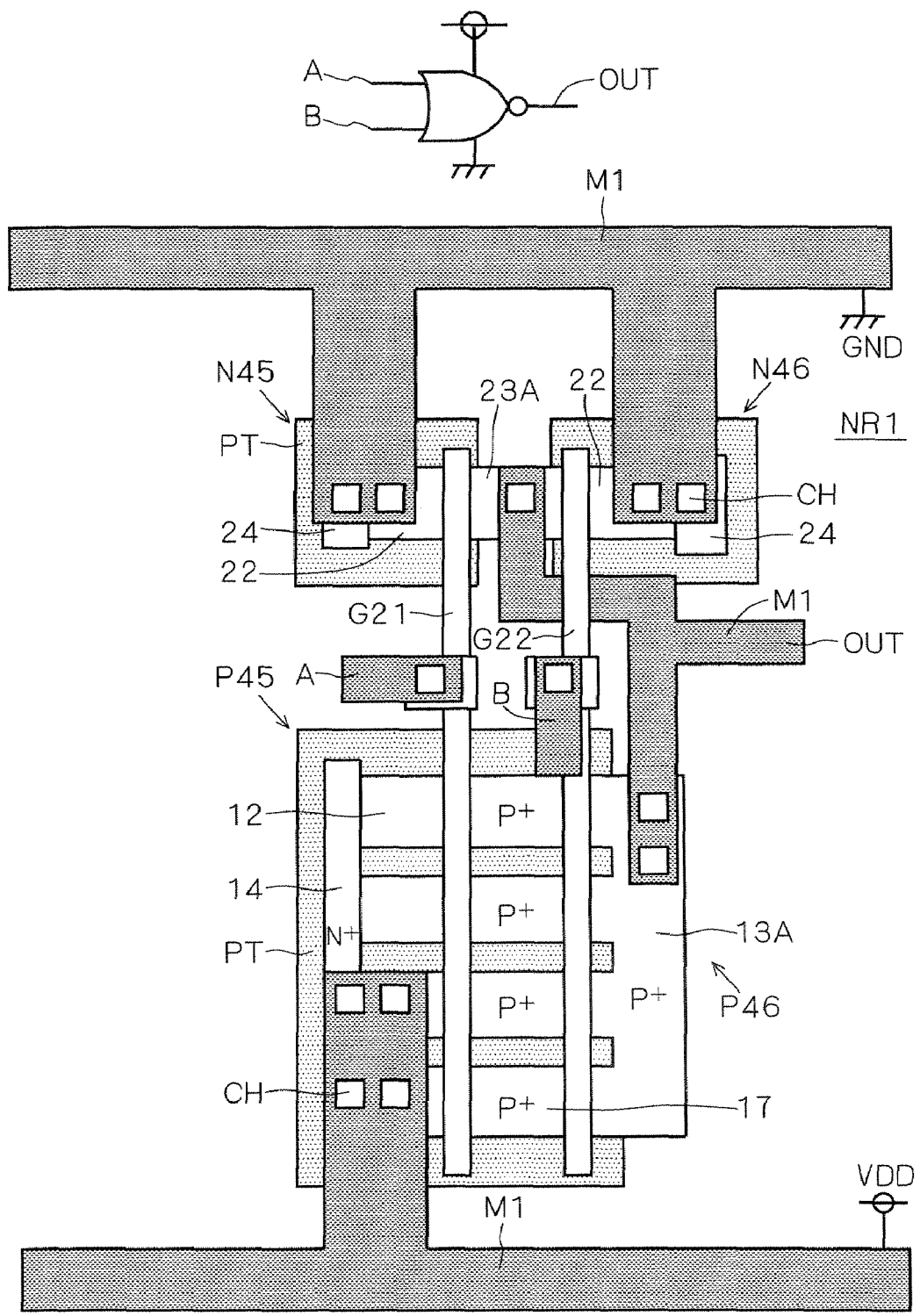
FIGS. 101 and 102 are diagrams showing an example of the plan layout in an application of the semiconductor device according to the invention to a 2-input NOR circuit.

FIG. 101 shows an example of the plan layout of a 2-input NOR circuit NR1 which is implemented using the semiconductor device 400 according to the fourth embodiment explained above with reference to FIGS. 26 to 30. The same component parts as those of the semiconductor device 400 are designated by the same reference numerals and not explained again.

The 2-input NOR circuit NR1 shown in FIG. 101 has an arrangement (first set) of the PMOS transistor P45 and the NMOS transistor N45 connected to a common gate electrode G21 and an arrangement (second set) of the PMOS transistor P46 and the NMOS transistor N46 connected to a common gate electrode G22.

As shown in FIG. 101, the channel width of the PMOS transistors P45 and P46 of the 2-input NOR circuit NR1 is set at a value about four times as large as that of the NMOS transistors N45 and N46. Also, the channel region of the PMOS transistors P45, P46 is divided into four parts along the gate width, while the channel region of the NMOS transistors N45, N46 is not divided. As a result, the divided channel width of the PMOS transistors P45, P46 is substantially the same as the channel width of the NMOS transistors N45, N46.

Thus, the drain region of the PMOS transistor P45 and the source region of the PMOS transistor P46 are shared to make up a common source-drain layer 17.

The NMOS transistors N45 and N46 share the drain region 23A.

A plurality of the source regions 12 and the body-tied region 14 of the PMOS transistor P45 are connected to the wiring layer M1 through the contact hole CH, and the wiring layer M1 is connected to the source potential VDD.

The source regions 22 and the body-tied regions 24 of the NMOS transistors N45, N46 are connected through the contact holes CH to the wiring layer M1, which in turn is connected to the grounding potential GND.

The drain region 13A of the PMOS transistor P46 and the drain region 23A shared by the NMOS transistors N45, N46 are connected through the contact holes CH to the wiring layer M1, which in turn is connected to the output terminal OUT.

The gate electrode G21 is connected through the contact hole CH to the wiring layer M1, which in turn is connected to the input terminal A. The gate electrode G22 is connected through the contact hole CH to the wiring layer M1, which in turn is connected to the input terminal B.

This wiring pattern can construct the 2-input NOR circuit NR1. In FIG. 101, the 2-input NOR circuit NR1 is also designated by a circuit symbol.

In the 2-input NOR circuit NR1, the channel width of the PMOS transistors P45, P46 is set at a value about four times as large as that of the NMOS transistors N45, N46 to achieve substantially the same driving force for the rise and fall operations.

H-2. Second Modification

Figure 102:
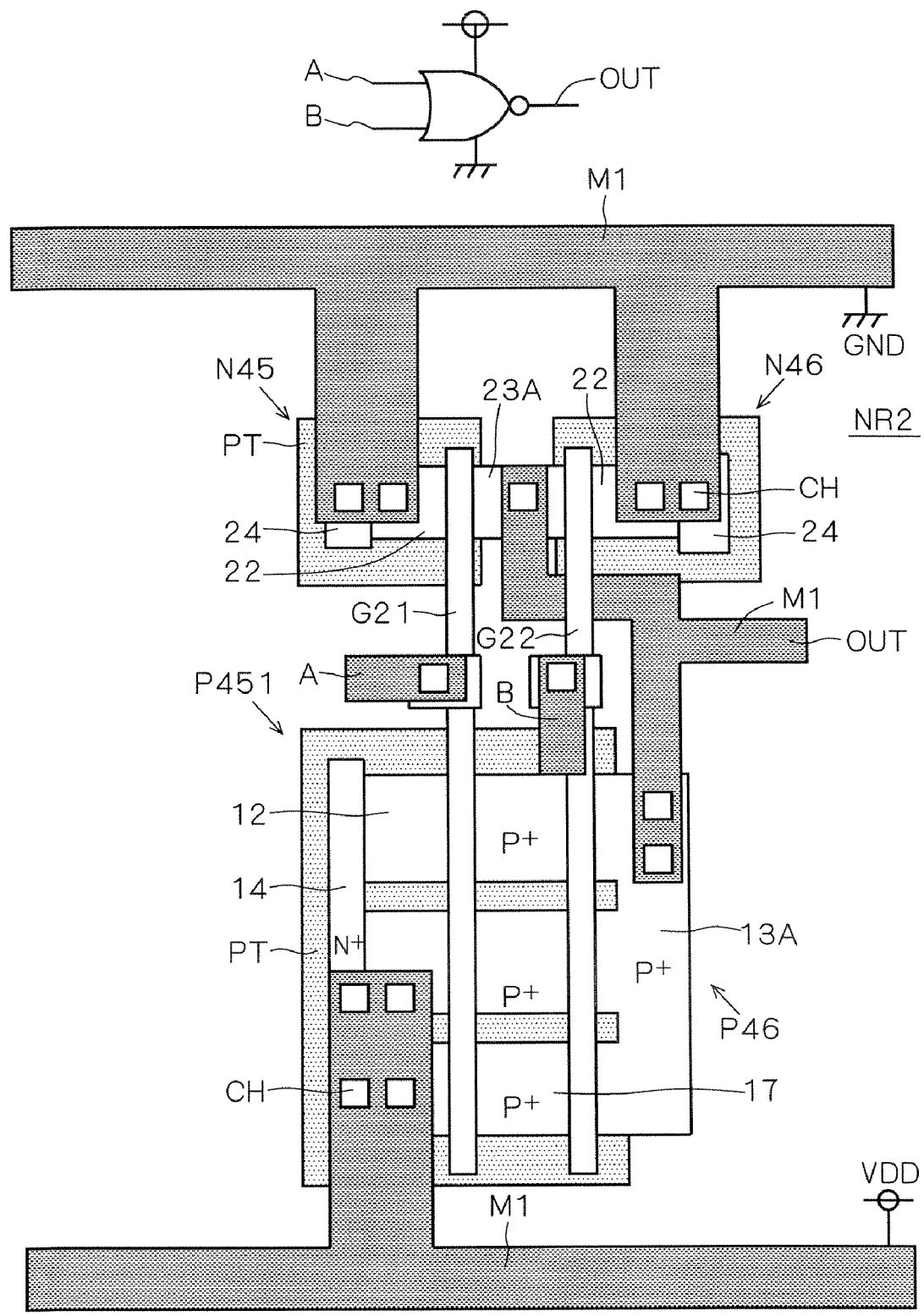

FIG. 102 shows another example of the plan layout of the 2-input NOR circuit NR2, which has basically the same plan layout as the 2-input NOR circuit NR1 shown in FIG. 101. Therefore, the same component parts as those in FIG. 101 are designated by the same reference numerals, respectively, and not described again.

The 2-input NOR circuit NR2 shown in FIG. 102 includes PMOS transistors P451, P461 instead of the PMOS transistors P45, P46.

The channel width of the PMOS transistors P451, P461 is divided into three parts along the gate width by the partial trench isolation insulating film PT. The channel width of each channel region thus divided is longer than that of the PMOS transistors P45, P46 shown in FIG. 101.

The number of divisions of the channel region can be set arbitrarily taking the kink suppression and the operation withstanding voltage into consideration. The divisions are not necessarily equidistant, and different channel regions may have different channel widths.

H-3. Third Modification

Figure 103:
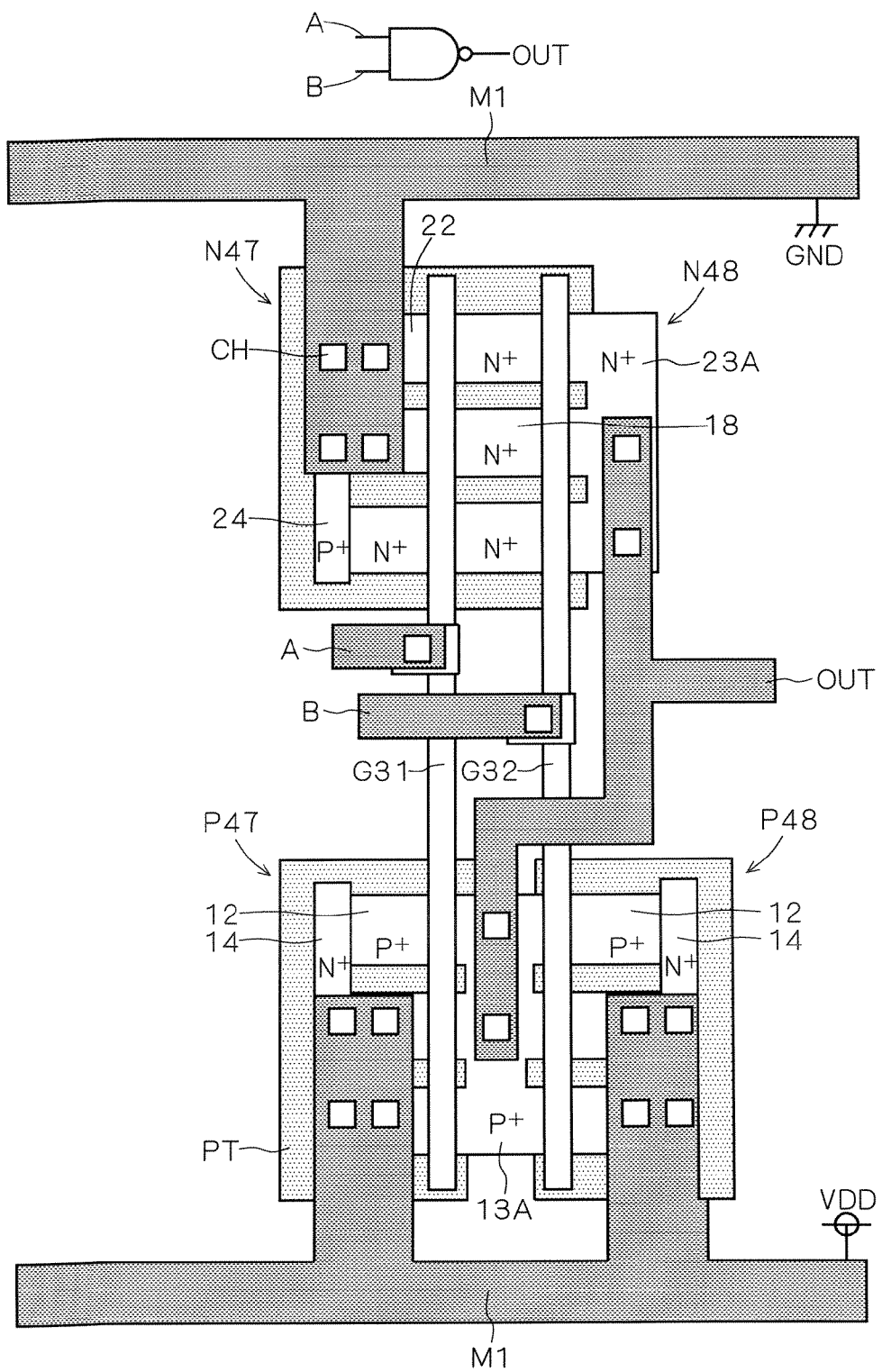
FIG. 103 is a diagram showing an example of the plan layout in an application of the semiconductor device according to the invention to a 2-input NAND circuit.

FIG. 103 shows an example of the plan layout of a 2-input NAND circuit ND, which is implemented herein by the semiconductor device 400 according to the fourth embodiment explained with reference to FIGS. 26 to 30. The same component parts as those of the semiconductor device 400 are designated by the same reference numerals, respectively, and not described again.

The 2-input NAND circuit ND shown in FIG. 103 has an arrangement (first set) of the PMOS transistor P47 and the NMOS transistor N47 connected to a common gate electrode G31 and an arrangement (second set) of the PMOS transistor P48 and the NMOS transistor N48 connected to a common gate electrode G32.

As shown in FIG. 103, the 2-input NAND circuit ND is so configured that the PMOS transistors P47, P48 have substantially the same channel width as the NMOS transistors N47, N48, and the channel regions of both the PMOS transistors P47, P48 and the NMOS transistors N47, N48 are divided into three parts along the channel width. Thus, the divisions of the PMOS transistors P47, P48 and the NMOS transistors N45, N46 have substantially the same channel width.

The drain region of the NMOS transistor N47 and the source region of the NMOS transistor N48 are shared into a common source-drain layer 18.

The PMOS transistors P47, P48 share the drain region 13A.

A plurality of the source regions 12 and the body-tied regions 14 of the PMOS transistors P47, P48 are connected through the contact holes CH to the wiring layer M1, which in turn is connected to the source potential VDD.

A plurality of the source regions 22 and the body-tied regions 24 of the NMOS transistor N47 are connected through the contact holes CH to the wiring layer M1, which in turn is connected to the grounding potential GND.

The drain regions 13A of the PMOS transistors P47, P48 and the drain region 23A of the NMOS transistor N48 are connected through the contact holes CH to the wiring layer M1, which in turn is connected to the output terminal OUT.

The gate electrode G31 is connected through the contact hole CH to the wiring layer M1, which in turn is connected to the input terminal A. The gate electrode G32 is connected through the contact hole CH to the wiring layer M1, which in turn is connected to the input terminal B.

This wiring pattern can realize the 2-input NAND circuit ND. In FIG. 103, the 2-input NAND circuit ND is also designated by a circuit symbol.

In the 2-input NAND circuit ND, the channel width of the PMOS transistors P47, P48 is set at substantially the same value as that of the NMOS transistors N47, N48 to achieve substantially the same driving force for the rise and fall operation.

The foregoing description refers to a case in which the channel width of the PMOS transistor is equal to or longer than the channel width of the NMOS transistor, but the invention is not necessarily so configured. In a level converter circuit used for signal exchange between different voltage levels, for example, the channel width of the NMOS transistor may be set at a value longer than that of the PMOS transistor, and this level converter circuit can of course be implemented using the semiconductor device according to the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a MOS transistor arranged on a SOI layer of a SOI substrate,
    wherein said MOS transistor includes:
    a gate electrode arranged on said SOI layer through a gate insulating film;
    first and second semiconductor regions arranged in a surface of said SOI layer outside each of the side surfaces of said gate electrode along the gate length;
    a first partial trench isolation insulating film formed along a gate length across a channel region formed in the surface of said SOI layer under said gate electrode thereby to divide said first semiconductor region across the gate length into a plurality of divisions along the gate width; and
    a third semiconductor region in contact with a side surface of said first partial trench isolation insulating film opposite to said gate electrode in said first semiconductor region to reach a buried oxide film from the surface of said SOI layer;
    wherein said first partial trench isolation insulating film has a well region as an underlying layer containing the impurities of the conduction type opposite to that of said first semiconductor region, and
    wherein said third semiconductor region is of the same conduction type as and in contact with said well region.

2. A semiconductor device according to claim 1,
    wherein said third semiconductor region is in contact with a side surface of said divided first semiconductor region opposite to said gate electrode, and extends in parallel to said gate electrode.

3. A semiconductor device according to claim 2,
    wherein said first partial trench isolation insulating film is projected toward said second semiconductor region by a predetermined length from said gate electrode across the channel region, and
    wherein said second semiconductor region is divided into a plurality of parts along a gate width by said projected first partial trench isolation insulating film and a full trench isolation insulating film arranged continuously to said first partial trench isolation insulating film and reaching said buried oxide film through the SOI layer.

4. A semiconductor device according to claim 3,
    wherein the MOS transistor further includes a second partial trench isolation insulating film in contact with the side surface of said third semiconductor region opposite to said gate electrode and extending in parallel to said gate electrode, and
    wherein said second partial trench isolation insulating film includes a well region as an underlying layer containing impurities of the conduction type opposite to that of said first semiconductor region.

5. A semiconductor device according to claim 2,
    wherein said first partial trench isolation insulating film is projected toward said second semiconductor region by a predetermined length from said gate electrode across said channel region, and
    wherein said second semiconductor region is arranged to surround said first partial trench isolation insulating film projected.

6. A semiconductor device according to claim 5,
    wherein the MOS transistor further includes a second partial trench isolation insulating film arranged to extend in parallel to said gate electrode, and
    wherein said second partial trench isolation insulating film has a well region as an underlying layer containing impurities of the conduction type opposite to that of said first semiconductor region.

7. A semiconductor device according to claim 2,
    wherein said first partial trench isolation insulating film is arranged to divide said second semiconductor region into a plurality of parts along a gate width by crossing said second semiconductor region along the gate length,
    wherein said MOS transistor further includes a first outer peripheral partial trench isolation insulating film arranged in contact with a side surface of said divided second semiconductor region opposite to said gate electrode in said second semiconductor region and extending in parallel to said gate electrode, and
    wherein said first outer peripheral partial trench isolation insulating film has, as an underlying layer, a well region containing impurities of the conduction type opposite to that of said first semiconductor region.

8. A semiconductor device according to claim 7,
    wherein said MOS transistor further includes a second outer peripheral partial trench isolation insulating film arranged in contact with a side surface of said third semiconductor region opposite to said gate electrode and extending in parallel to said gate electrode, and
    wherein said second outer peripheral partial trench isolation insulating film has, as an underlying layer, a well region containing impurities of conduction type opposite to that of said first semiconductor region.

9. A semiconductor device according to claim 2, wherein said first partial trench isolation insulating film is projected toward said second semiconductor region by a predetermined length from said gate electrode across said channel region, wherein said second semiconductor region is arranged in such a manner as to surround said first partial trench isolation insulating film projected, wherein said MOS transistor further includes a first outer peripheral trench isolation insulating film arranged in contact with a side surface of said second semiconductor region opposite to said gate electrode and extending in parallel to said gate electrode in said second semiconductor region, and wherein said first outer peripheral partial trench isolation insulating film has a well region, as an underlying layer, containing impurities of the conduction type opposite to that of said first semiconductor region.

10. A semiconductor device according to claim 9, wherein said MOS transistor further includes a second outer peripheral trench isolation insulating film arranged in contact with a side surface of said third semiconductor region opposite to said gate electrode and extending in parallel to said gate electrode, and wherein said second outer peripheral trench isolation insulating film has a well region, as an underlying layer, containing impurities of the conduction type opposite to that of said first semiconductor region.

11. A semiconductor device according to claim 1, wherein said third semiconductor region is arranged in contact with a side surface of said divided first semiconductor region along the direction of arrangement.

12. A semiconductor device according to claim 11, wherein said first partial trench isolation insulating film is projected toward said second semiconductor region by a predetermined length from said gate electrode across the channel region, wherein said second semiconductor region is divided into a plurality of parts along a gate width by said first partial trench isolation insulating film projected and a full trench isolation insulating film arranged continuously to said first partial trench isolation insulating film and reaching said buried oxide film through the SOI layer.

13. A semiconductor device according to claim 12, wherein the MOS transistor includes a second partial trench isolation insulating film arranged in contact with the side surface of said third semiconductor region opposite to said gate electrode and extending in parallel to said gate electrode, and wherein said second partial trench isolation insulating film has a well region, as an underlying layer, containing impurities of the conduction type opposite to that of said first semiconductor region.

14. A semiconductor device according to claim 11, wherein said first partial trench isolation insulating film is projected toward said second semiconductor region by a predetermined length from said gate electrode across said channel region, and wherein said second semiconductor region is arranged to surround said projected first partial trench isolation insulating film.

15. A semiconductor device according to claim 14, wherein the MOS transistor further includes a second partial trench isolation insulating film arranged in contact with the side surface of said third semiconductor region opposite to said gate electrode and extending in parallel to said gate electrode, and wherein said second partial trench isolation insulating film has a well region, as an underlying layer, containing impurities of the conduction type opposite to that of said first semiconductor region.

16. A semiconductor device according to claim 11, wherein said first partial trench isolation insulating film is arranged to divide said second semiconductor region into a plurality of parts along a gate length across the gate length, and wherein said MOS transistor further includes a first outer peripheral partial trench isolation insulating film arranged in contact with a side surface of said divided second semiconductor region opposite to said gate electrode in said second semiconductor region and extending in parallel to said gate electrode, and wherein said first outer peripheral partial trench isolation insulating film has a well region, as an underlying layer, containing impurities of the conduction type opposite to that of said first semiconductor region.

17. A semiconductor device according to claim 16, wherein said MOS transistor further includes a second outer peripheral partial trench isolation insulating film arranged in contact with a side surface of said third semiconductor region opposite to said gate electrode and extending in parallel to said gate electrode, and wherein said second outer peripheral partial trench isolation insulating film has a well region, as an underlying layer, containing impurities of the conduction type opposite to that of said first semiconductor region.

18. A semiconductor device according to claim 11, wherein said first partial trench isolation insulating film is projected toward said second semiconductor region by a predetermined length from said gate electrode across said channel region, wherein said second semiconductor region is arranged to surround said projected first partial trench isolation insulating film, wherein said MOS transistor further includes a first outer peripheral trench isolation insulating film in contact with a side surface of said second semiconductor region opposite to said gate electrode in said second semiconductor region and extending in parallel to said gate electrode, and wherein said first outer peripheral partial trench isolation insulating film has a well region, as an underlying layer, containing impurities of the conduction type opposite to that of said first semiconductor region.

19. A semiconductor device according to claim 18, wherein said MOS transistor further includes a second outer peripheral partial trench isolation insulating film arranged in contact with a side surface of said third semiconductor region opposite to said gate electrode and extending in parallel to said gate electrode, and wherein said second outer peripheral partial trench isolation insulating film has a well region, as an underlying layer, containing impurities of the conduction type opposite to that of said first semiconductor region.

* * * * *